US011164855B2

(12) United States Patent
Chen et al.

(10) Patent No.: US 11,164,855 B2
(45) Date of Patent: Nov. 2, 2021

(54) PACKAGE STRUCTURE WITH A HEAT DISSIPATING ELEMENT AND METHOD OF MANUFACTURING THE SAME

(71) Applicant: Taiwan Semiconductor Manufacturing Co., Ltd., Hsinchu (TW)

(72) Inventors: Weiming Chris Chen, Taipei (TW); Chi-Hsi Wu, Hsinchu (TW); Chih-Wei Wu, Yilan County (TW); Kuo-Chiang Ting, Hsinchu (TW); Szu-Wei Lu, Hsinchu (TW); Shang-Yun Hou, Hsinchu (TW); Ying-Ching Shih, Hsinchu (TW); Hsien-Ju Tsou, Taipei (TW); Cheng-Chieh Li, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/572,619

(22) Filed: Sep. 17, 2019

(65) Prior Publication Data
US 2021/0082894 A1 Mar. 18, 2021

(51) Int. Cl.
*H01L 23/32* (2006.01)
*H01L 25/18* (2006.01)
(Continued)

(52) U.S. Cl.
CPC .............. *H01L 25/18* (2013.01); *H01L 21/56* (2013.01); *H01L 21/82* (2013.01);
(Continued)

(58) Field of Classification Search
CPC combination set(s) only.
See application file for complete search history.

(56) References Cited

U.S. PATENT DOCUMENTS 8,993,380 B2   3/2015  Hou et al.
9,000,584 B2   4/2015  Lin et al.
(Continued)

FOREIGN PATENT DOCUMENTS

TW   201639106   11/2016
TW   201919184   5/2019

OTHER PUBLICATIONS

"Office Action of Taiwan Counterpart Application", dated Nov. 30, 2020, p. 1-p. 5.
(Continued)

*Primary Examiner* — Suberr L Chi
(74) *Attorney, Agent, or Firm* — JCIPRNET

(57) ABSTRACT

A package structure includes a circuit element, a first semiconductor die, a second semiconductor die, a heat dissipating element, and an insulating encapsulation. The first semiconductor die and the second semiconductor die are located on the circuit element. The heat dissipating element connects to the first semiconductor die, and the first semiconductor die is between the circuit element and the heat dissipating element, where a sum of a first thickness of the first semiconductor die and a third thickness of the heat dissipating element is substantially equal to a second thickness of the second semiconductor die. The insulating encapsulation encapsulates the first semiconductor die, the second semiconductor die and the heat dissipating element, wherein a surface of the heat dissipating element is substantially leveled with the insulating encapsulation.

20 Claims, 52 Drawing Sheets

(51) Int. Cl.
H01L 25/00 (2006.01)
H01L 23/00 (2006.01)
H01L 21/82 (2006.01)
H01L 23/48 (2006.01)
H01L 21/56 (2006.01)
H01L 23/367 (2006.01)

(52) U.S. Cl.
CPC ........ *H01L 23/3675* (2013.01); *H01L 23/481* (2013.01); *H01L 24/13* (2013.01); *H01L 24/16* (2013.01); *H01L 24/24* (2013.01); *H01L 24/32* (2013.01); *H01L 24/73* (2013.01); *H01L 24/94* (2013.01); *H01L 25/50* (2013.01); *H01L 2224/13024* (2013.01); *H01L 2224/16145* (2013.01); *H01L 2224/24137* (2013.01); *H01L 2224/32221* (2013.01); *H01L 2224/73253* (2013.01)

(56) References Cited

U.S. PATENT DOCUMENTS

| | | |
|---|---|---|
| 9,048,222 B2 | 6/2015 | Hung et al. |
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,299,649 B2 | 3/2016 | Chiu et al. |
| 9,368,460 B2 | 6/2016 | Yu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,613,931 B2 * | 4/2017 | Lin ............... H01L 25/0652 |
| 9,666,502 B2 | 5/2017 | Chen et al. |
| 9,735,131 B2 | 8/2017 | Su et al. |

OTHER PUBLICATIONS

"Office Action of Taiwan Counterpart Application", dated Aug. 31, 2020, p. 1-p. 5.

* cited by examiner

PACKAGE STRUCTURE WITH A HEAT DISSIPATING ELEMENT AND METHOD OF MANUFACTURING THE SAME

BACKGROUND

Semiconductor devices and integrated circuits are typically manufactured on a single semiconductor wafer. The dies of the wafer may be processed and packaged with other semiconductor devices or dies at the wafer level, and various technologies have been developed for the wafer level packaging (e.g. formation of redistribution circuit structure/layer). In addition, such packages may further be integrated to a semiconductor substrate or carrier after dicing.

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 24 to FIG. 33A are schematic cross-sectional views of various stages in a manufacturing method of a package structure in accordance with some embodiments of the disclosure.

DETAILED DESCRIPTION

Figure 1:
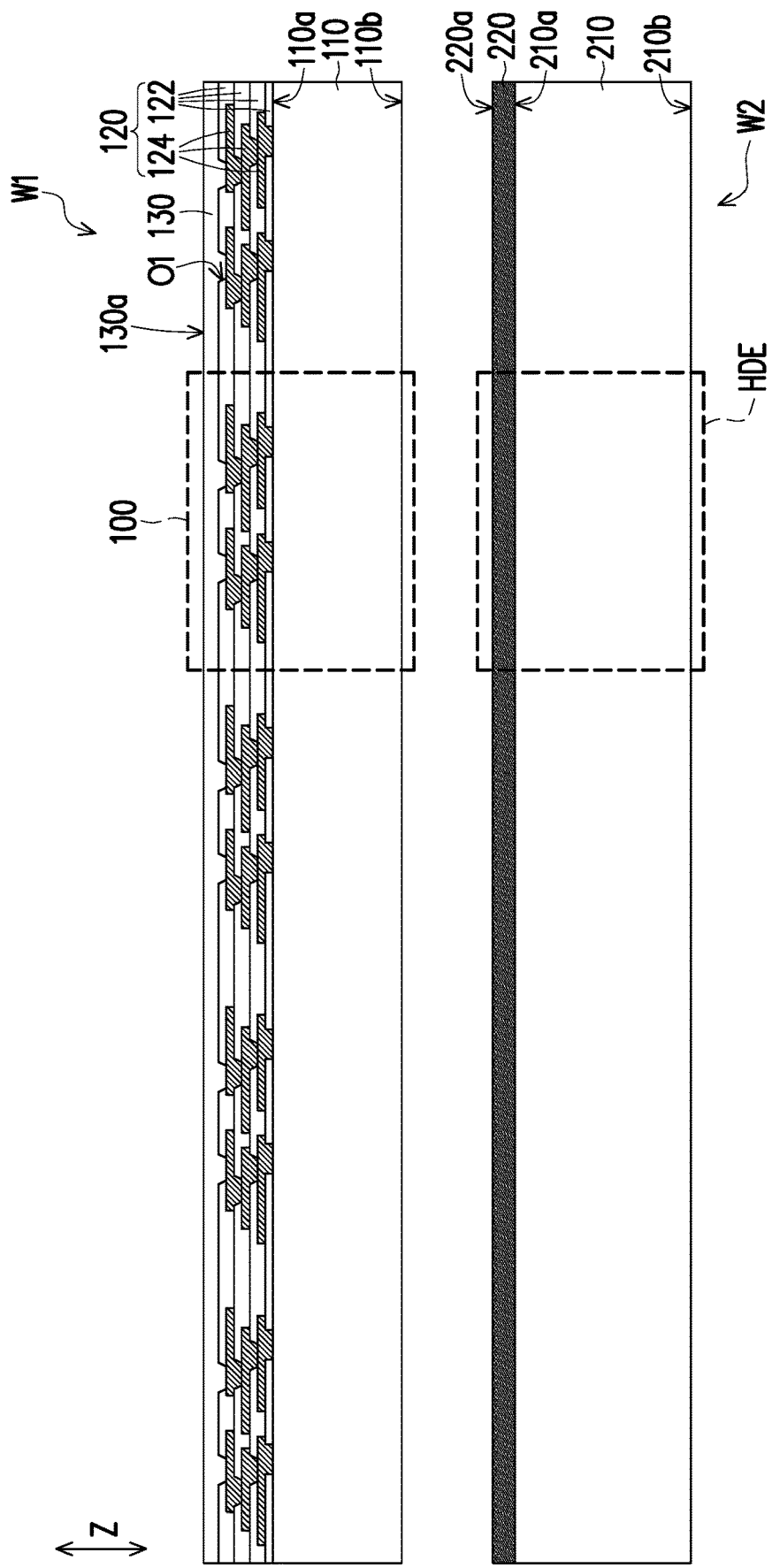
FIG. 1 to FIG. 13 and FIG. 14A are schematic cross-sectional views of various stages in a manufacturing method of a package structure in accordance with some embodiments of the disclosure.

The following disclosure provides many different embodiments, or examples, for implementing different features of the provided subject matter. Specific examples of components, values, operations, materials, arrangements, or the like, are described below to simplify the disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first", "second", "third", "fourth", "fifth" and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 15:
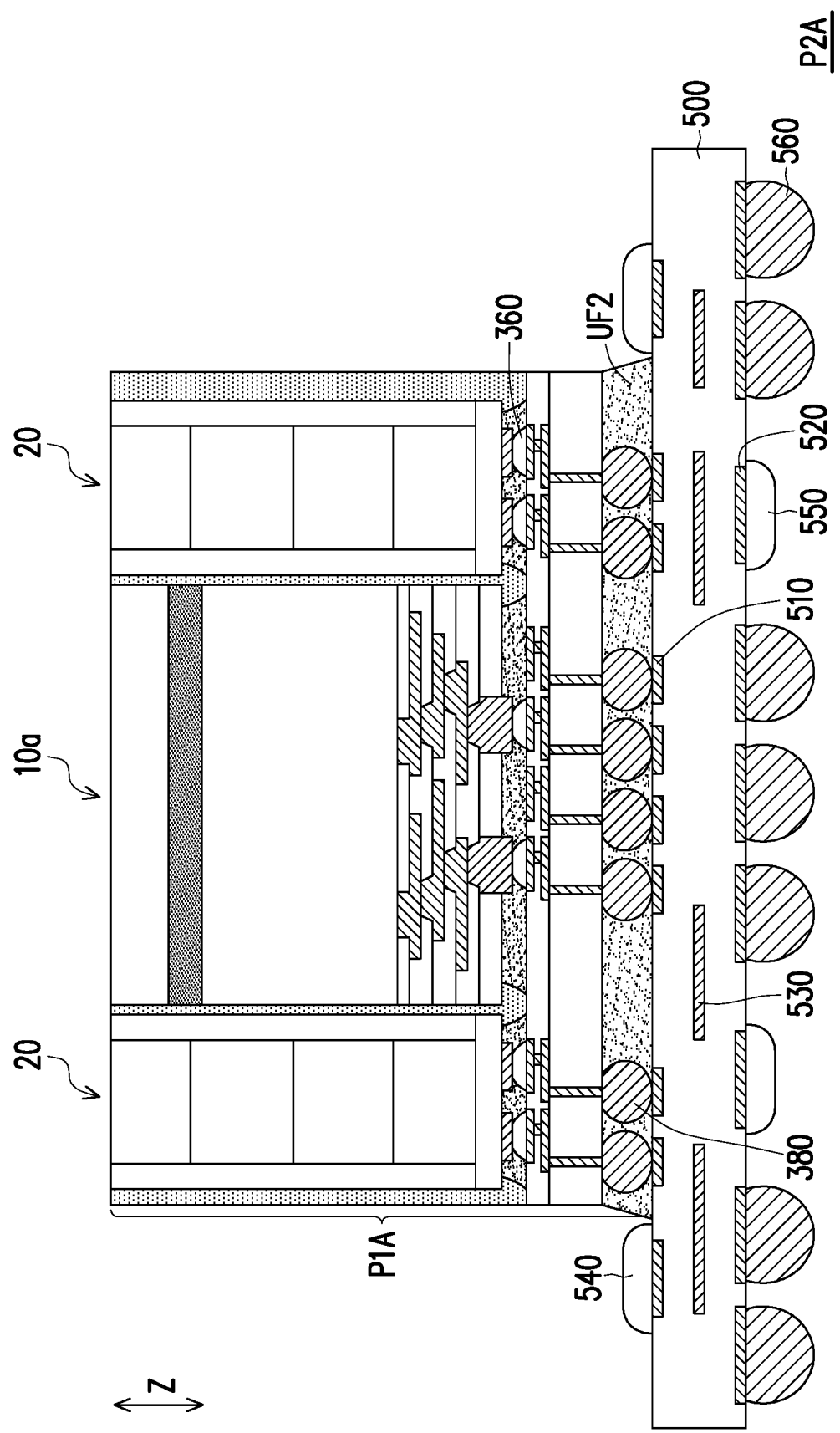
FIG. 15 is a schematic cross-sectional view of a package structure in accordance with some embodiments of the disclosure.
Figure 16:
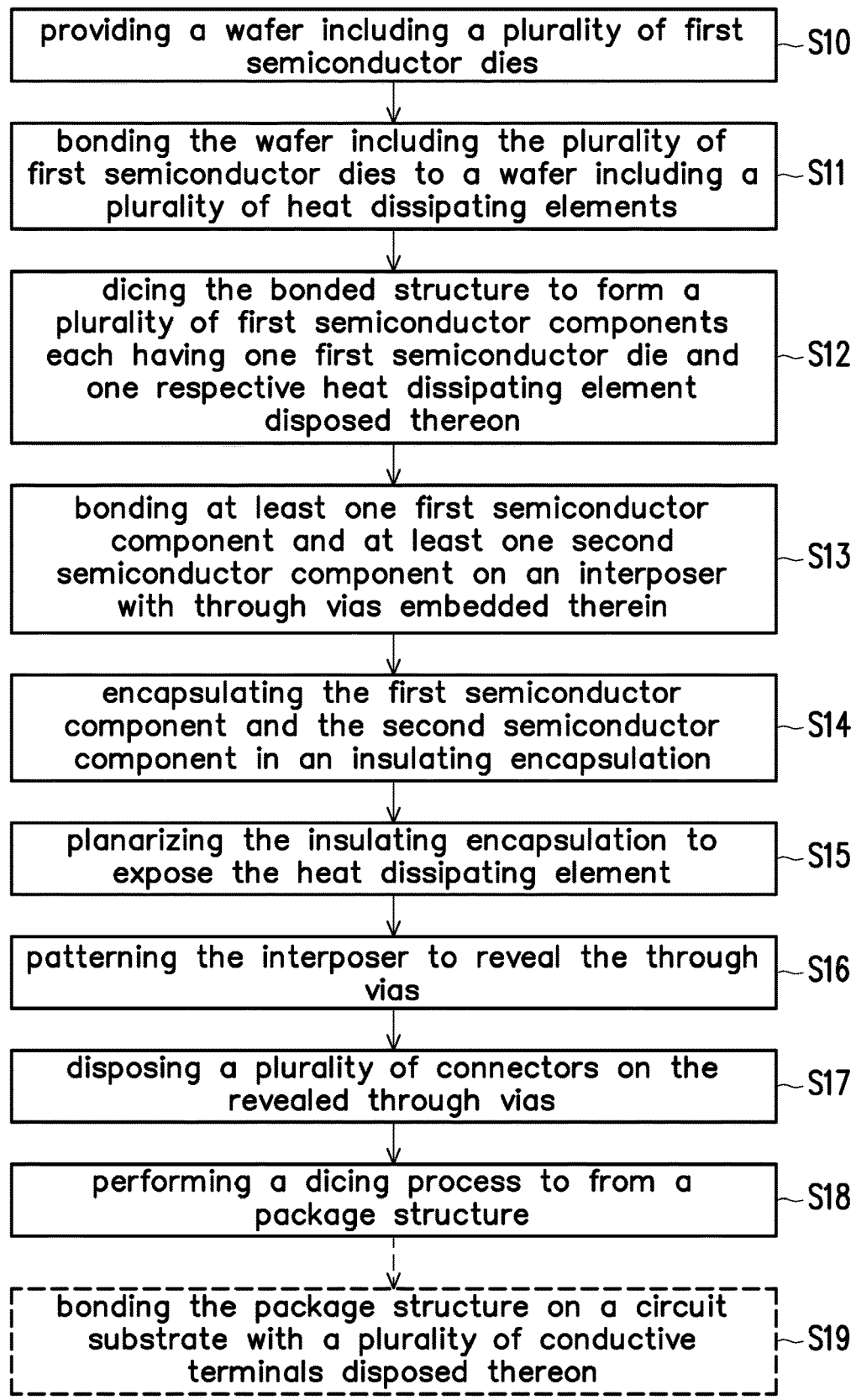
FIG. 16 is a flow chart illustrating a method of manufacturing a package structure in accordance with some embodiments of the disclosure.
Figure 17:
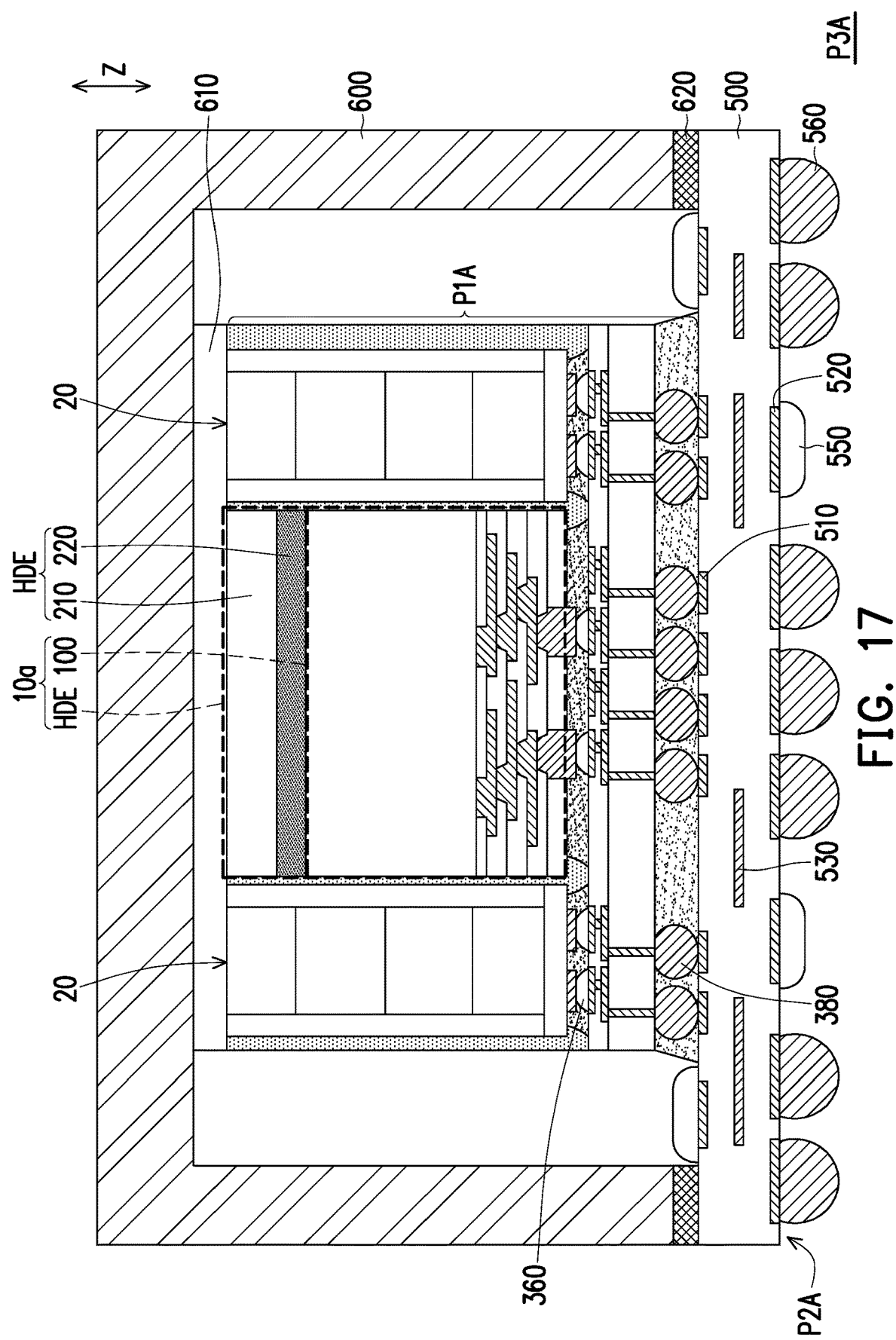
FIG. 17 is a schematic cross-sectional view of a package structure in accordance with some embodiments of the disclosure.

FIG. 1 to FIG. 13 and FIG. 14A are schematic cross-sectional views of various stages in a manufacturing method of a package structure in accordance with some embodiments of the disclosure. FIG. 14B is a schematic cross-sectional view of a package structure in accordance with some embodiments of the disclosure. FIG. 15 is a schematic cross-sectional view of a package structure in accordance with some embodiments of the disclosure. FIG. 16 is a flow chart illustrating a method of manufacturing a package structure in accordance with some embodiments of the disclosure. FIG. 17 is a schematic cross-sectional view of a package structure in accordance with some embodiments of the disclosure. In FIG. 1 to FIG. 14A, FIG. 14B, FIG. 15 and FIG. 17, one or more than one (semiconductor) chips or die are shown to represent plural (semiconductor) chips or dies of the wafer, and one (semiconductor) package structure are shown to represent plural (semiconductor) package structures obtained following the (semiconductor) manufacturing method, the disclosure is not limited thereto. In other embodiments, one or more than one (semiconductor) chips or dies are shown to represent plural (semiconductor) chips or dies of the wafer, and one or more than one (semiconductor) package structure are shown to represent plural (semiconductor) package structures obtained following the (semiconductor) manufacturing method.

Referring to FIG. 1, in some embodiments, a wafer W1 including a plurality of semiconductor dies 100 arranged in an array is provided, in accordance with step S10 of FIG. 16. Before performing a wafer sawing or dicing process on the wafer W1, the semiconductor dies 100 of the wafer W1 are connected one another, as shown in FIG. 1. In some embodiments, the wafer W1 includes a semiconductor substrate 110, an interconnection structure 120 disposed on the semiconductor substrate 110, and a passivation layer 130 covering the interconnection structure 120. As shown in FIG. 1, the semiconductor substrate 110 has a top surface 110a and a bottom surface 110b opposite to the top surface 110a, and the interconnection structure 120 is located on the top surface 110a of the semiconductor substrate 110 and is sandwiched between the semiconductor substrate 110 and the passivation layer 130, for example.

In some embodiments, the semiconductor substrate 110 may be a silicon substrate including active components (e.g., transistors and/or memories such as N-type metal-oxide semiconductor (NMOS) and/or P-type metal-oxide semiconductor (PMOS) devices, or the like) and/or passive components (e.g., resistors, capacitors, inductors or the like) formed therein. In some embodiments, such active components and passive components may be formed in a front-end-of-line (FEOL) process. In an alternative embodiment, the semiconductor substrate 110 may be a bulk silicon substrate, such as a bulk substrate of monocrystalline silicon, a doped silicon substrate, an undoped silicon substrate, or a silicon-on-insulator (SOI) substrate, where the dopant of the doped silicon substrate may be an N-type dopant, a P-type dopant or a combination thereof. The disclosure is not limited thereto.

The semiconductor substrate 110 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The semiconductor substrate 110 has an active surface (e.g., the top surface 110a), sometimes called a front side, and an inactive surface (e.g., the bottom surface 110b), sometimes called a back side.

In some embodiments, the interconnection structure 120 may include one or more inter-dielectric layers 122 and one or more patterned conductive layers 124 stacked alternately. For examples, the inter-dielectric layers 122 may be silicon oxide layers, silicon nitride layers, silicon oxy-nitride layers, or dielectric layers formed by other suitable dielectric materials, and the inter-dielectric layers 122 may be formed by deposition or the like. For examples, the patterned conductive layers 124 may be patterned copper layers or other suitable patterned metal layers, and the patterned conductive layers 124 may be formed by electroplating or deposition. However, the disclosure is not limited thereto. In some embodiments, the patterned conductive layers 124 may be formed by dual-damascene method. The number of the inter-dielectric layers 122 and the number of the patterned conductive layers 124 may be less than or more than what is depicted in FIG. 1, and may be designated based on the demand and/or design layout; the disclosure is not specifically limited thereto. Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium, etc.

In certain embodiments, as shown in FIG. 1, the patterned conductive layers 124 are sandwiched between the inter-dielectric layers 122, where a top surface of the topmost layer of the patterned conductive layers 124 is at least partially exposed by a plurality of openings O1 formed in the topmost layer of the inter-dielectric layers 122 to connect to later formed component(s) for electrical connection, and a bottom surface of the lowest layer of the patterned conductive layers 124 is at least partially exposed by a plurality of openings (no marked) formed in the lowest layer of the inter-dielectric layers 122 and electrically connected to the active components and/or passive components included in the semiconductor substrate 110. The shapes and numbers of the openings O1 and the openings formed in the lowest layer of the inter-dielectric layers 122 are not limited in the disclosure, and may be designated based on the demand and/or design layout.

The disclosure is not limited thereto. In an alternative embodiment (not shown), the patterned conductive layers 124 may be sandwiched between the inter-dielectric layers 122, where a top surface of the topmost layer of the patterned conductive layers 124 may be entirely covered by the inter-dielectric layers 122 for preventing damages caused by subsequent process(es), and a bottom surface of the lowest layer of the patterned conductive layers 124 may be at least partially exposed by openings formed in the lowest layer of the inter-dielectric layers 122 and electrically connected to the underlying active components and/or passive components. Through subsequent patterning processes, the top surface of the topmost layer of the patterned conductive layers 124 covered by the topmost layer of the inter-dielectric layers 122 may be exposed by resultant openings formed in the topmost layer of the inter-dielectric layers 122 for electrical connection to later formed component(s) overlaid thereon, for example.

In some embodiments, as shown in FIG. 1, the passivation layer 130 is formed on the interconnection structure 120, where the interconnection structure 120 is covered by and in contact with the passivation layer 130. As shown in FIG. 1, the passivation layer 130 has a substantially planar surface 130a, for example. In certain embodiments, the surface 130a of the passivation layer 130 may be leveled and may have a high degree of planarity and flatness, which is beneficial for the later-formed layers. In some embodiments, the passivation layer 130 may be a polyimide (PI) layer, a polybenzoxazole (PBO) layer, a silicon dioxide based (non-organic) layer or other suitable polymer (or organic) layer, and may be formed by deposition or the like. The disclosure is not limited thereto. In some embodiments, the passivation layer 130 entirely covers the topmost layer of the patterned conductive layers 124 and the topmost layer of the inter-dielectric layers 122, where the interconnection structure 120 is well-protected by the passivation layer 130 from damages caused by subsequent process(es). As shown in FIG. 1, the interconnection structure 120 is located between the top surface 110a of the semiconductor substrate 110 and the passivation layer 130, for example. The disclosure does not specifically limit a thickness of the passivation layer 130 as long as the surface 130a of the passivation layer 130 can maintain its high degree of planarity and flatness. In the disclosure, the surface 130a of the passivation layer may be referred to as a top surface of the semiconductor dies 100.

Continued on FIG. 1, in some embodiments, a wafer W2 including a plurality of heat dissipating elements HDE arranged in an array is also provided, in accordance with step S11 of FIG. 16. Before performing a wafer sawing or dicing process on the wafer W2, the heat dissipating elements HDE of the wafer W2 are connected one another, as shown in FIG. 1. In the disclosure, the heat dissipating elements HDE are also referred to as heat spreader elements. In some embodiments, the wafer W2 includes abase layer 210 and an adhesive layer 220 coated thereon. As shown in FIG. 1, the base layer 210 have a top surface 210a and a bottom surface 210b opposite to the top surface 210a, and the adhesive layer 220 is formed on the top surface 210a of the base layer 210, for example. In the disclosure, a material of the base layer 210 is different from a material of the adhesive layer 220. In the embodiments of which the wafer W2 including the based layer 210 and the adhesive layer 220, the base layer 210 and the adhesive layer 220 included in the wafer W2 are together referred to as one heat dissipating element HDE in the disclosure.

However, the disclosure is not limited thereto; in alternative embodiments, the adhesive layer 220 may be omitted from the wafer W2. That is, in the embodiments of which the wafer W2 excluding the adhesive layer 220, the base layer 210 included in the wafer W2 is alone referred to as one heat dissipating element HDE in the disclosure.

In some embodiments, the base layer 210 may include a silicon-based layer (such as a silicon substrate or a silicon oxide layer), a ceramics layer, a metal film (such as a copper (Cu) film, an aluminum (Al) film, an indium (In) film, or a sliver (Ag) film), a layer formed by metal paste (such as Ag paste, Cu paste, nano-Ag paste, or nano-Cu paste), a polymer layer, a compound layer, or a layer made of any suitable other material, given that the base layer 210 has a thermal conductivity coefficient is greater than an insulating encapsulation later-formed.

In some embodiments, the adhesive layer 220 may include a silicon-based layer (such as a silicon oxide layer, a silicon nitride layer), a layer formed by metal paste, a polymer layer, or a layer made of any suitable other material, given that the adhesive layer 220 has a thermal conductivity coefficient is greater than an insulating encapsulation later-formed and is capable of adhering the base layer 210 to any above layer(s) or any wafer(s) (e.g. the wafer W1) to be disposed thereon. For example, the adhesive layer 220 may be a die attach film (DAF), a liquid DAF, a glue layer, or an adhesive tape. In some embodiments, the adhesive layer 220 may be formed on the base layer 210 by lamination, a spin coat method, a dip coat method or a suitable coating method. For example, the adhesive layer 220 may be dispensed on the base layer 210 as a liquid (such as the liquid DAF) and cured, or may be a laminate film (such as the DAF) laminated onto the base layer 210. The disclosure is not limited thereto. A top surface 220a of the adhesive layer 220 may be leveled and may have a high degree of coplanarity.

Figure 2:
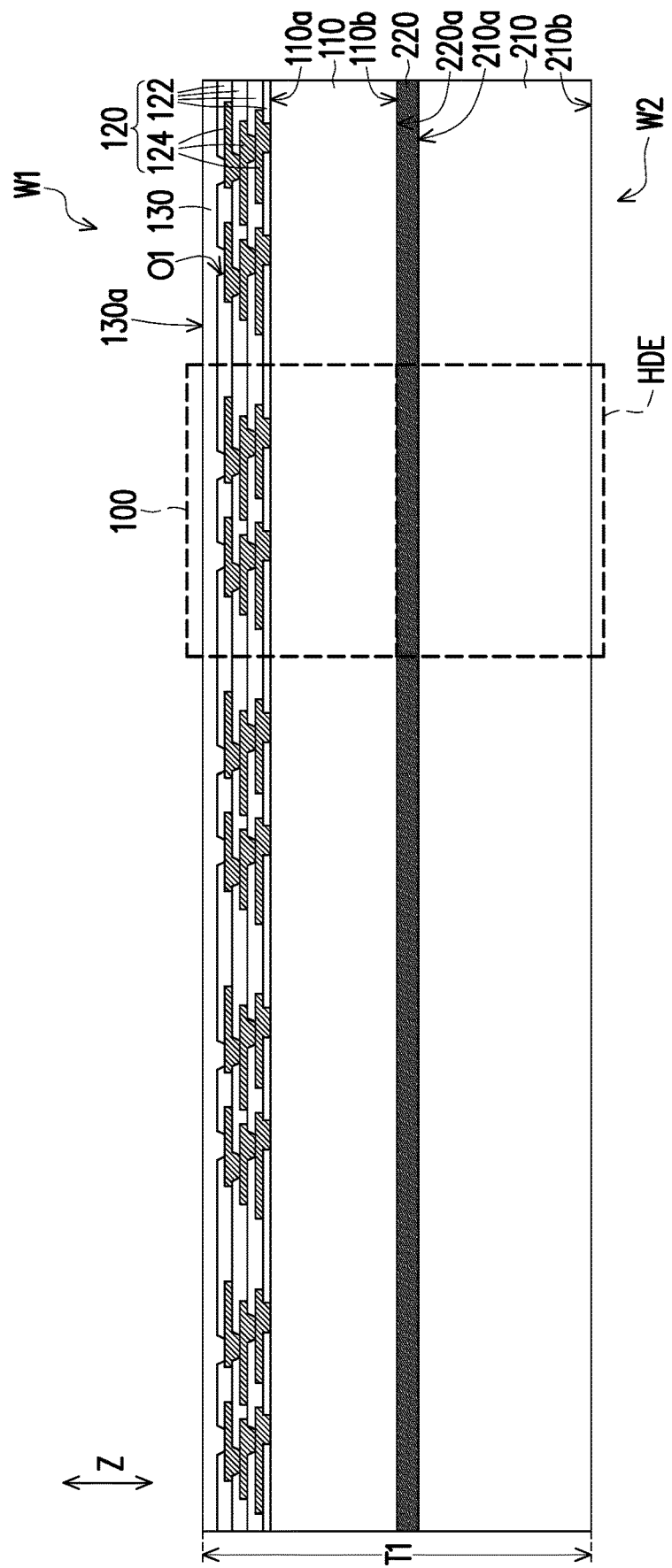

Referring to FIG. 1 and FIG. 2 together, in some embodiments, the wafer W1 is picked and placed on the wafer W2, and is bonded to the wafer W2, in accordance with step S11 of FIG. 16. A total thickness T1 of the structure depicted in FIG. 2 is approximately ranging from 100 μm to 2000 μm, for example. As shown in FIG. 2, the semiconductor substrate 110 is between the interconnection structure 120 and the base layer 210, the interconnection structure 120 is between the passivation layer 130 and the semiconductor substrate 110, and the adhesive layer 220 is between the semiconductor substrate 110 and the base layer 210. In the disclosure, the base layer 210 and the adhesive layer 220 (if any) is independently thermally coupled to the semiconductor substrate 110 of the wafer W1. In other words, the heat dissipating element HDE included in the wafer W2 is thermally coupled to each of the semiconductor dies 100 included in the wafer W1.

In some embodiments, as shown in FIG. 1 and FIG. 2, the bottom surface 110b of the semiconductor substrate 110 of the wafer W1 is facing towards the top surface 220a of the adhesive layer 220 of the wafer W2, where the wafer W1 is bonded to the wafer W2 by bonding the semiconductor substrate 110 to the base layer 210 through the adhesive layer 220 (e.g. an indirect bonding method). In one embodiment, the wafer W1 is bonded to the wafer W2 by adhesion, while the adhesive layer 220, which is made of a material with a property of adhesion (such as a metal paste, a polymer, etc.), is used to bond the semiconductor substrate 110 of the wafer W1 to the base layer 210 of the wafer W2. In an alternative embodiment, the wafer W1 is bonded to the wafer W2 by fusion bonding, while the adhesive layer 220, which is made of a material (such a silicon-based layer) is used to bond the semiconductor substrate 110 of the wafer W1 to the base layer 210 of the wafer W2. That is, through the adhesive layer 220, the semiconductor substrate 110 of the wafer W1 is indirectly bonded to the base layer 210 of the wafer W2 by adhesion or fusion bonding. It is appreciated that, with the presence of the adhesive layer 220, a material of the base layer 210 is different from a material of the adhesive layer 220 in the embodiments of the disclosure.

However, the disclosure is not limited thereto; in alternative embodiments of which the adhesive layer 220 is omitted, the wafer W1 may be directly bonded to the wafer W2 through adhesion or fusion bonding. That is, the bottom surface 110b of the semiconductor substrate 110 of the wafer W1 is facing towards the top surface 210a of the base layer 210 of the wafer W2, where the wafer W1 is bonded to the wafer W2 by physically bonding the bottom surface 110b of the semiconductor substrate 110 to the top surface 210a of the base layer 210 (e.g. an direct bonding method). In one embodiment, the wafer W1 is bonded to the wafer W2 by adhesion, while the base layer 210, which is made of a material with a property of adhesion (such as a metal paste, a polymer, etc.), is used for directly bonding to the semiconductor substrate 110 of the wafer W1. In an alternative embodiment, the wafer W1 is bonded to the wafer W2 by fusion bonding, while the base layer 210, which is made of a material (such a silicon-based layer) is used for directly bonding to the semiconductor substrate 110 of the wafer W1. That is, due to the base layer 210, the semiconductor substrate 110 of the wafer W1 is directly bonded to the base layer 210 of the wafer W2 by adhesion or fusion bonding.

Figure 3:
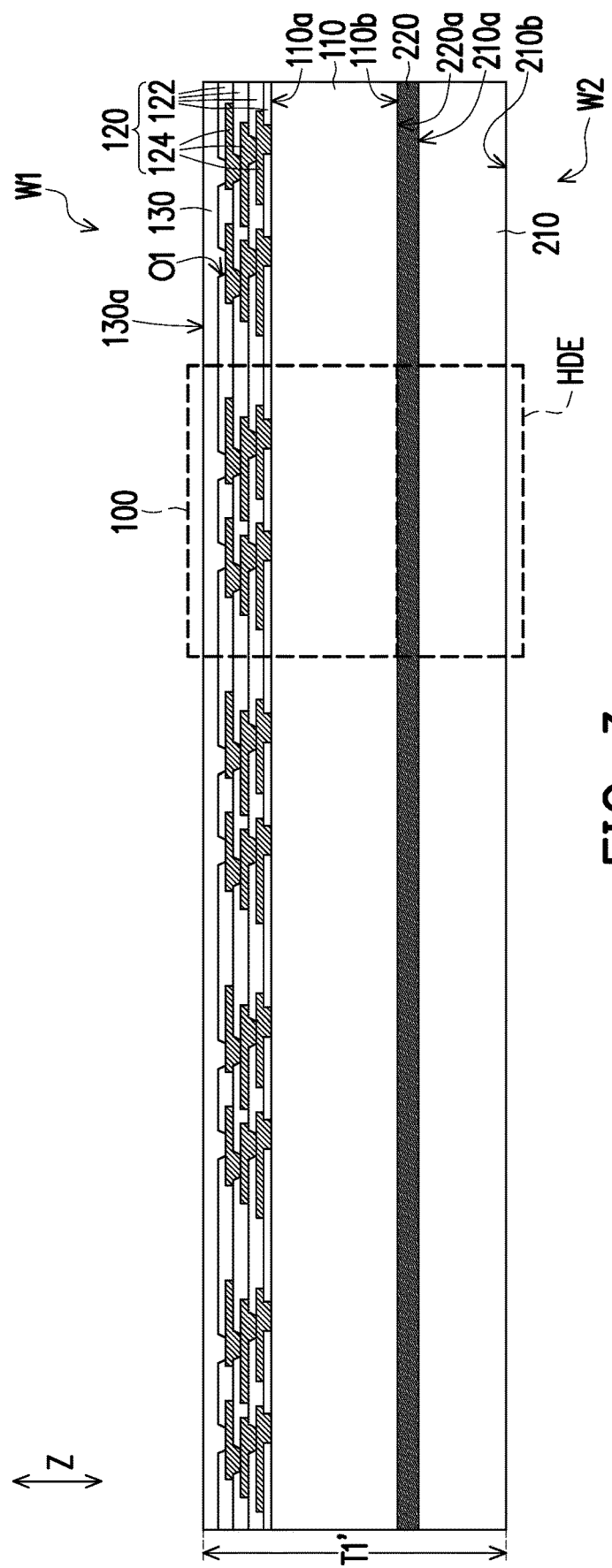

Referring to FIG. 3, in some embodiments, a planarizing step is performed on the bottom surface 210b of the base layer 210. After the planarizing, the base layer 210 may be considered as a planarized base layer or a thin base layer. In some embodiments, a total thickness T1' of the planarized structure depicted in FIG. 3 may approximately range from 100 µm to 1200 µm. In some embodiments, the planarizing step may include a grinding process or a chemical mechanical polishing (CMP) process. After the planarizing step, a cleaning step may be optionally performed, for example to clean and remove the residue generated from the planarizing step. However, the disclosure is not limited thereto, and the planarizing step may be performed through any other suitable method.

In certain embodiments, to facilitate the forgoing process depicted in FIG. 3, the structure depicted in FIG. 2 may be temporarily adhered with a support (not shown) via contacting the passivation layer 130 with a adhesion film (not shown) or be temporarily adhered with a temporary carrier (not shown, such as an adhesive tape, an adhesive carrier, a suction pad, etc.). However, the disclosure is not limited thereto. In one embodiment, as a thickness of the semiconductor substrate 110 is thick enough to perform the forgoing process depicted in FIG. 3 without generating damages (e.g. cracks or broken wafer), the passivation layer 130 may not necessarily be temporarily adhered with the support.

Figure 4:
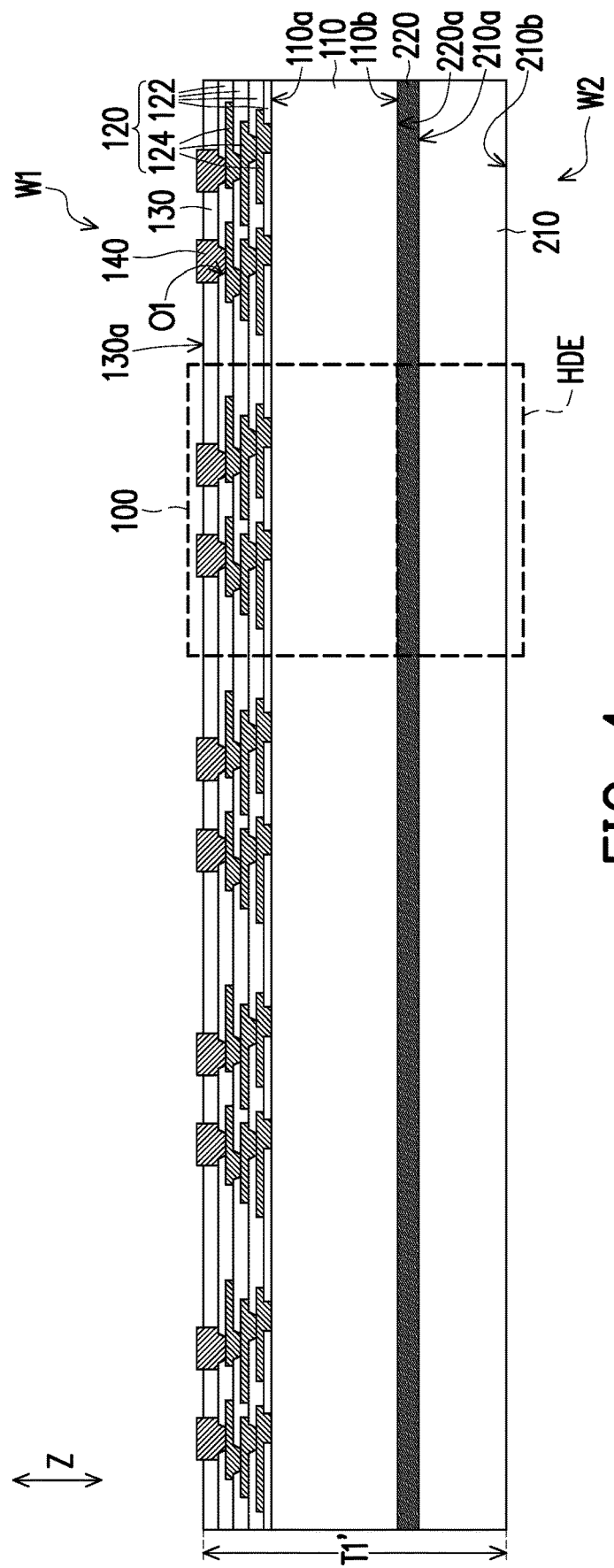

Referring to FIG. 4, in some embodiments, a plurality of conductive vias 140 are formed on the interconnection structure 120 and over the semiconductor substrate 110, and sidewalls of the conductive vias 140 are wrapped around by the passivation layer 130. In some embodiments, as shown in FIG. 4, the conductive vias 140 each penetrate through the passivation layer 130 and extend into the openings O1 formed in the topmost layer of the inter-dielectric layers 122 to physically contact the top surface of the topmost layer of the patterned conductive layers 124 exposed by the openings O1. Through the interconnection structure 120, the conductive vias 140 are electrically connected to the active components and/or passive components included in the semiconductor substrate 110.

It is appreciated that, the semiconductor dies 100 each at least include the semiconductor substrate 110, the interconnection structure 120, the passivation layer 130 and the conductive vias 140. In some embodiments, each of the semiconductor dies 100 described herein may be referred to as a semiconductor chip or an integrated circuit (IC). In some embodiments, the semiconductor dies 100 each are a logic chip, such as a central processing unit (CPU), graphics processing unit (GPU), system-on-a-chip (SoC), microcontroller, or the like. However, the disclosure is not limited thereto; in alternative embodiments, the semiconductor dies 100 independently may include one or more digital chips, analog chips or mixed signal chips, such as application-specific integrated circuit ("ASIC") chips, sensor chips, wireless and radio frequency (RF) chips, memory chips or voltage regulator chips. In further alternative embodiments, the semiconductor dies 100 independently may be referred to as a chip or an IC of combination-type, such as a WiFi chip simultaneously including both of a RF chip and a digital chip.

In some embodiments, as shown in FIG. 4, for each semiconductor die 100, the conductive vias 140 in physical contact with the interconnection structure 120 are extended away from the surface 130a of the passivation layer 130. For simplification, only two conductive vias 140 are presented in FIG. 4 in each semiconductor die 100 for illustrative purposes, however it should be noted that more than two conductive vias 140 may be formed; the disclosure is not limited thereto. In some embodiments, in a vertical projection on the top surface 110a of the semiconductor substrate 110 along a stacking direction Z of the semiconductor substrate 110, the interconnection structure 120 and the passivation layer 130, the conductive vias 140 may, independently, be in a circle-shape, an ellipse-shape, a triangle-shape, a rectangle-shape, or the like. The shape of the conductive vias 140 is not limited in the disclosure. The number and shape of the conductive vias 140 may be designated and selected based on the demand, and adjusted by changing the number and shape of the openings O1.

In some embodiments, the conductive vias 140 are formed by photolithography, plating, photoresist stripping processes or any other suitable method. For example, the plating process may include an electroplating plating, an electroless plating, or the like. In one embodiment, the conductive vias 140 may be formed by forming a mask pattern (not shown) covering the passivation layer 130 with openings (not shown) corresponding to the top surface of the topmost layer of the patterned conductive layers 124 exposed by the openings O1, patterning the passivation layer 130 to form contact openings (not shown) therein to expose the top surface of the topmost layer of the patterned conductive layers 124 exposed by the openings O1, forming a metallic material filling the openings formed in the mask pattern, the contact openings formed in the passivation layer 130 and the openings O1 to form the conductive vias 140 by electroplating or deposition, and then removing the mask pattern. In some embodiments, the passivation layer 130 may be patterned by an etching process, such a dry etching process, a wet etching process, or the combination thereof. It is noted that the contact openings formed in the passivation layer 130 and a respective one opening O1 underlying thereto are spatially communicated to each other for the formation of the conductive vias 140. In one embodiment, the mask pattern may be removed by acceptable ashing process and/or photoresist stripping process, such as using an oxygen plasma or the like. In one embodiment, the material of the conductive vias 140 may include a metal material such as copper or copper alloys, or the like.

In some alternative embodiments, the conductive vias 140 may be formed by forming a first mask pattern (not shown) covering the passivation layer 130 with openings (not shown) corresponding to the top surface of the topmost layer of the patterned conductive layers 124 exposed by the openings O1, patterning the passivation layer 130 to form contact openings (not shown) therein to expose the top surface of the topmost layer of the patterned conductive layers 124 exposed by the openings O1, removing the first mask pattern, conformally forming a metallic seed layer over the passivation layer 130, forming a second mask pattern (not shown) covering the passivation layer 130 with openings (not shown) exposing the contact openings formed in the passivation layer 130 and the openings O1, forming a metallic material filling the openings formed in the second mask pattern, the contact openings formed in the passivation layer 130 and the openings O1 by electroplating or deposition, removing the second mask pattern, and then removing the metallic seed layer not covered by the metallic material to form the conductive vias 140. In some embodiments, the metallic seed layer is referred to as a metal layer, which may be a single layer or a composite layer comprising a plurality of sub-layers formed of different materials. In some embodiments, the metallic seed layer include titanium, copper, molybdenum, tungsten, titanium nitride, titanium tungsten, combinations thereof, or the like. For example, the metallic seed layer may include a titanium layer and a copper layer over the titanium layer. The metallic seed layer may be formed using, for example, sputtering, physical vapor deposition (PVD), or the like.

Figure 5:
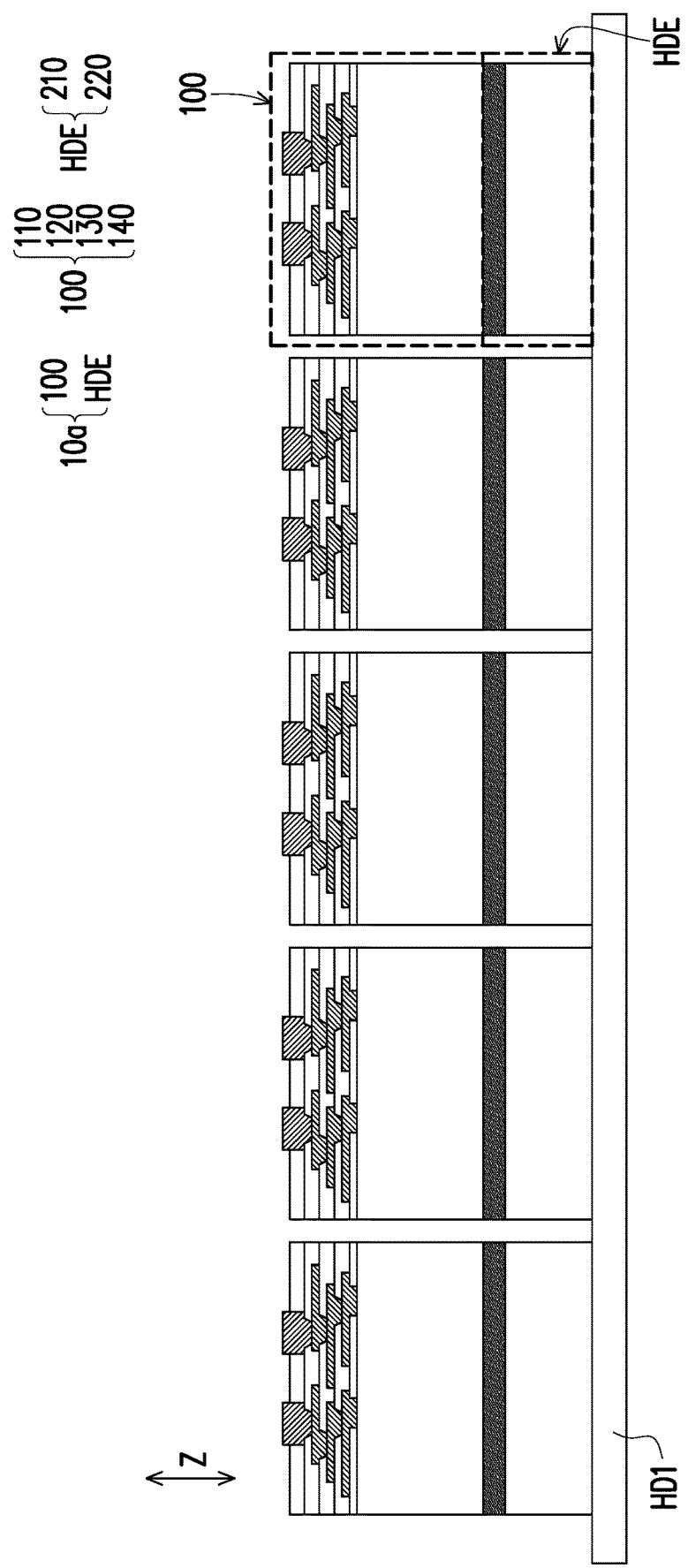

Referring to FIG. 5, in some embodiments, a dicing (singulation) process is performed on the structure depicted in FIG. 4, such that the structure depicted in FIG. 4 is cut into individual and separated semiconductor components 10a, in accordance with step S12 of FIG. 16. In some embodiments, as shown in FIG. 5, a holding device HD1 is adopted to secure the structure depicted in FIG. 4 for preventing any damages to the semiconductor components 10a during the dicing (singulation) process. In one embodiment, the holding device HD1 does not be cut during the dicing (singulation) process, however the disclosure is not limited thereto. In an alternative embodiment (not shown), during the dicing (singulation) process, the holding device HD1 may be partially cut. For example, the holding device HD1 may be an adhesive tape, an adhesive carrier or a suction pad, the disclosure is not limited thereto. In one embodiment, the dicing (singulation) process is a wafer dicing process or a wafer singulation process, which may include mechanical sawing or laser cutting. The disclosure is not limited thereto. Up to this, the semiconductor components 10a are manufactured, where each of the semiconductor components 10a includes one semiconductor die 100 with one heat dissipating element HDE connected thereto. In the disclosure, in each of the semiconductor components 10a, the heat dissipating element HDE is thermally coupled to the semiconductor die 100. As shown in FIG. 5, a sidewall of the heat dissipating element HDE is aligned with a sidewall of the semiconductor die 100.

Figure 6:
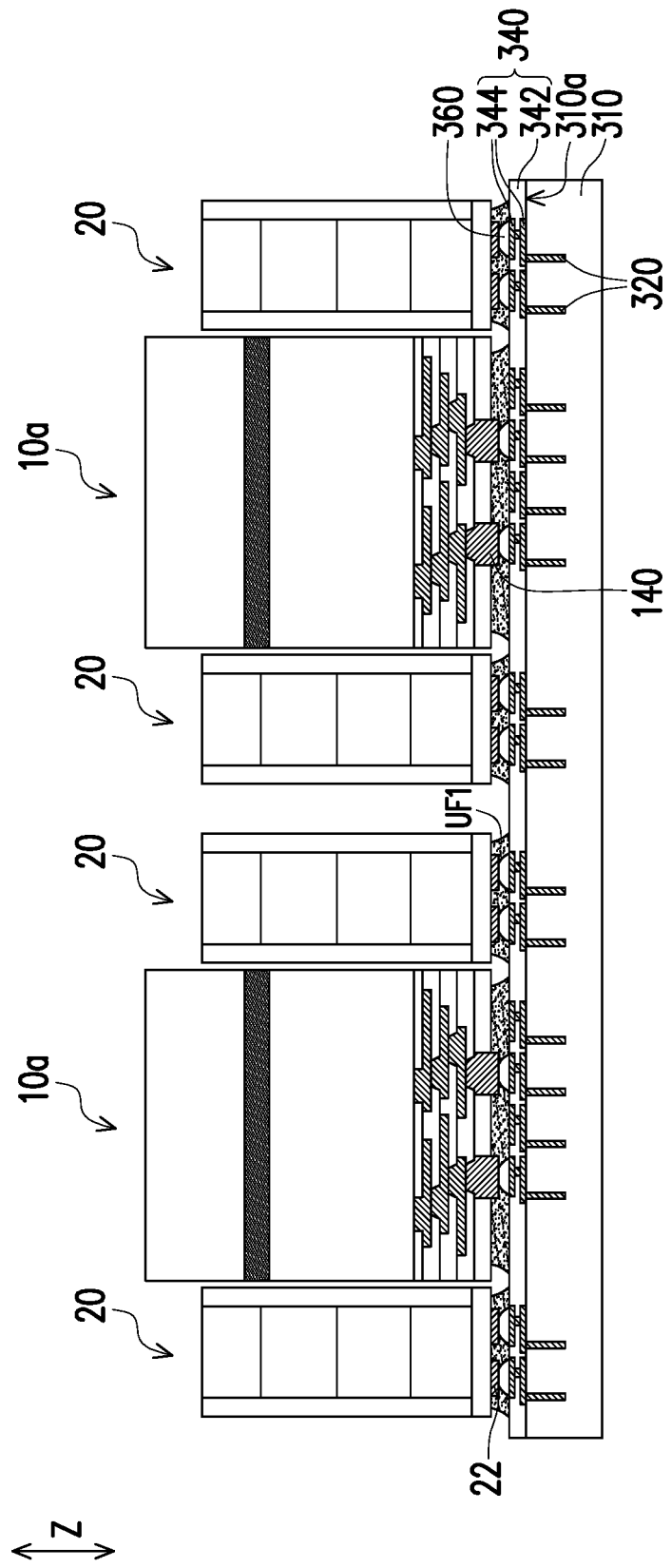

Referring to FIG. 6, in some embodiments, a substrate 310 is provided, where the semiconductor components 10a (depicted in FIG. 5) and at least one semiconductor component 20 are picked and placed on the substrate 310, and are bonded to the substrate 310 through flip chip bonding, in accordance with step S13 of FIG. 16. In some embodiments, the substrate 310 may be a wafer, such as a bulk semiconductor substrate, SOI substrate, multi-layered semiconductor substrate, or the like. The semiconductor material of the substrate 310 may be silicon, germanium; a compound semiconductor including silicon germanium, silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof, in some embodiments. In an alternative embodiment, other substrates, such as multi-layered or gradient substrates, may also be used. The substrate 310, for example, may be doped or undoped and may further include active and/or passive devices, such as transistors, capacitors, resistors, diodes, and the like formed in and/or on a surface 310a of the substrate 310. In some embodiments, the surface 310a may be referred to as an active surface (or a front side) of the substrate 310. In certain embodiments, the substrate 310 may be substantially free of active and/or passive devices, the disclosure is not limited thereto.

In some embodiments, through vias 320 are formed in the substrate 310 to extend from the surface 310a of the substrate 310. For example, the through vias 320 are sometimes referred to as through-substrate-vias or through-silicon-vias as the substrate 310 is a silicon substrate. The through vias 320 may be formed by forming recesses in the substrate 310 by, for example, etching, milling, laser techniques, a combination thereof, and/or the like. A thin dielectric material may be formed in the recesses, such as by using an oxidation technique. A thin barrier layer may be conformally deposited over the surface 310a of the substrate 310 and in the openings, such as by chemical vapor deposition (CVD), atomic layer deposition (ALD), PVD, thermal oxidation, a combination thereof, and/or the like. The barrier layer may comprise a nitride or an oxynitride, such as titanium nitride, titanium oxynitride, tantalum nitride, tantalum oxynitride, tungsten nitride, a combination thereof, and/or the like. A conductive material may be deposited over the thin barrier layer and in the openings. The conductive material may be formed by an electro-chemical plating process, CVD, ALD, PVD, a combination thereof, and/or the like. Examples of conductive materials are copper, tungsten, aluminum, silver, gold, a combination thereof, and/or the like. Excess conductive material and barrier layer is removed from the surface 310a of the substrate 310 by, for example, CMP. Thus, the through vias 320 may comprise a conductive material and a thin barrier layer between the conductive material and the substrate 310.

In some embodiments, a redistribution circuit structure 340 is formed on the surface 310a of the substrate 310, and is electrically connected to the substrate 310. In certain embodiments, the redistribution circuit structure 340 includes a dielectric structure 342 and one or more metallization layers 344 arranged therein for providing routing functionality. In some embodiments, the dielectric structure 342 includes one or more dielectric layers, such that the dielectric layers and the metallization layer 344 are sequentially formed, and one metallization layer 344 is sandwiched between two dielectric layers. As shown in FIG. 6, portions of a top surface of a topmost layer of the metallization layers 344 are respectively exposed by openings formed in a topmost dielectric layer of the dielectric structure 342, and portions of a bottom surface of a bottommost layer of the metallization layers 344 are respectively exposed by openings formed in a bottommost dielectric layer of the dielectric structure 342. However, the disclosure is not limited thereto. The numbers of the metallization layers and the dielectric layers included in the redistribution circuit structure 340 is not limited thereto, and may be designated and selected based on the demand. The material and formation of the dielectric structure 342 may be the same or similar to the material and formation of the inter-dielectric layers 122, the material and formation of the metallization layers 344 may be the same or similar to the material and formation of the patterned conductive layers 124, and thus may not be repeated herein. As shown in FIG. 6, the through vias 320 are connected to the portions of the bottom surface of the bottommost layer of the metallization layers 344 respectively exposed by the openings formed in the bottommost dielectric layer of the dielectric structure 342. In other words, the redistribution circuit structure 340 are electrically connected to the through vias 320. In an alternative embodiment, the redistribution circuit structure 340 may further be electrically connected to the active and/or passive devices embedded in the substrate 310 or formed on the surface 310a of the substrate 310.

In some embodiments, a plurality of conductive connectors 360 are formed on the redistribution circuit structure 340. As shown in FIG. 6, for example, the conductive connectors 360 are formed on and connected to the portions of the top surface of the topmost layer of the metallization layers 344 respectively exposed by the openings formed in the topmost dielectric layer of the dielectric structure 342. In other words, the conductive connectors 360 are electrically connected to the redistribution circuit structure 340. In an alternative embodiment, through the redistribution circuit structure 340, some of the conductive connectors 360 may further be electrically connected to the substrate 310 (e.g. the active and/or passive devices embedded therein or formed on the surface 310a) and the through vias 320.

In some embodiments, the conductive connectors 360 may include ball grid array (BGA) connectors, solder balls, metal pillars, controlled collapse chip connection (C4) bumps, micro bumps, electroless nickel-electroless palladium-immersion gold technique (ENEPIG) formed bumps, or the like. The material of the conductive connectors 360, for example, may include a conductive material such as solder, copper, aluminum, gold, nickel, silver, palladium, tin, or the like, or a combination thereof. In one embodiment, the material of the conductive connectors 360, for example, may be solder-free. The cross-sectional view of the conductive connectors 360 is not limited to the embodiments, and may has any suitable shape based on the demand.

Continued on FIG. 6, in some embodiments, each of the semiconductor components 20 described herein may be referred to as a semiconductor chip or an integrated circuit (IC) having conductive vias 22, where the conductive vias 22 serve as conductive terminals of the semiconductor components 20 for electrical connection to external components. In some embodiments, the semiconductor components 20 each are a memory chip or device, such as a dynamic random access memory (DRAM) die, static random access memory (SRAM) die, hybrid memory cube (HMC) module, a high bandwidth memory (HBM) module, or the like. However, the disclosure is not limited thereto; in alternative embodiments, the semiconductor components 20 independently may include one or more digital chips, analog chips or mixed signal chips, such as application-specific integrated circuit ("ASIC") chips, sensor chips, wireless and radio frequency (RF) chips, logic chips or voltage regulator chips. In further alternative embodiments, the semiconductor components 20 independently may be referred to as a chip or an IC of combination-type, such as a WiFi chip simultaneously including both of a RF chip and a digital chip.

In one embodiment, the semiconductor dies 100 of the semiconductor components 10a and the semiconductor components 20 may be the same or different type of dies. In one embodiment, the semiconductor dies 100 of the semiconductor components 10a and the semiconductor components 20 may be formed in processes of a same technology node, or may be formed in processes of different technology nodes. For example, the semiconductor dies 100 of the semiconductor components 10a may be of a more advanced process node than the semiconductor components 20; or vice versa.

In some embodiments, the semiconductor dies 100 of the semiconductor components 10a and the semiconductor components 20 have different sizes (e.g., different heights measuring along the stacking direction Z and/or surface areas). For example, as shown in FIG. 6, the height of the semiconductor dies 100 of the semiconductor components 10a is less than the height of the semiconductor component 20, and the height of the semiconductor components 10a is greater than the height of the semiconductor component 20. However, the disclosure is not limited thereto; for another example, the height of the semiconductor dies 100 of the semiconductor components 10a is less than the height of the semiconductor component 20, and the height of the semiconductor components 10a is substantially equal to the height of the semiconductor component 20.

In some embodiments, as shown in FIG. 6, the semiconductor components 10a are electrically connected to the substrate 310 through the conductive vias 140 and the conductive connectors 360, while the semiconductor components 20 are electrically connected to the substrate 310 through the conductive vias 22 and the conductive connectors 360. In some embodiments, the semiconductor components 10a and the semiconductor components 20 are electrically communicated to each other through the redistribution circuit structure 340 and the conductive connectors 360.

In some embodiments, an underfill UF1 at least fills the gaps between the semiconductor components 10a and the substrate 310 and between the semiconductor components 20 and the substrate 310, and wraps sidewalls of the conductive vias 140, the conductive vias 22 and the conductive connectors 360. In one embodiment, the underfill UF1 filled in the gaps between the semiconductor components 10a, 20 and the substrate 310 are not connected to one another. In another embodiment, the underfill UF1 filled in the gaps between the semiconductor components 10a, 20 and the substrate 310 are connected to one another, the disclosure is not limited thereto. In some alternative embodiments, a sidewall of the semiconductor components 10a and a sidewall of the semiconductor components 20 may be covered by the underfill UF1. The underfill UF1 may be any acceptable material, such as a polymer, epoxy resin, molding underfill, or the like, for example. In one embodiment, the underfill UF1 may be formed by underfill dispensing, a capillary flow process, or any other suitable method.

Figure 7:
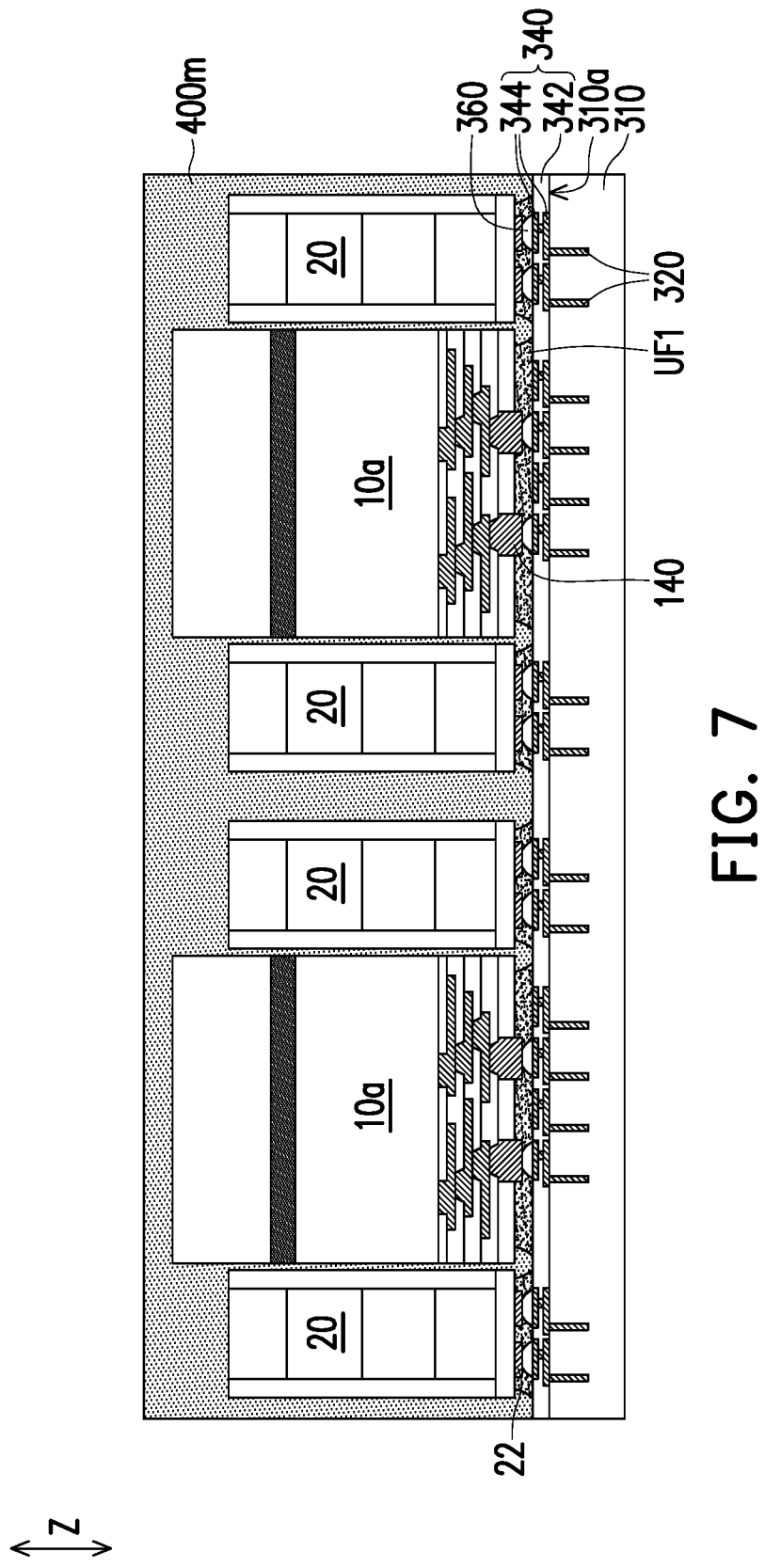

Referring to FIG. 7, in some embodiments, an insulating encapsulation 400m is formed over the substrate 310, in accordance with step S14 of FIG. 16. For example, as shown in FIG. 7, the semiconductor components 10a, 20 are encapsulated in the insulating encapsulation 400m, and the redistribution circuit structure 340 exposed by the underfill UF1 is covered by the insulating encapsulation 400m. For example, the insulating encapsulation 400m at least fills up the gaps between the semiconductor components 10a, 20 and between the underfill UF1 respectively underlying the semiconductor components 10a, 20. As shown in FIG. 7, for example, the semiconductor components 10a, 20 and the underfill UF1 are surrounded and covered by the insulating encapsulation 400m. That is, the semiconductor components 10a, 20 and the underfill UF1 are embedded in the insulating encapsulation 400m. In other words, the semiconductor components 10a, 20 are not accessibly revealed by and embedded in the insulating encapsulation 400m.

In some embodiments, the insulating encapsulation 400m is a molding compound formed by a molding process. In some embodiments, the insulating encapsulation 400m, for example, may include polymers (such as epoxy resins, phenolic resins, silicon-containing resins, or other suitable resins), dielectric materials, or other suitable materials. In an alternative embodiment, the insulating encapsulation 400m may include an acceptable insulating encapsulation material. In some embodiments, the insulating encapsulation 400m may further include inorganic filler or inorganic compound (e.g. silica, clay, and so on) which can be added therein to optimize coefficient of thermal expansion (CTE) of the insulating encapsulation 400m. The disclosure is not limited thereto.

Figure 8:
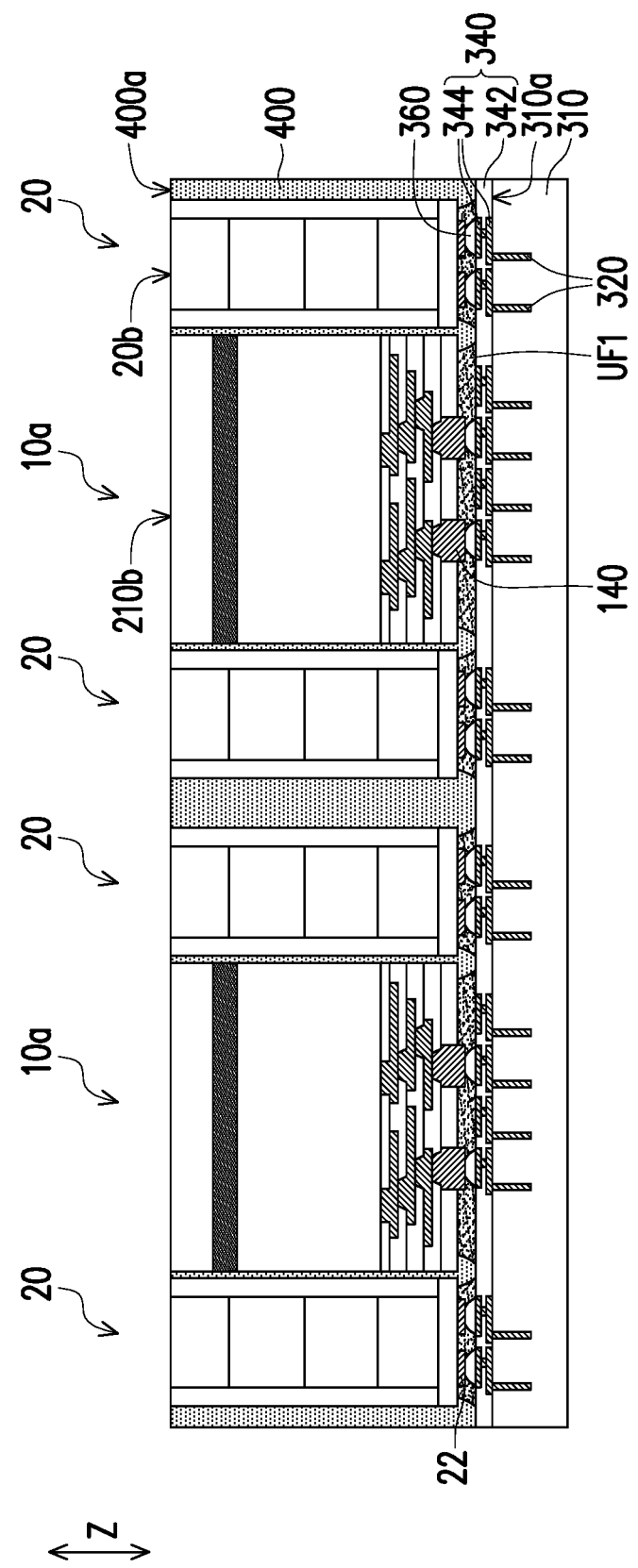

Referring to FIG. 7 and FIG. 8 together, in some embodiments, the insulating encapsulation 400m is planarized until bottom surfaces (e.g. the bottom surfaces 210b of the base layers 210) of the semiconductor components 10a and bottom surfaces 20b of the semiconductor components 20 are exposed, in accordance with step S15 of FIG. 16. After the insulating encapsulation 400m is planarized, a (planarized) insulating encapsulation 400 is formed, and the bottom surfaces (e.g. the bottom surfaces 210b of the base layers 210) of the semiconductor components 10a and the bottom surfaces 20b of the semiconductor components 20 are exposed by a surface 400a of the insulating encapsulation 400.

During the planarized process of the insulating encapsulation 400m, the semiconductor components 10a, 20 independently may also be planarized. The insulating encapsulation 400 may be formed by mechanical grinding or CMP, for example. After the planarizing process, a cleaning step may be optionally performed, for example to clean and remove the residue generated from the planarizing step. However, the disclosure is not limited thereto, and the planarizing step may be performed through any other suitable method. As shown in FIG. 8, the bottom surfaces (e.g. the bottom surfaces 210b of the base layers 210) of the semiconductor components 10a and the bottom surface 20b of the semiconductor components 20 are substantially leveled with the surface 400a of the insulating encapsulation 400. That is, the bottom surfaces (e.g. the bottom surfaces 210b of the base layers 210) of the semiconductor components 10a, the bottom surface 20b of the semiconductor components 20, and the surface 400a of the insulating encapsulation 400 are substantially coplanar to each other. In other words, the semiconductor components 10a, 20 are accessibly revealed by the insulating encapsulation 400.

Figure 9:
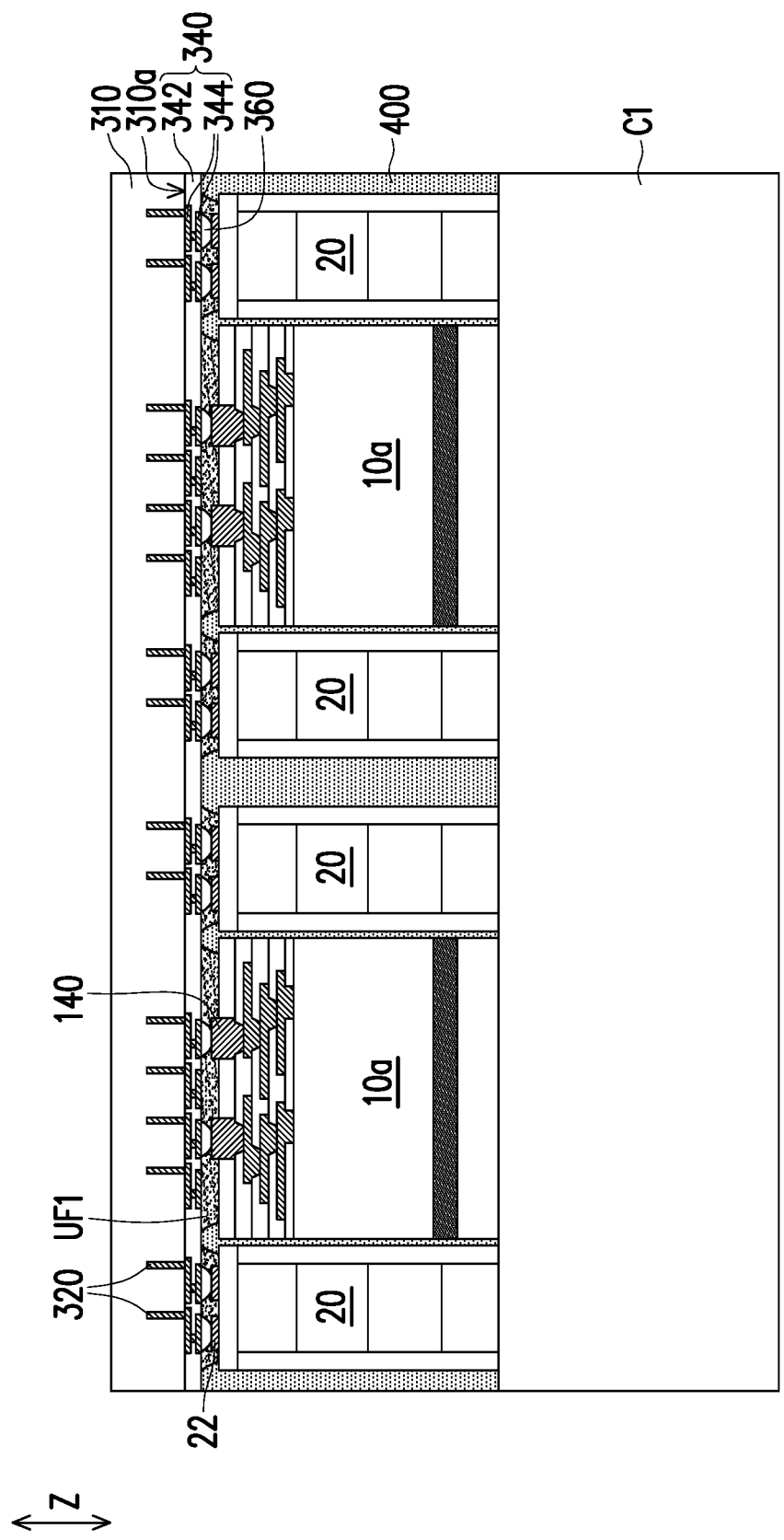

Referring to FIG. 9, in some embodiments, after the insulating encapsulation 400 is formed, the structure depicted in FIG. 8 are flipped (turned upside down along the stacking direction Z), and the insulating encapsulation 400 is placed on a carrier C1. In some alternative embodiments, the carrier C1 may further be coated with a debond layer (not shown). For example, the debond layer is disposed on the carrier C1, and the material of the debond layer may be any material suitable for bonding and debonding the carrier C1 from the above layer(s) (e.g., the insulating encapsulation 400) or any wafer(s) disposed thereon. In some embodiments, the debond layer may include a release layer (such as a light-to-heat conversion ("LTHC") layer) or an adhesive layer (such as an ultra-violet curable adhesive or a heat curable adhesive layer).

Figure 10:
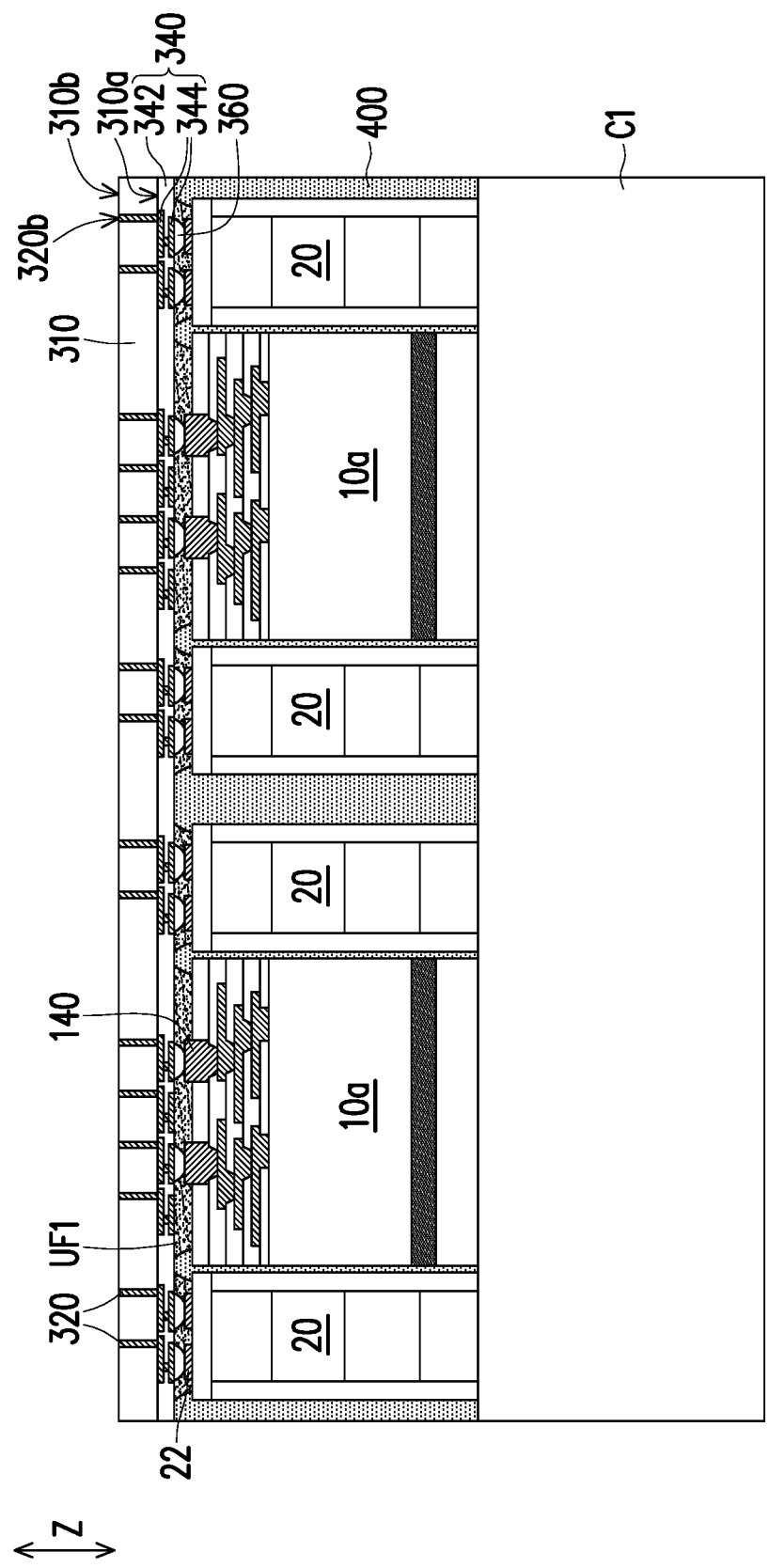

Referring to FIG. 10, in some embodiments, the substrate 310 is then planarized until bottom surfaces 320b of the through vias 320 embedded in the substrate 310 is exposed, in accordance with step S16 of FIG. 16. After the substrate 310 is planarized, the bottom surfaces 320b of the through vias 320 are exposed by a surface 310b of the substrate 310. During the planarized process of the substrate 310, the through vias 320 may also be planarized. The substrate 310 may be planarized by mechanical grinding or CMP, for example. After the planarizing process, a cleaning step may be optionally performed, for example to clean and remove the residue generated from the planarizing step. However, the disclosure is not limited thereto, and the planarizing step may be performed through any other suitable method. As shown in FIG. 10, the bottom surfaces 320b of the through vias 320 are substantially leveled with and coplanar to the surface 310b of the substrate 310. That is, the bottom surfaces 320b of the through vias 320 are accessibly exposed by the substrate 310.

Figure 11:
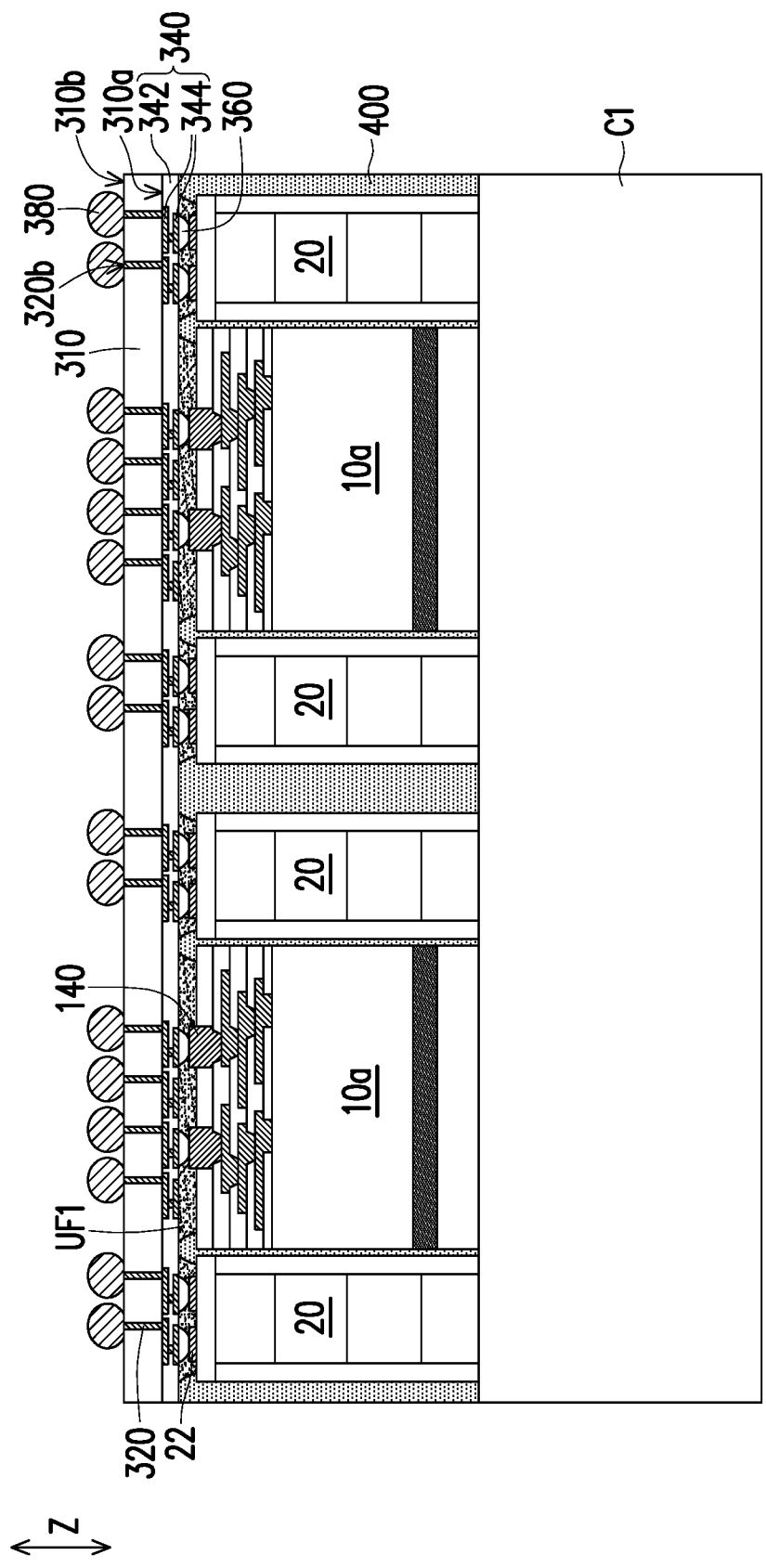

Referring to FIG. 11, in some embodiments, a plurality of conductive connectors 380 are formed on the substrate 310, where the conductive connectors 380 are connected to the through vias 320, in accordance with step S17 of FIG. 16. As shown in FIG. 11, the conductive connectors 380 are formed on the substrate 310 corresponding to the positioning location of the through vias 320, and thus the conductive connectors 380 are in physical contact with the bottom surfaces 320b of the through vias 320, respectively, for example. In some embodiments, through the through vias 320, the redistribution circuit structure 340 and the conductive connectors 360, some of the conductive connectors 380 are electrically connected to the semiconductor components 10a. In some embodiments, through the through vias 320, the redistribution circuit structure 340 and the conductive connectors 360, some of the conductive connectors 380 are electrically connected to the semiconductor components 20. In an alternative embodiment, some of the conductive connectors 380 may further be electrically connected to the active and passive devices embedded in or formed on the surface 310a of the substrate 310. The material and formation of the conductive connectors 380 are the same or similar to the material and formation of the conductive connectors 360, and thus may not be repeated herein. In one embodiment, the conductive connectors 380 may be the same as the conductive connectors 360. In an alternative embodiment, the conductive connectors 380 may be different from the conductive connectors 360.

Figure 12:
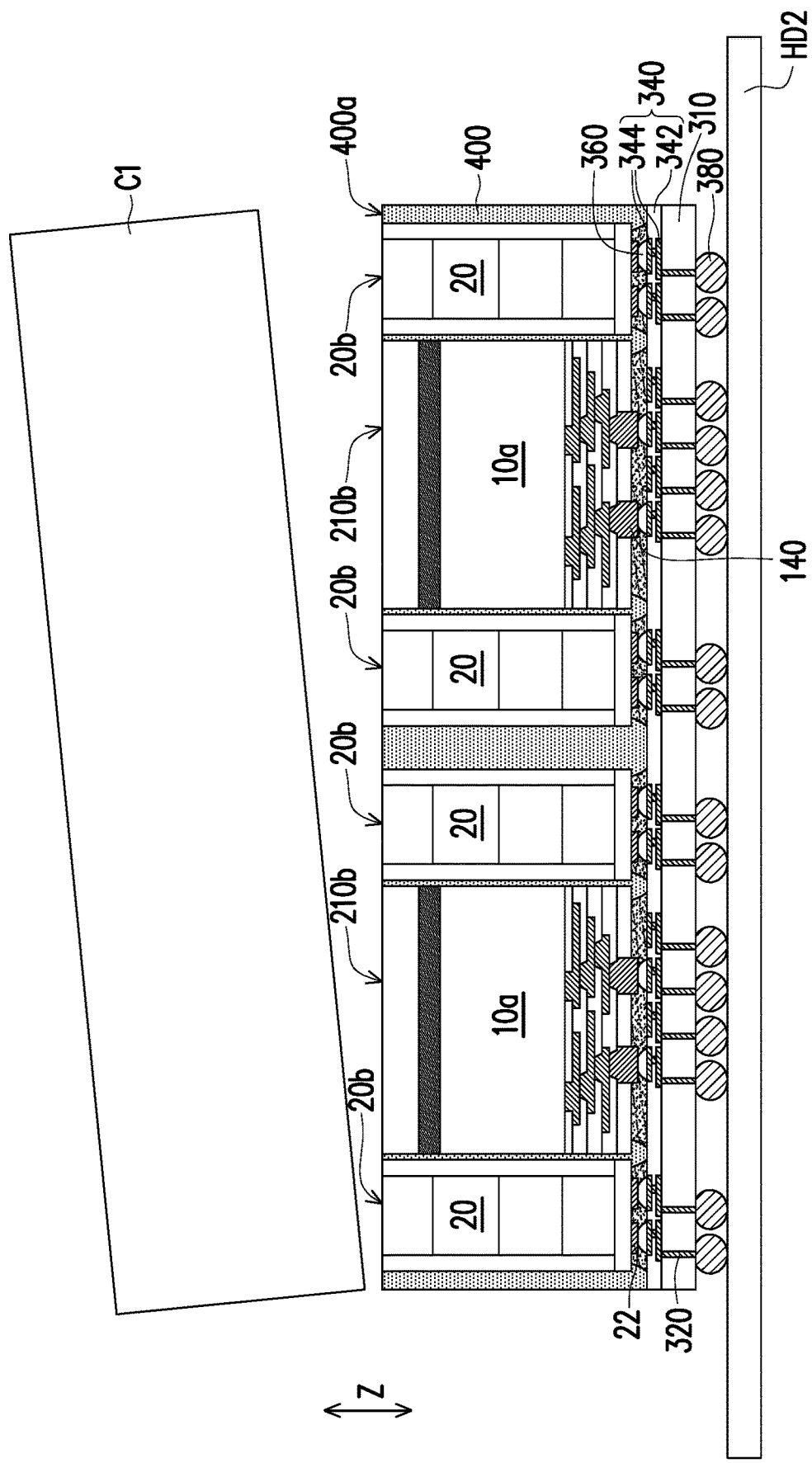

Referring to FIG. 12, in some embodiments, the whole structure depicted in FIG. 11 along with the carrier C1 is flipped (turned upside down) and then the carrier C1 is debonded from the insulating encapsulation 400 and the semiconductor components 10a, 20. In some embodiments, the carrier C1 is detached from the insulating encapsulation 400 and the semiconductor components 10a, 20 through a debonding process, where the carrier C1 is removed, and the insulating encapsulation 400 and the semiconductor components 10a, 20 are exposed. As shown in FIG. 12, the surface 400a of the insulating encapsulation 400, the bottom surfaces (e.g. the bottom surfaces 210b) of the semiconductor components 10a and the bottom surfaces 20b of the semiconductor components 20 are exposed.

In one embodiment, the debonding process is a laser debonding process. During the debonding step, a holding device HD2 is adopted to secure the whole structure depicted in FIG. 11 before debonding the carrier C1, where the conductive connectors 380 are held by the holding device HD2. As shown in FIG. 12, for example, the holding device HD2 may be an adhesive tape, a carrier film or a suction pad.

Figure 13:
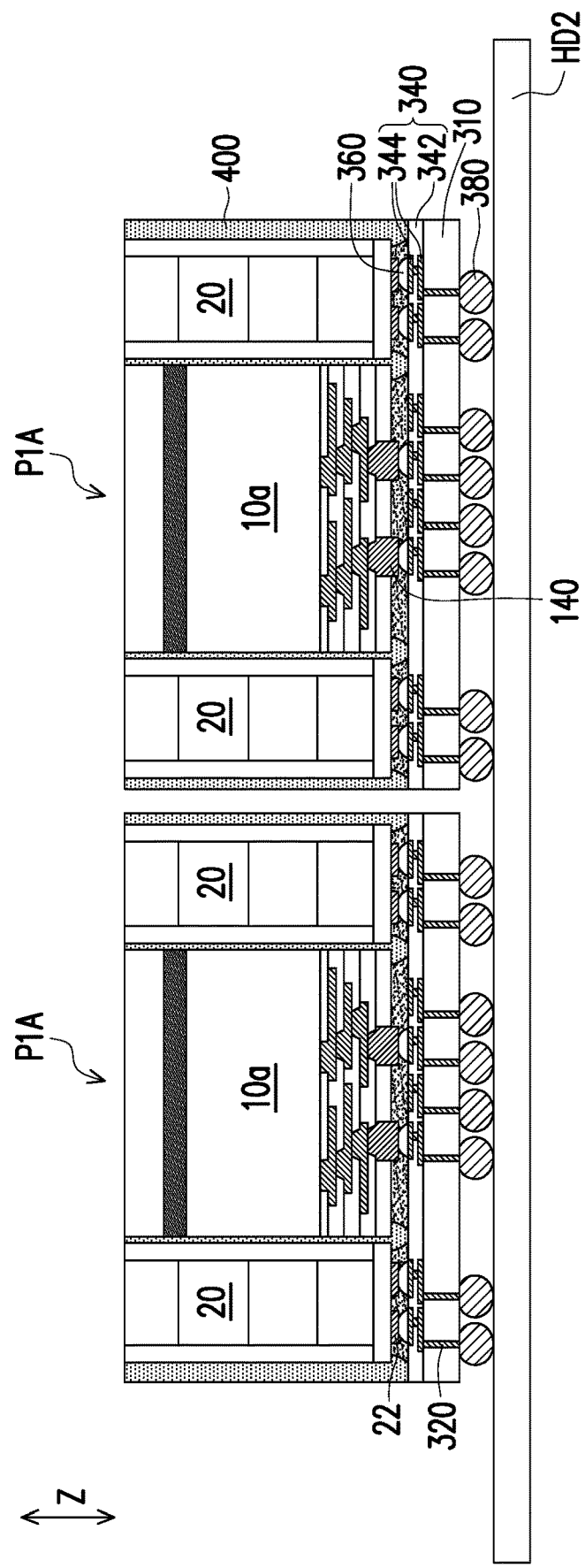

Referring to FIG. 13, in some embodiments, a dicing (or singulation) process is sequentially performed to cut through the whole structure depicted in FIG. 12 into individual and separated package structure P1A, in accordance with step S18 of FIG. 16. In one embodiment, the dicing process is a wafer dicing process including mechanical blade sawing or laser cutting. The disclosure is not limited thereto. Up to this, the package structures P1A are manufactured. In addition, the substrate 310 and the through vias 320 together are considered as an interposer.

Figure 14A:
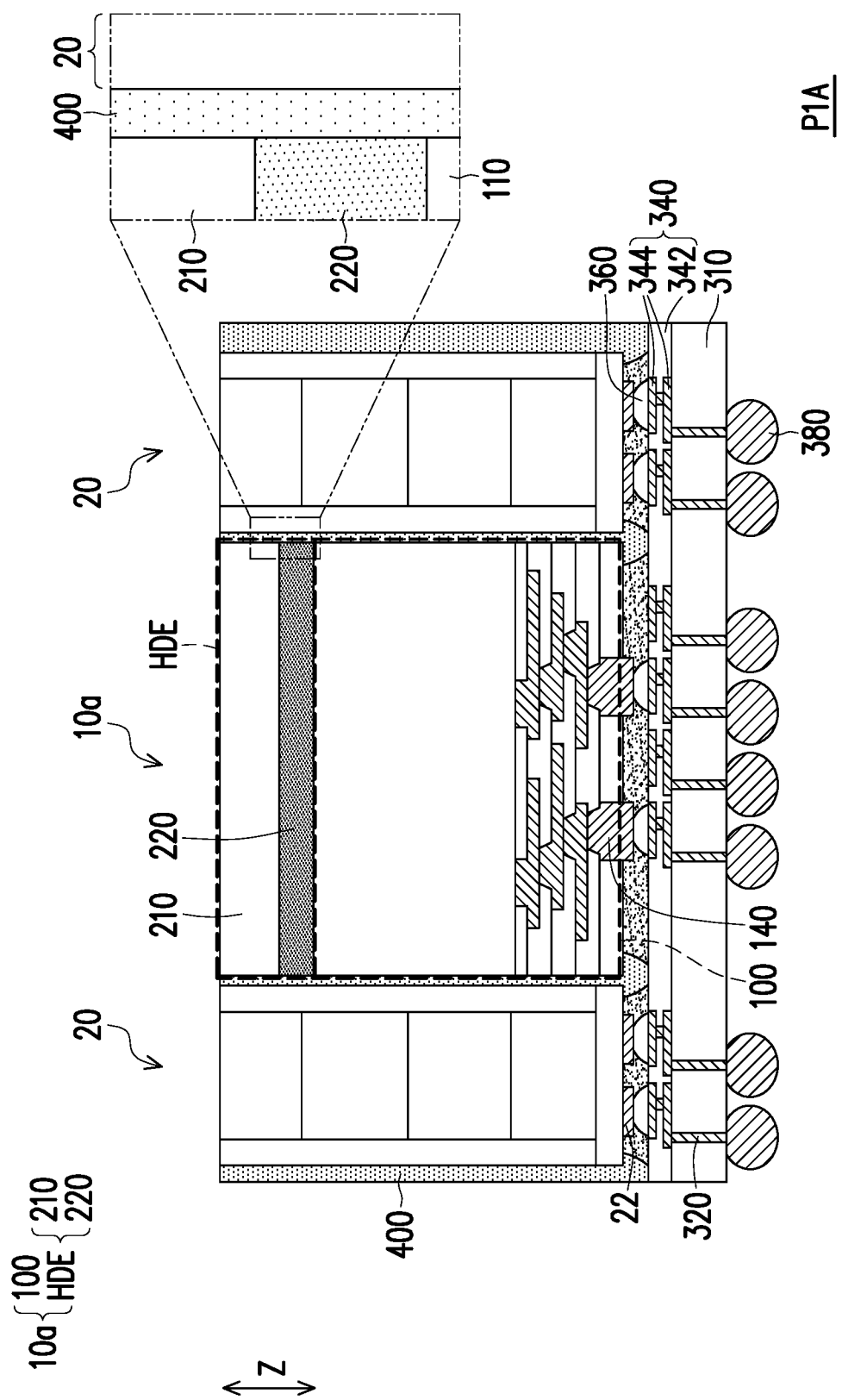
Figure 14B:
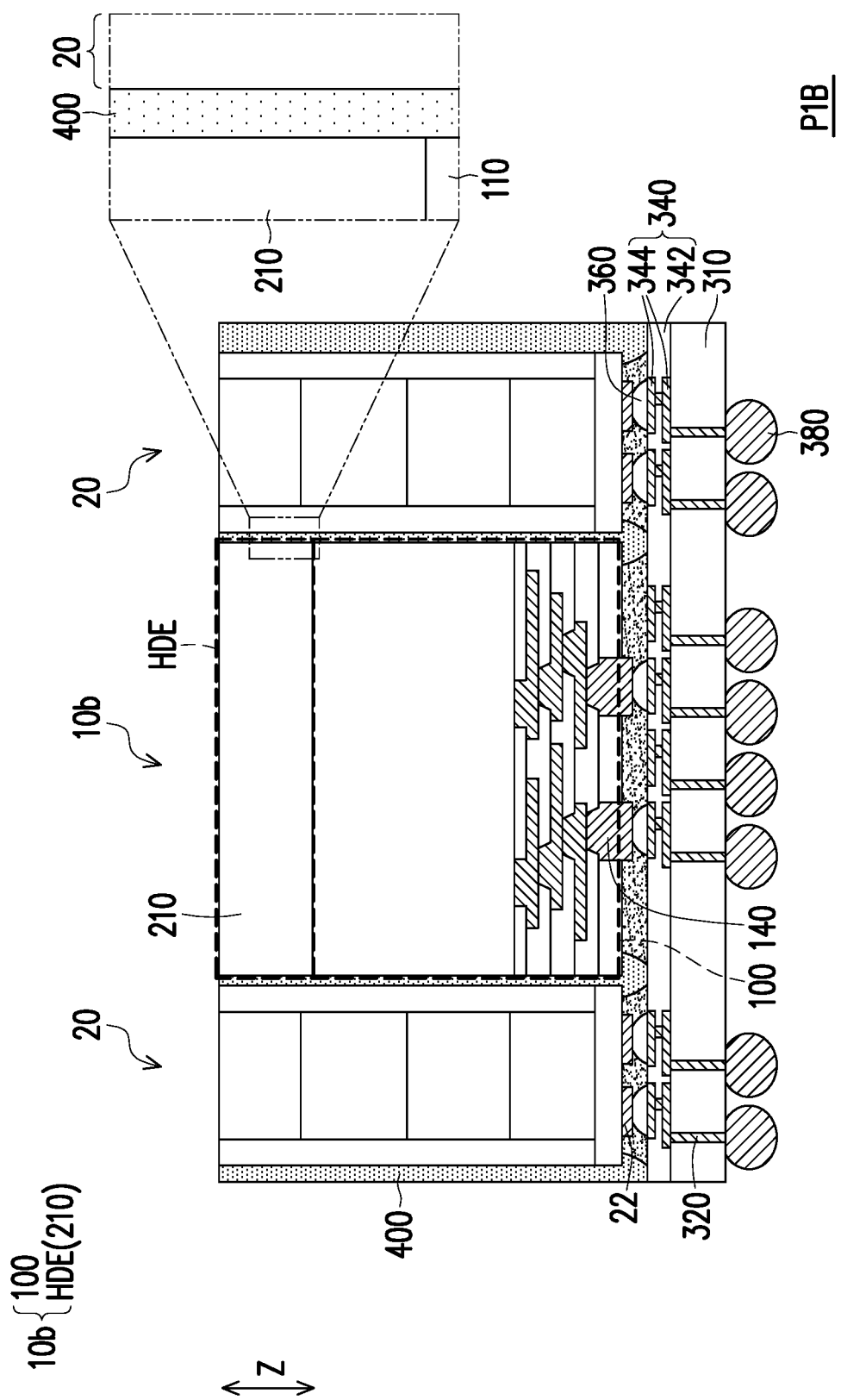
FIG. 14B is a schematic cross-sectional view of a package structure in accordance with some embodiments of the disclosure.

Referring to FIG. 13 and FIG. 14A, in some embodiments, one semiconductor component 10a and two semiconductor components 20 included in the package structure P1A are shown for illustration purpose, however the disclosure is not limited thereto. The number of the semiconductor components 10a and the number of the semiconductor components 20 may independently be one or more than one based on the demand and design layout. As shown in FIG. 13 and FIG. 14A, in each semiconductor component 10a encapsulated in the insulating encapsulation 400, the heat generated from the semiconductor die 100 is able to easily dissipate to the external environment through the heat dissipating element HDE thermally coupled thereto, thereby helping to maintain a lower temperature in the package structure P1A. That is, owing to the heat dissipating element HDE of each semiconductor component 10a included in the package structure P1A, the heat dissipation efficiency of the semiconductor components 10a can be controlled by adjusting the material of the heat dissipating element HDE, thereby ensuring the reliability of the package structure P1A. In other words, due to the presence of the heat dissipating element HDE, overall thermal properties (e.g. heat dissipation, heat resistance) of the package structure P1A can be ensured.

In addition, for the package structure P1A shown in FIG. 14A, due to the manufacturing method of FIG. 16, the sidewall of the heat dissipating element HDE (e.g. a sidewall of the base layer 210 and a sidewall of the adhesive layer 220) is aligned with the sidewall of the semiconductor die 100 underlying thereto. That is, in the semiconductor component 10a shown in FIG. 14A, the sidewall of the heat dissipating element HDE and the sidewall of the semiconductor die 100 are substantially coplanar to each other.

On the other hand, in alternative embodiments, the adhesive layer 220 may be omitted from the heat dissipating element HDE, see a package structure P1B depicted in FIG. 14B. The package structure P1B depicted in FIG. 14B is similar to the package structure P1A depicted in FIG. 14A, the difference is that, the package structure P1B includes a semiconductor component 10b instead of the semiconductor component 10a, where the semiconductor component 10b includes a heat dissipating element having only the base layer 210. That is, in the semiconductor component 10b shown in FIG. 14B, the sidewall of the heat dissipating element HDE ((e.g. the sidewall of the base layer 210) is aligned with and substantially coplanar to the sidewall of the semiconductor die 100 underlying thereto.

Referring to FIG. 15, in some embodiments, the package structure P1A is bonded on a substrate 500 through the conductive connectors 380 to form a (stacked) package structure P2A, in accordance with step S19 of FIG. 16. The substrate 500 may be made of a semiconductor material such as silicon, germanium, diamond, or the like. In some embodiments, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. In some embodiments, the substrate 500 may be a SOI substrate, where the SOI substrate may include a layer of a semiconductor material such as epitaxial silicon, germanium, silicon germanium, SOI, silicon germanium on insulator (SGOI), or combinations thereof. In an alternative embodiment, the substrate 500 may be based on an insulating core, such as a fiberglass reinforced resin core. One example core material is fiberglass resin such as flame retardant class 4 (FR4). Alternatives for the core material include bismaleimide triazine (BT) resin, or alternatively, other printed circuit board (PCB) materials or films. In a further alternative embodiment, the substrate 500 may be a build-up films such as Ajinomoto build-up film (ABF) or other suitable laminates.

In one embodiment, the substrate 500 may include active and/or passive devices (not shown), such as transistors, capacitors, resistors, combinations thereof, or the like which may be used to generate the structural and functional requirements of the design for the semiconductor package. The active and/or passive devices may be formed using any suitable methods. However, the disclosure is not limited thereto; in an alternative embodiment, the substrate 500 may be substantially free of active and/or passive devices.

In some embodiments, the substrate 500 includes metallization layers 530 and vias (not shown) interconnected therebetween and bonding pads 510, 520 connected to the metallization layers 530 and vias. The metallization layers 530 and vias together form a functional circuitry providing routing for the substrate 500. The metallization layers 530 and vias embedded in the substrate 500 may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). The bonding pads 510, 520 are used to provide electrical connection with external component(s) for the substrate 500. In some embodiments, the bonding pads 510, 520 are electrically connected to each other through the metallization layers 530 and vias. As shown in FIG. 15, for example, the conductive connectors 380 of the package structure P1A are connected to the bonding pads 510 of the substrate 500, respectively. As shown in FIG. 15, in some embodiment, through bonding pads 510 and the conductive connectors 380, the package structure P1A is electrically connected to the substrate 500.

In some embodiments, conductive elements 560 may be optionally disposed on a bottom surface of substrate 500, as shown in FIG. 15. Conductive elements 560 may be used to physically and electrically connect the substrate 500 to other devices, packages, connecting components, and the like, in some embodiments. The conductive elements 560 are referred to as conductive terminals of the substrate 500 for providing physical and/or electrical connection to external components, in the disclosure. As shown in FIG. 15, the conductive elements 560 and the package structure P1A are respectively located on two opposite sides of the substrate 500, where some of the conductive elements 560 are electrically connected to the package structure P1A through the bonding pads 510 and the conductive connectors 380.

In some embodiments, one or more surface devices 540, 550 may be optionally connected to the substrate 500. The surface devices 540, 550 may be, for example, used to provide additional functionality or programming to the package structure P2A. In an embodiment, the surface devices 540, 550 may include surface mount devices (SMDs) or an integrated passive devices (IPDs) that comprise passive devices such as resistors, inductors, capacitors, jumpers, combinations of these, or the like that are desired to be connected to and utilized in conjunction with the package structure P2A.

For example, as shown in FIG. 15, the surface devices 540 is placed on the surface of the substrate 500 where the package structure P1A disposed, and the surface devices 550 is placed on the surface of the substrate 500 where the conductive elements 560 disposed. The number of the surface devices 540 and the number of the surface devices 550 are not limited to the embodiment, and may be selected based on the demand and design layout. The disclosure is not limited thereto. In one embodiment, only the surface devices 540 are formed on the substrate 500, where the number of the surface devices 540 may be one or more than one. In an alternative embodiment, only the surface devices 550 are formed on the substrate 500, where the number of the surface devices 550 may be one or more than one. As shown in FIG. 15, the surface devices 540, 550 are electrically connected to the package structure P1A through the bonding pads 510, 520, the metallization layers 530 and vias, and the conductive connectors 380.

In some embodiments, an underfill UF2 is formed on the substrate 500. As shown in FIG. 15, for example, the underfill UF2 fills the gap between the package structure P1A and the substrate 500, and wraps sidewalls of the conductive connectors 380. The material and formation of the underfill UF2 may be the same or similar to the material and formation of underfill UF1 described in FIG. 6, and thus are not repeated herein for simplicity.

Up to this, the package structure P2A is manufactured. In addition, the substrate 500 is considered as a circuit structure (e.g. an organic substrate with circuitry structure embedded therein, such as printed circuit board (PCB)). However, the disclosure is not limited thereto; in alternative embodiments, the package structure P1A included in the package structure P2A depicted in FIG. 15 may be replaced with the package structure P1B depicted in FIG. 14B.

Referring to FIG. 17, in some embodiments, a heat dissipation lid 600 is provided and bonded to the substrate 500 of the package structure P2A to form a package structure P3A. In some embodiments, in the package structure P3A, the heat dissipation lid 600 may provide physical protection to the package structure P1A included in the package structure P2A in addition to the functionality of dissipating heat. The heat dissipation lid 600 may have a high thermal conductivity, for example, between about 200 W/m K to about 400 W/m K or more, and may be formed using a metal, a metal alloy, and the like. The heat dissipation lid 600 is attached to the substrate 500, in some embodiments using a bonding element 620, such as adhesive or the like, so that the package structure P1A is arranged within an inner cavity confined by the heat dissipation lid 600 and the substrate 500. However, the disclosure is not limited thereto; in alternative embodiments, the package structure P1A included in the package structure P3A depicted in FIG. 17 may be replaced with the package structure P1B depicted in FIG. 14B.

In some embodiments, a thermal interface material 610 is applied between the package structure P1A and the heat dissipation lid 600, where the thermal interface material 610 is thermally coupled to the heat dissipating element HDE of the package structure P1A, which further helps to dissipate heat from the package structure P1A to the heat dissipation lid 600, thereby helping to maintain a lower temperature in the package structure P3A. The thermal interface material 610 may comprise any suitable thermally conductive material, for example, a polymer having a good thermal conductivity, which may be between about 3 W/m K to about 10 W/m K or more.

Figure 18:
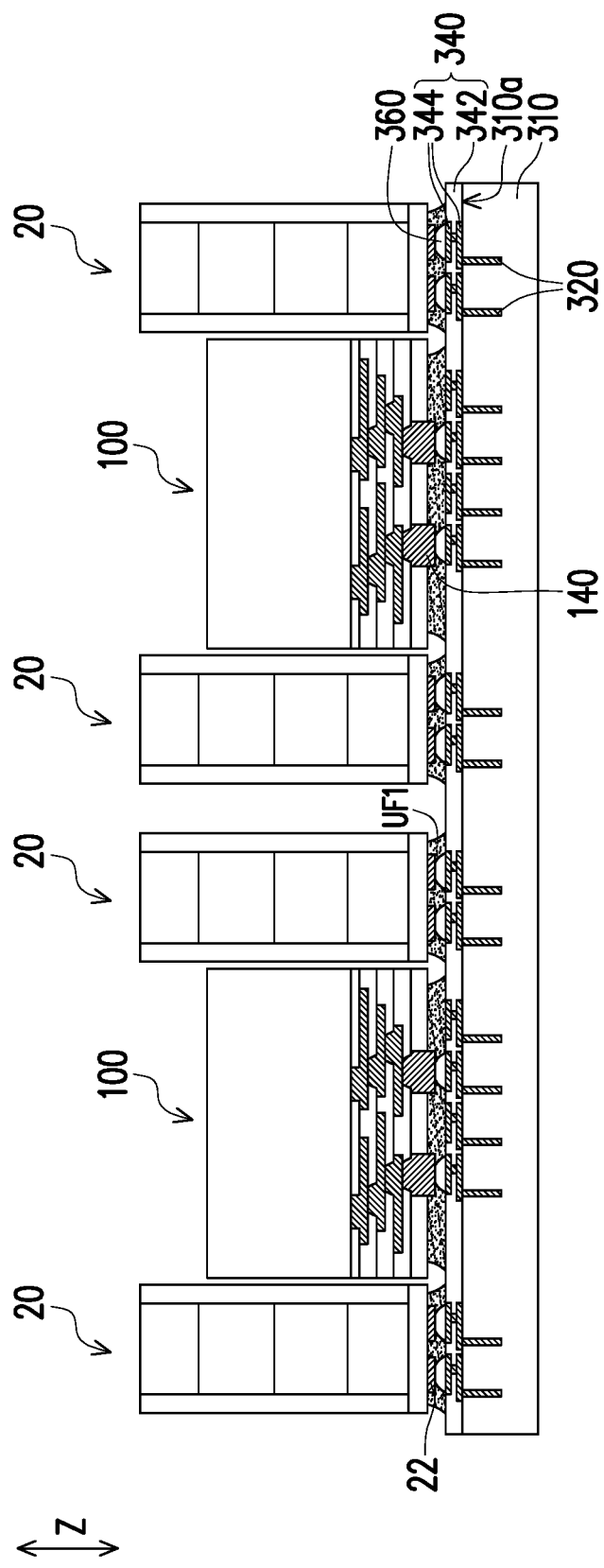
FIG. 18 to FIG. 19 are schematic cross-sectional views of various stages in a manufacturing method of a package structure in accordance with some embodiments of the disclosure.
Figure 19:
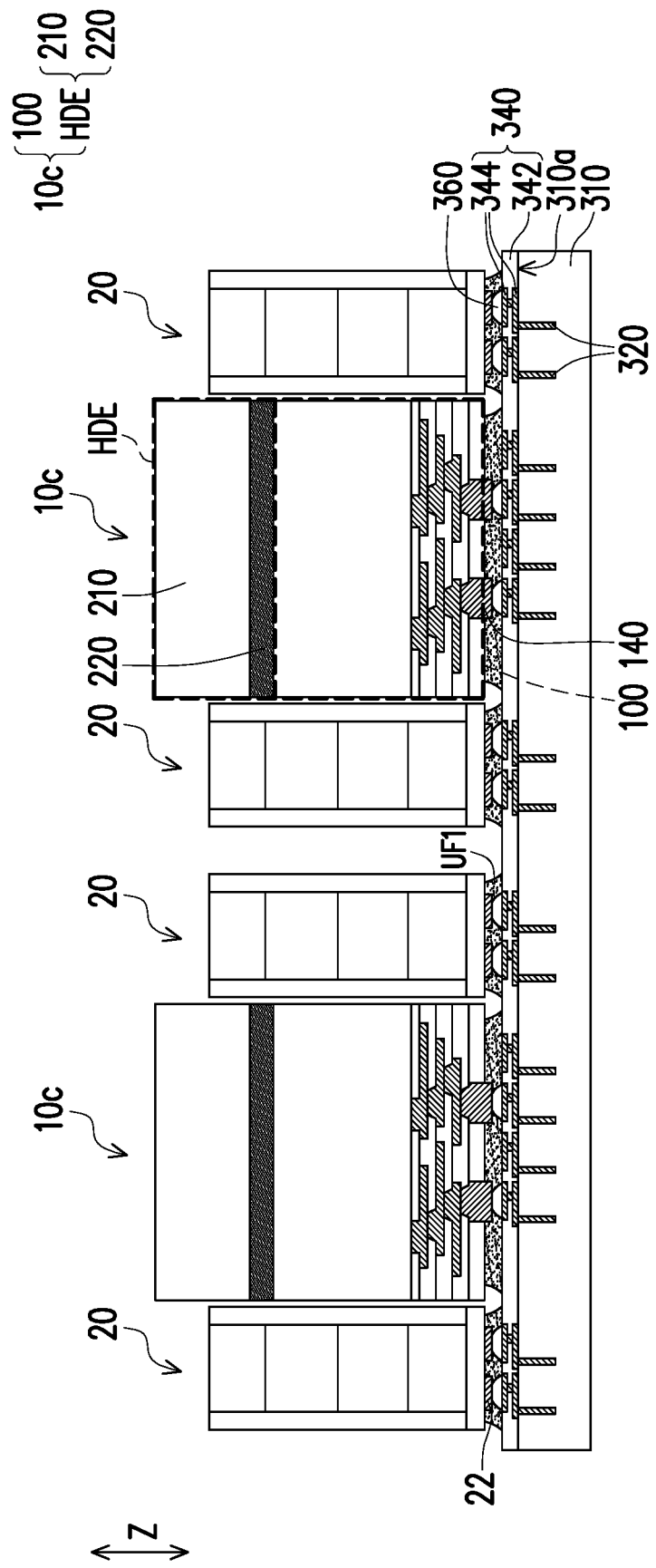
Figure 20:
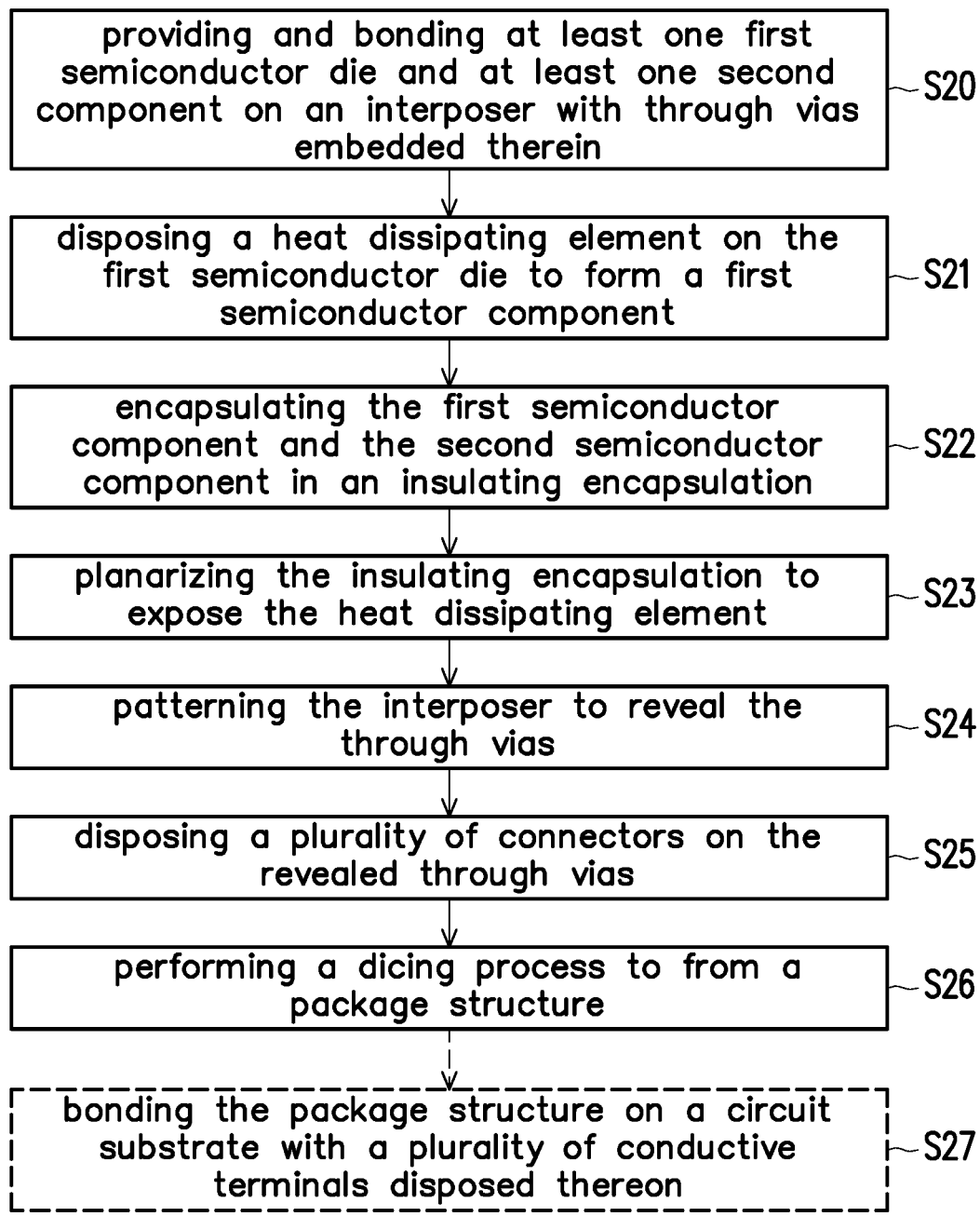
FIG. 20 is a flow chart illustrating a method of manufacturing a package structure in accordance with some embodiments of the disclosure.
Figure 21A:
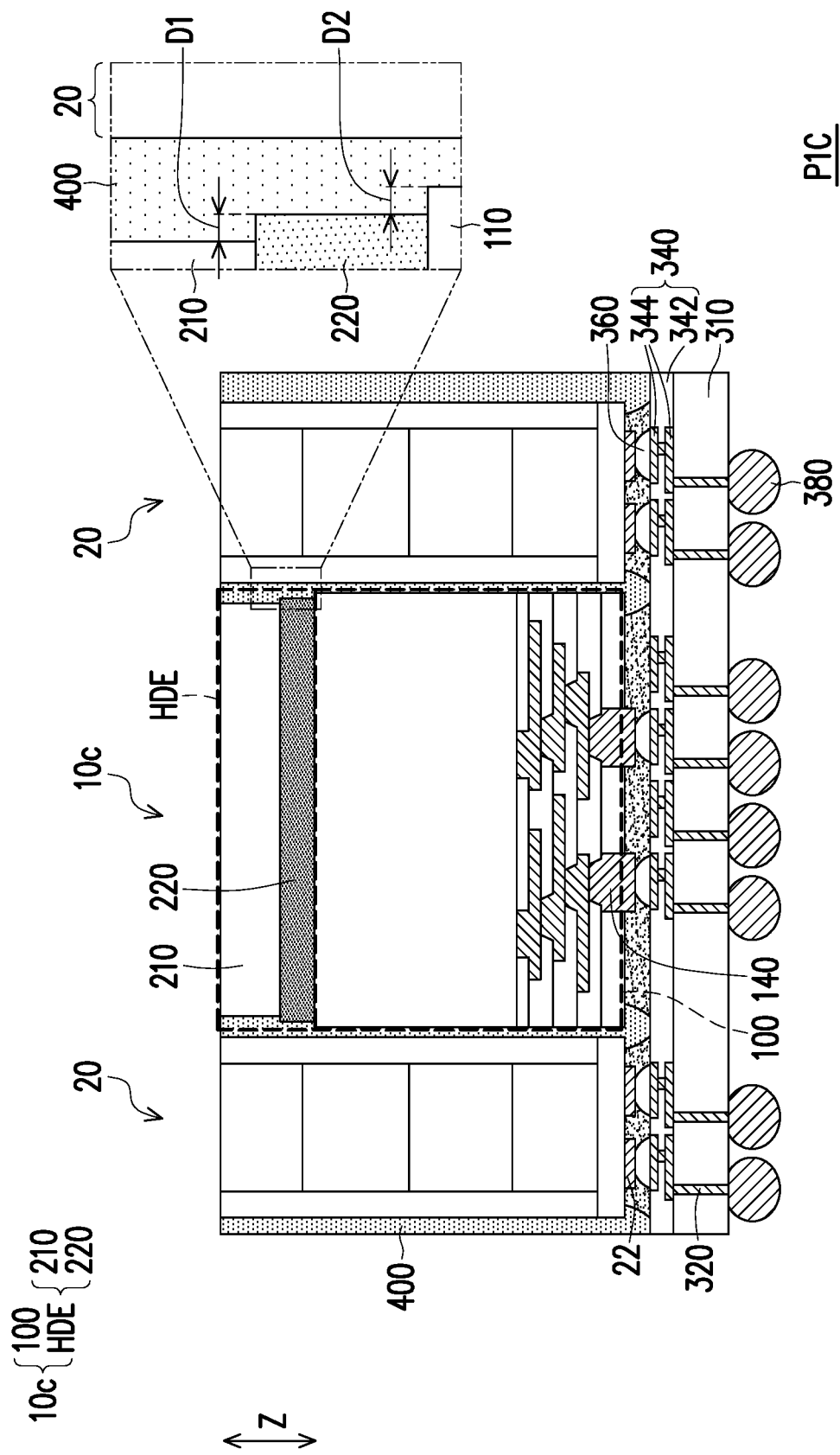
FIG. 21A and FIG. 21B are schematic cross-sectional views of a package structure in accordance with some embodiments of the disclosure.
Figure 21B:
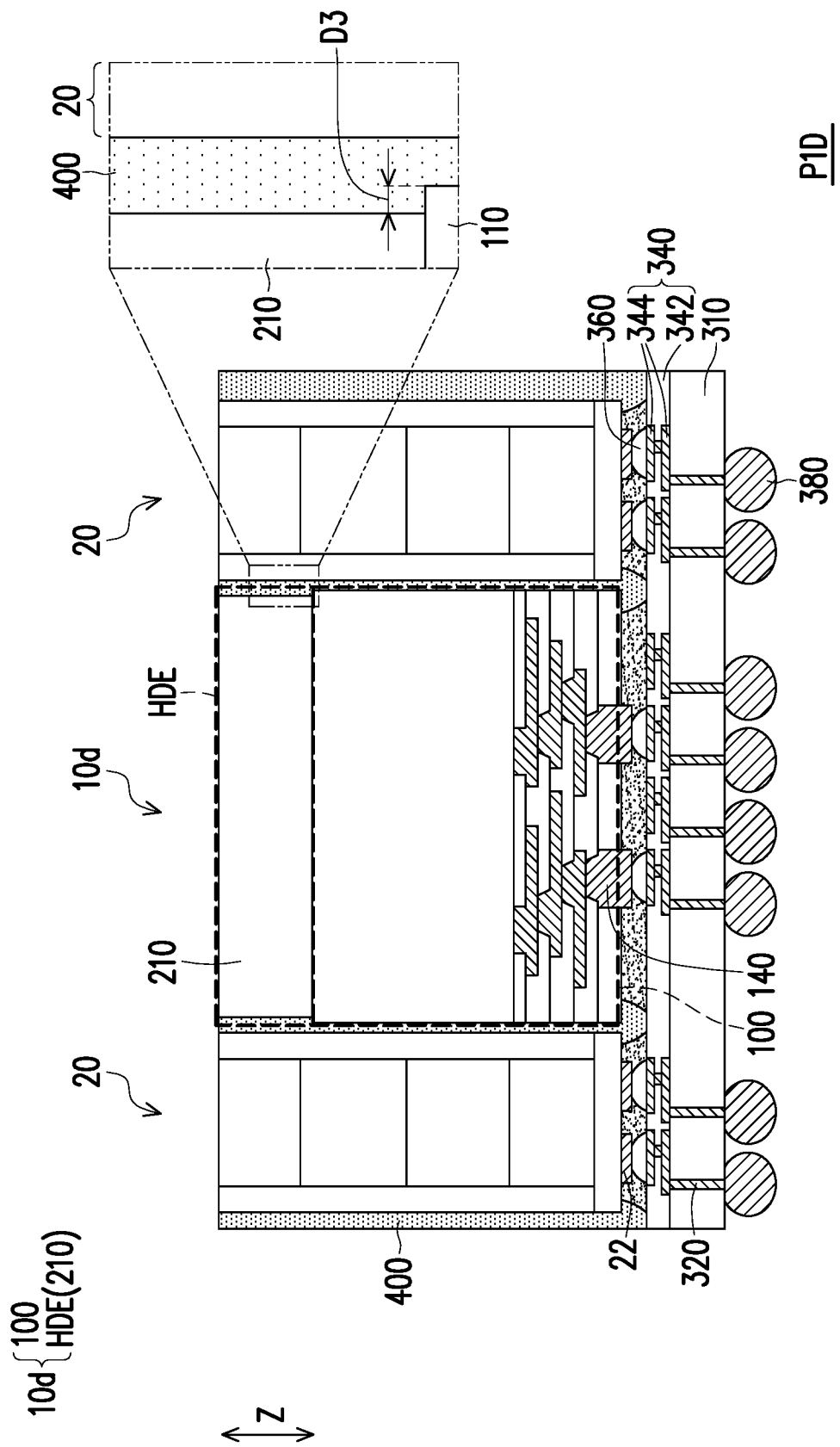
Figure 22:
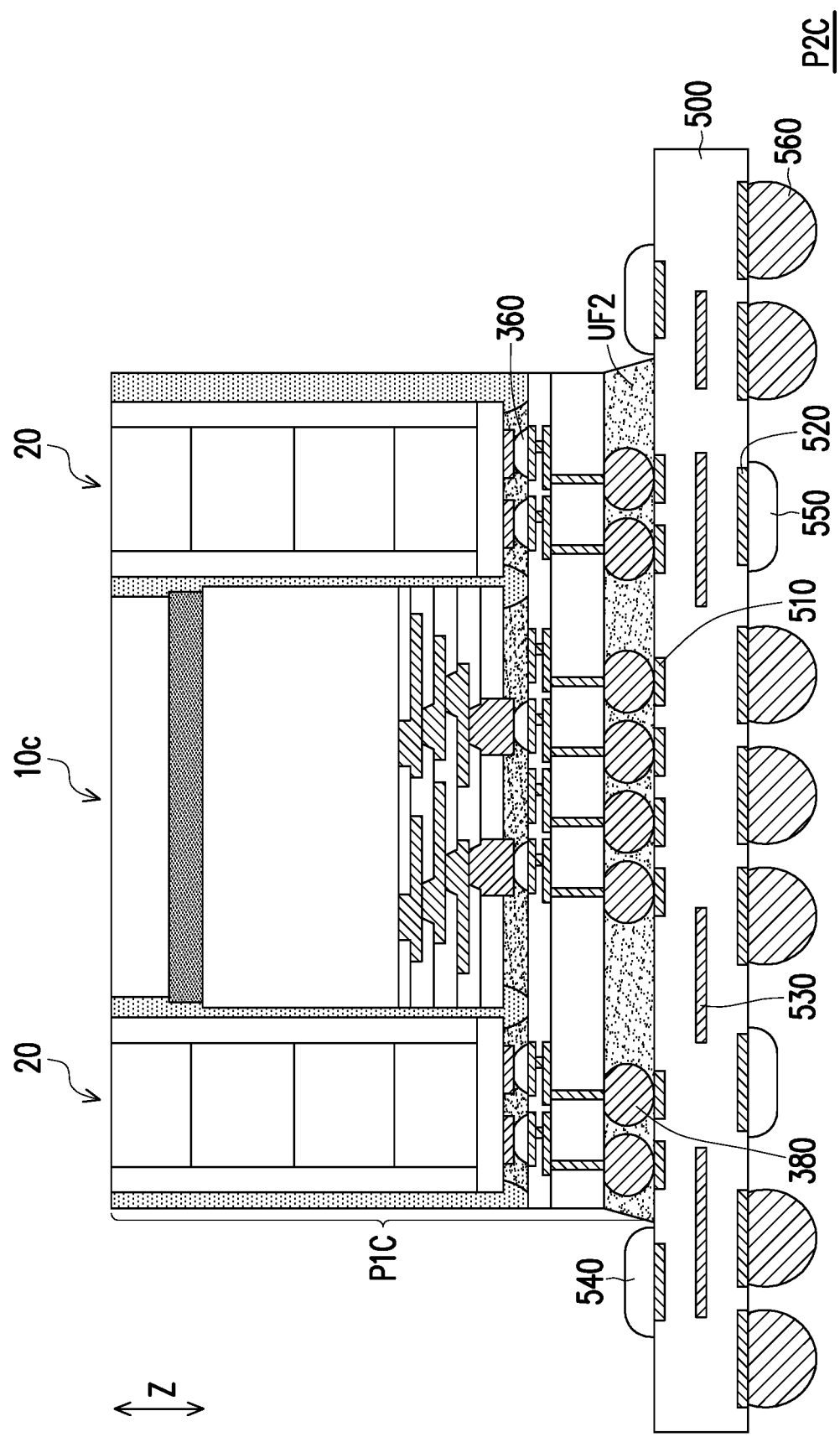
FIG. 22 is a schematic cross-sectional view of a package structure in accordance with some embodiments of the disclosure.
Figure 23:
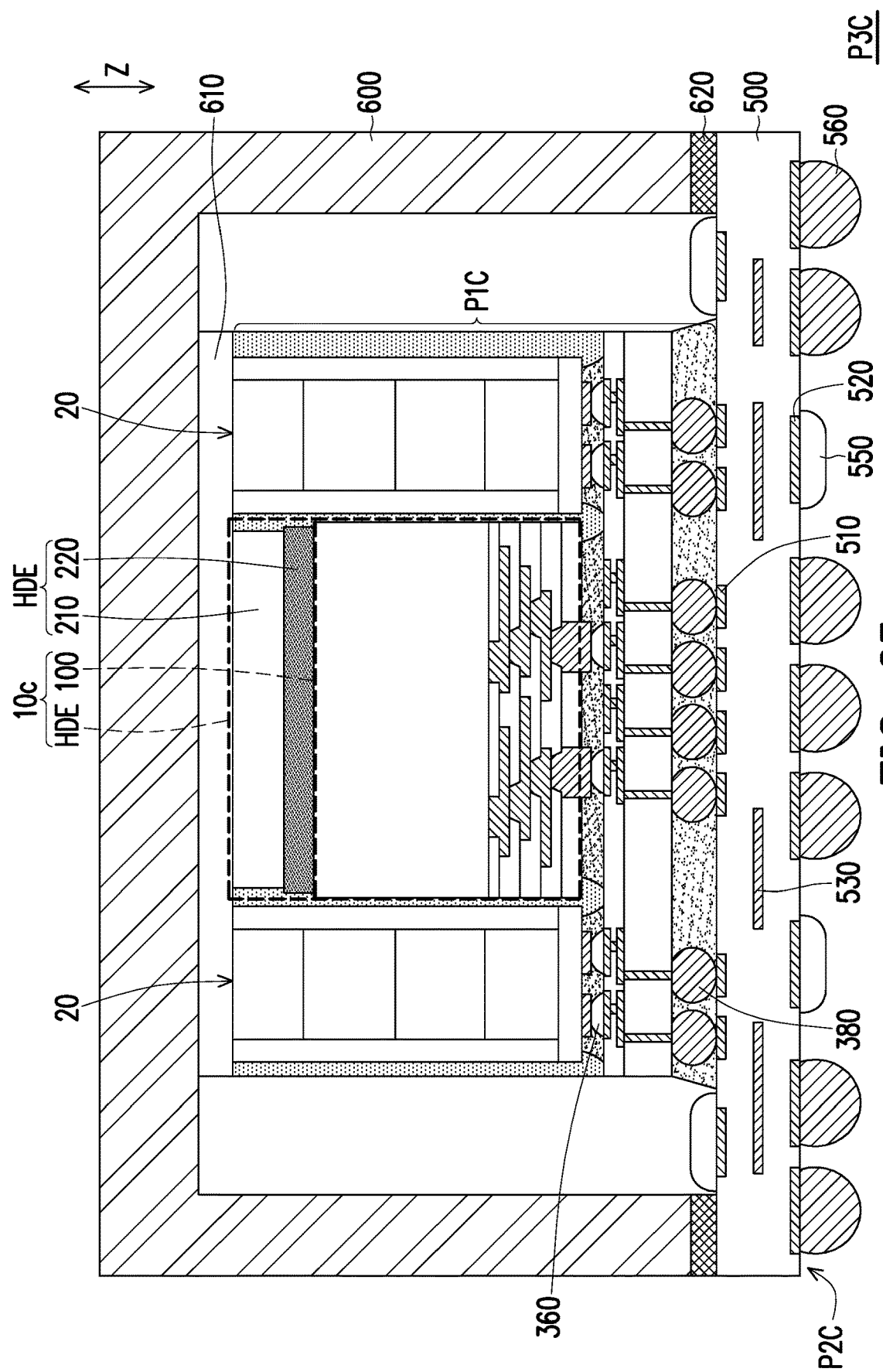
FIG. 23 is a schematic cross-sectional view of a package structure in accordance with some embodiments of the disclosure.

FIG. 18 to FIG. 19 are schematic cross-sectional views of various stages in a manufacturing method of a package structure in accordance with some embodiments of the disclosure. FIG. 20 is a flow chart illustrating a method of manufacturing a package structure in accordance with some embodiments of the disclosure. FIG. 21A and FIG. 21B are schematic cross-sectional views of a package structure in accordance with some embodiments of the disclosure. FIG. 22 is a schematic cross-sectional view of a package structure in accordance with some embodiments of the disclosure. FIG. 23 is a schematic cross-sectional view of a package structure in accordance with some embodiments of the disclosure. In some embodiments, the processes described in FIG. 1 to FIG. 6 can be substituted with the processes described in FIG. 18 to FIG. 19. The elements similar to or substantially the same as the elements described above will use the same reference numbers, and certain details or descriptions of the same elements (e.g. the formations and materials) and the relationship thereof (e.g. the relative positioning configuration and electrical connection) will not be repeated herein.

Referring to FIG. 18, in some embodiments, at least one semiconductor die 100 and at least one semiconductor component 20 are provided and bonded to a substrate 310 (having through vias 320 embedded therein and a redistribution circuit structure 340 and conductive connectors 360 disposed thereon), in accordance with step S20 of FIG. 20. As shown in FIG. 18, for example, the semiconductor dies 100 are bonded to the substrate 310 through physically connecting the conductive vias 140 and the conductive connectors 360, and the semiconductor components 20 are bonded to the substrate 310 through physically connecting the conductive vias 22 and the conductive connectors 360. In some embodiments, an underfill UF1 is applied to fill the gaps between the redistribution circuit structure 340 and the semiconductor dies 100 and between the redistribution circuit structure 340 and the semiconductor components 20, thereby the bonding strengths between the redistribution circuit structure 340 and the semiconductor dies 100 and between the redistribution circuit structure 340 and the semiconductor components 20 are further enhanced. The detail of the semiconductor dies 100 is described in FIG. 1 to FIG. 4 and the details of the semiconductor components 20, the details of the substrate 310, and the underfill UF1 are described in FIG. 6, and thus are not repeated herein. As shown in FIG. 18, for example, as measured along the stacking direction Z, a thickness of the first semiconductor die 100 is less than a thickness of the second semiconductor component 20.

Referring to FIG. 19, in some embodiments, a heat dissipating element HDE is provided and bonded to a respective one of the semiconductor dies 100 to form a semiconductor component 10c, in accordance with step S21 of FIG. 20. As shown in FIG. 19, for example, as measured along the stacking direction Z, a thickness of the semiconductor component 10c is greater than the thickness of the second semiconductor component 20. However, the disclosure is not limited thereto; in an alternative embodiment, the thickness of the semiconductor component 10c is substantially equal to the thickness of the second semiconductor component 20. In some embodiments, for each semiconductor component 10c shown in FIG. 19, the heat dissipating element HDE is connected to the semiconductor die 100 underlying thereto, and the heat dissipating element HDE and the semiconductor die 100 underlying thereto are thermally coupled to each other. As shown in FIG. 19, the heat dissipating element HDE includes a base layer 210 and an adhesive layer 220 disposed thereon, where the adhesive layer 220 are sandwiched between the base layer 210 of the heat dissipating element HDE and the semiconductor die 100. Then, the previously described manufacturing process as described in FIG. 7 to FIG. 13 above, which is also shown in steps S22 to S27 of the manufacturing method in FIG. 20, is performed on the structure depicted in FIG. 19 to obtain the package structure P1C depicted in FIG. 21A. Owing to the heat dissipating element HDE, the heat generated from the semiconductor die 100 is able to easily dissipate to the external environment through the heat dissipating element HDE, thereby helping to maintain a lower temperature in the package structure P1C.

That is, owing to the heat dissipating element HDE of each semiconductor component 10c included in the package structure P1C, the heat dissipation efficiency of the semiconductor components 10c can be controlled by adjusting the material of the heat dissipating element HDE, thereby ensuring the reliability of the package structure P1C. In other words, due to the presence of the heat dissipating element HDE, overall thermal properties (e.g. heat dissipation, heat resistance) of the package structure P1C can be ensured.

In some embodiments, due to the manufacturing method of FIG. 20, for each semiconductor component 10c depicted in FIG. 21A, the sidewall of the heat dissipating element HDE (e.g. the sidewall of the base layer 210 and the sidewall of the adhesive layer 220) may not be aligned with the sidewall of the semiconductor die 100 underlying thereto while the sidewall of the base layer 210 may not also be aligned with the sidewall of the adhesive layer 220 as well. That is, in FIG. 21A, an offset D1 is between the sidewall of the base layer 210 and the sidewall of the adhesive layer 220 within the heat dissipating element HDE, and an offset D2 is between the sidewall of the adhesive layer 220 and the sidewall of the semiconductor die 100 within the semiconductor component 10c, for example. In some embodiments, the offset D1 and the offset D2, independently, are approximately ranging from 5 µm to 5000 µm.

However, the disclosure is not limited thereto. In one embodiment, the sidewall of the heat dissipating element HDE (e.g. the sidewall of the base layer 210 and the sidewall of the adhesive layer 220) may not be aligned with the sidewall of the semiconductor die 100 underlying thereto while the sidewall of the base layer 210 may be aligned with the sidewall of the adhesive layer 220. Or, in another embodiment, the sidewall of the heat dissipating element HDE may be partially aligned with the sidewall of the semiconductor die 100 underlying thereto (e.g. one of the sidewall of the base layer 210 and the sidewall of the adhesive layer 220 may be partially aligned with the sidewall of the semiconductor die 100 underlying thereto) while the sidewall of the base layer 210 may not be aligned with the sidewall of the adhesive layer 220. Or, in an further embodiment, the sidewall of the heat dissipating element HDE (e.g. the sidewall of the base layer 210 and the sidewall of the adhesive layer 220) may be aligned with the sidewall of the semiconductor die 100 underlying thereto while the sidewall of the base layer 210 may be aligned with the sidewall of the adhesive layer 220, which is the same as the semiconductor component 10a.

On the other hand, in alternative embodiments to the package structure P1C, the adhesive layer 220 may be omitted from the heat dissipating element HDE, see a package structure P1D depicted in FIG. 21B. In some embodiments, the package structure P1D includes a semiconductor component 10d instead of the semiconductor component 10c, where the semiconductor component 10d in the package structure P1D includes the heat dissipating element HDE having only the base layer 210. In some embodiments, due to the manufacturing method of FIG. 20, for each semiconductor component 10d depicted in FIG. 21B, the sidewall of the heat dissipating element HDE (e.g. the sidewall of the base layer 210) may not be aligned with the sidewall of the semiconductor die 100 underlying thereto. That is, in FIG. 21B, an offset D3 is between the sidewall of the base layer 210 and the sidewall of the semiconductor die 100 within the semiconductor component 10d, for example. In some embodiments, the offset D3 is approximately ranging from 5 µm to 5000 µm. Or, in one embodiment, the sidewall of the heat dissipating element HDE (e.g. the sidewall of the base layer 210) may be aligned with the sidewall of the semiconductor die 100 underlying thereto, which is the same as the semiconductor component 10b.

In addition, the previously described manufacturing process as described in FIG. 15 above can be performed on the structure depicted in FIG. 21A to obtain the (stacked) package structure P2C depicted in FIG. 22, and the previously described manufacturing process as described in FIG. 17 above can be performed on the structure depicted in FIG. 22 to obtain the (stacked) package structure P3C depicted in FIG. 23. However, the disclosure is not limited thereto; in alternative embodiments, the package structure P1C included in the package structure P2C depicted in FIG. 22 or included in the package structure P3C depicted in FIG. 23 may be replaced with the package structure P1D depicted in FIG. 21B.

Figure 34:
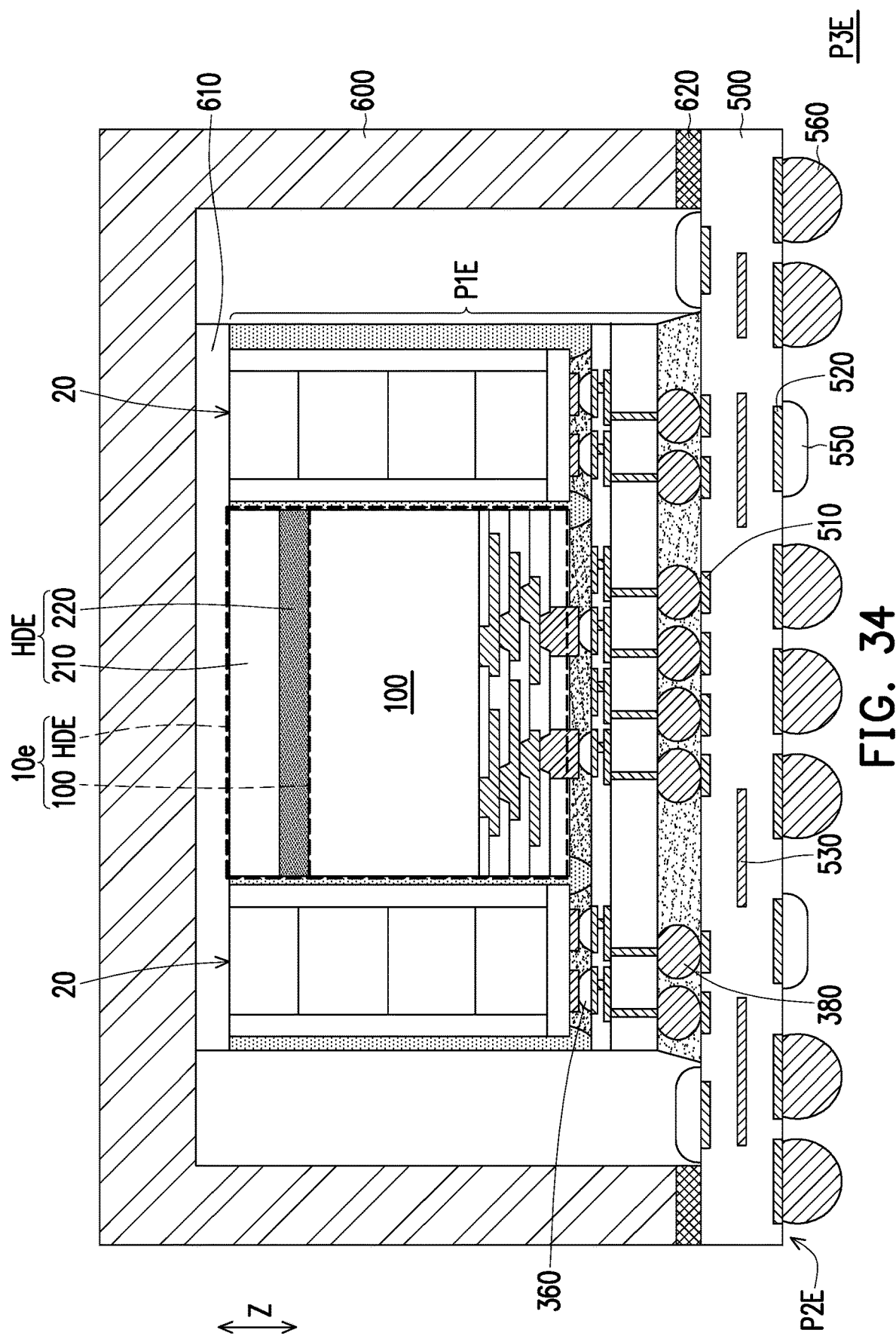
FIG. 34 is a schematic cross-sectional view of a package structure in accordance with some embodiments of the disclosure.
Figure 35:
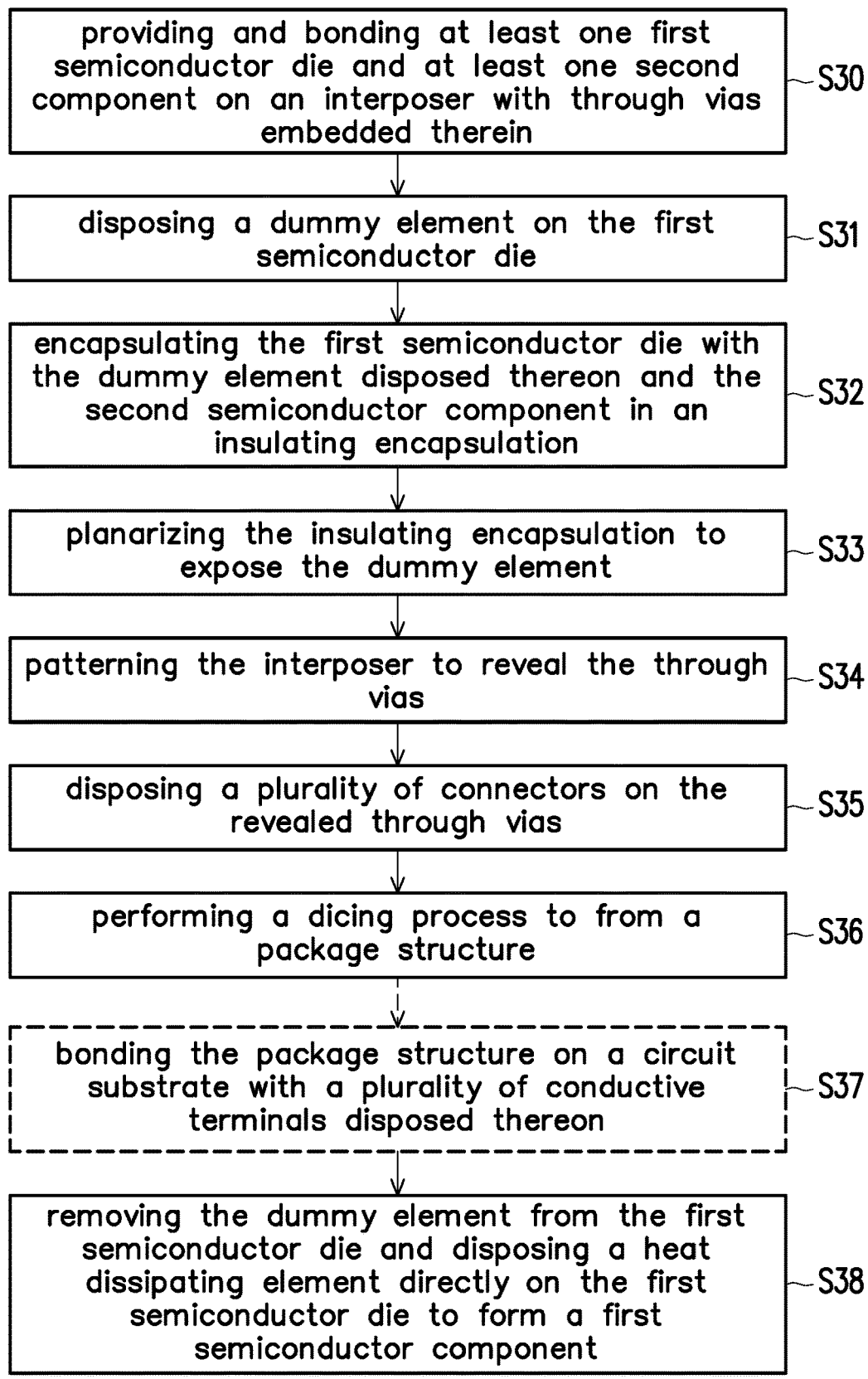
FIG. 35 is a flow chart illustrating a method of manufacturing a package structure in accordance with some embodiments of the disclosure.

FIG. 24 to FIG. 33A are schematic cross-sectional views of various stages in a manufacturing method of a package structure in accordance with some embodiments of the disclosure. FIG. 33B is a schematic cross-sectional view of a package structure in accordance with some embodiments of the disclosure. FIG. 34 is a schematic cross-sectional view of a package structure in accordance with some embodiments of the disclosure. FIG. 35 is a flow chart illustrating a method of manufacturing a package structure in accordance with some embodiments of the disclosure. The elements similar to or substantially the same as the elements described above will use the same reference numbers, and certain details or descriptions of the same elements (e.g. the formations and materials) and the relationship thereof (e.g. the relative positioning configuration and electrical connection) will not be repeated herein.

Figure 24:
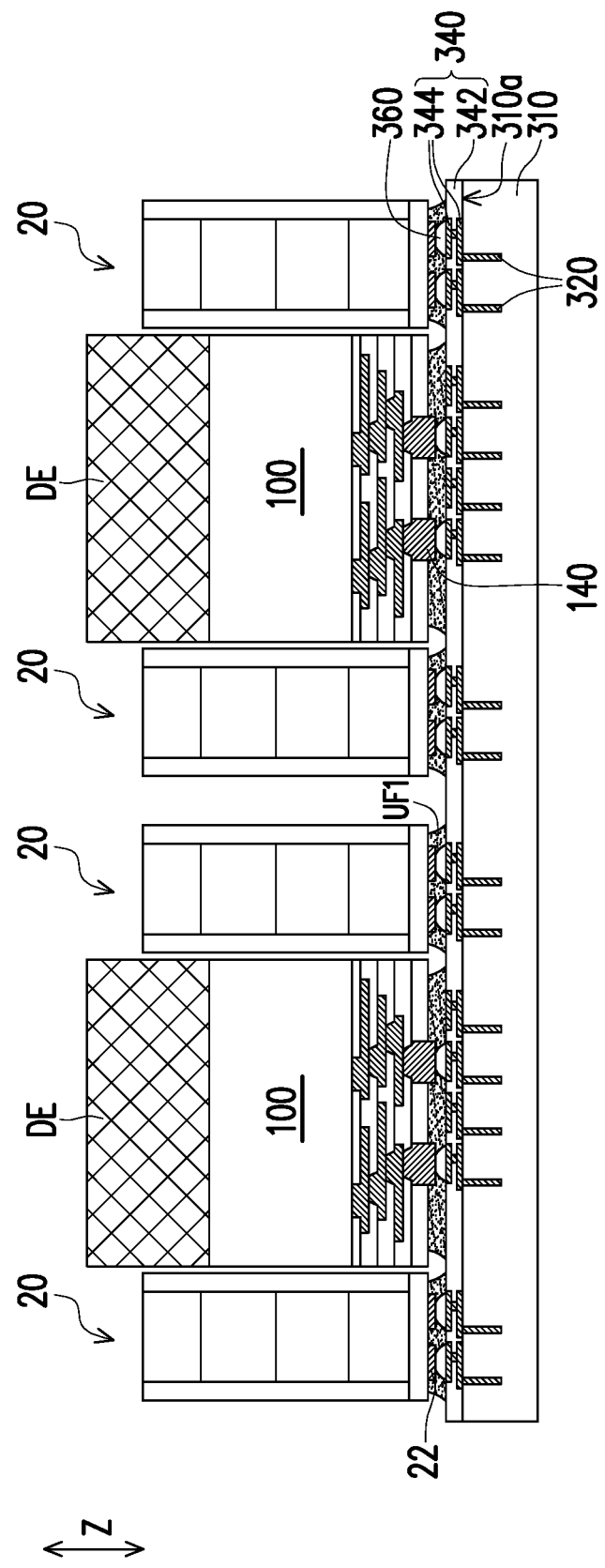

Referring to FIG. 24, in some embodiments, a dummy element DE is sequentially formed on each of the semiconductor dies 100 (in accordance with step S31 of FIG. 35), following the process as described in FIG. 18 (in accordance with step S30 of FIG. 35). The dummy element DE may include a removable layer made of glass, polymer, or compound, and may be formed on the semiconductor dies 100 via adhesion or any other suitable technology. The disclosure is not limited thereto. As shown in FIG. 24, for example, as measured along the stacking direction Z, a thickness of each semiconductor die with a respective one dummy element DE is greater than a thickness of the second semiconductor component 20. However, the disclosure is not limited thereto; in an alternative embodiment, the thickness of each semiconductor die with the respective one dummy element DE is substantially equal to the thickness of the second semiconductor component 20.

Figure 25:
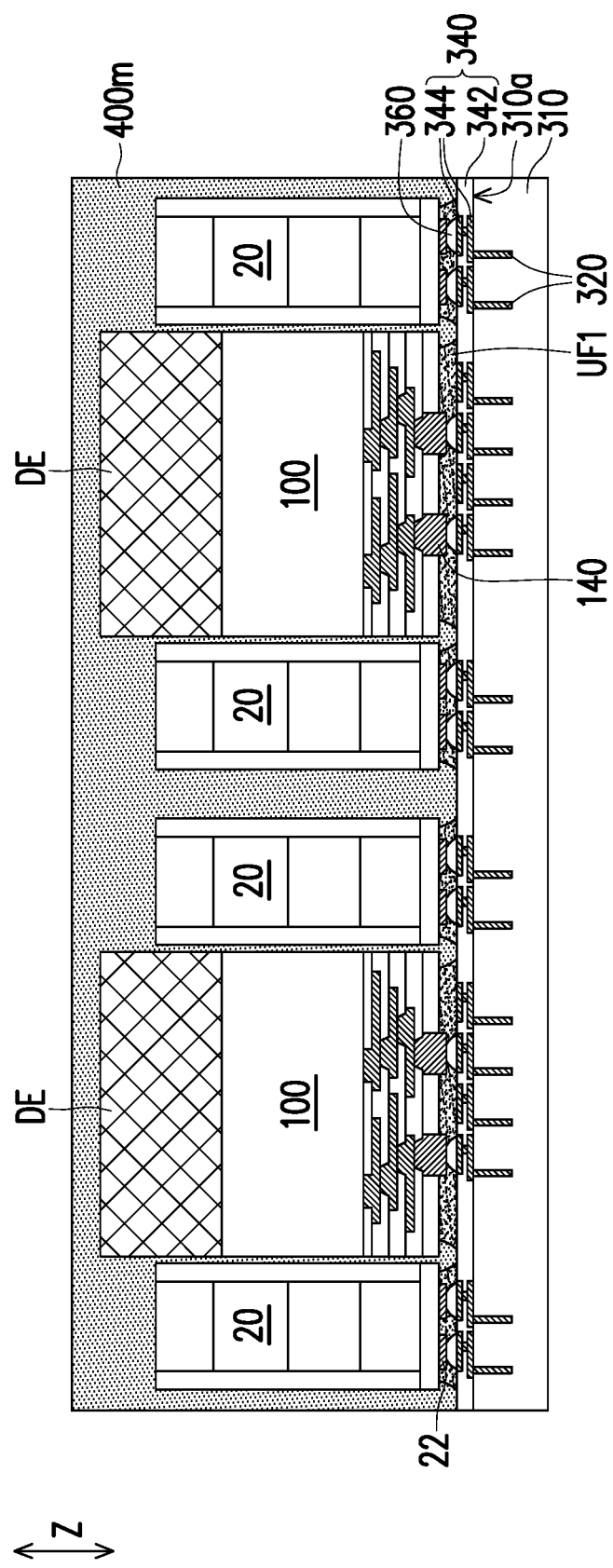

Referring to FIG. 25, in some embodiments, an insulating encapsulation 400m is formed over the substrate 310, in accordance with step S32 of FIG. 35. The formation and material of the insulating encapsulation 400m have been described in the process of FIG. 7, and thus are not repeated herein. As shown in FIG. 25, for example, the semiconductor dies 100 with the dummy elements DE disposed thereon, the semiconductor components 20, and the underfill UF1 are surrounded and covered by the insulating encapsulation 400m. That is, the semiconductor dies 100 with the dummy elements DE disposed thereon, the semiconductor components 20, and the underfill UF1 are embedded in the insulating encapsulation 400m. In other words, the semiconductor dies 100 with the dummy elements DE disposed thereon, the semiconductor components 20, and the underfill UF1 are not accessibly revealed by and embedded in the insulating encapsulation 400m.

Figure 26:
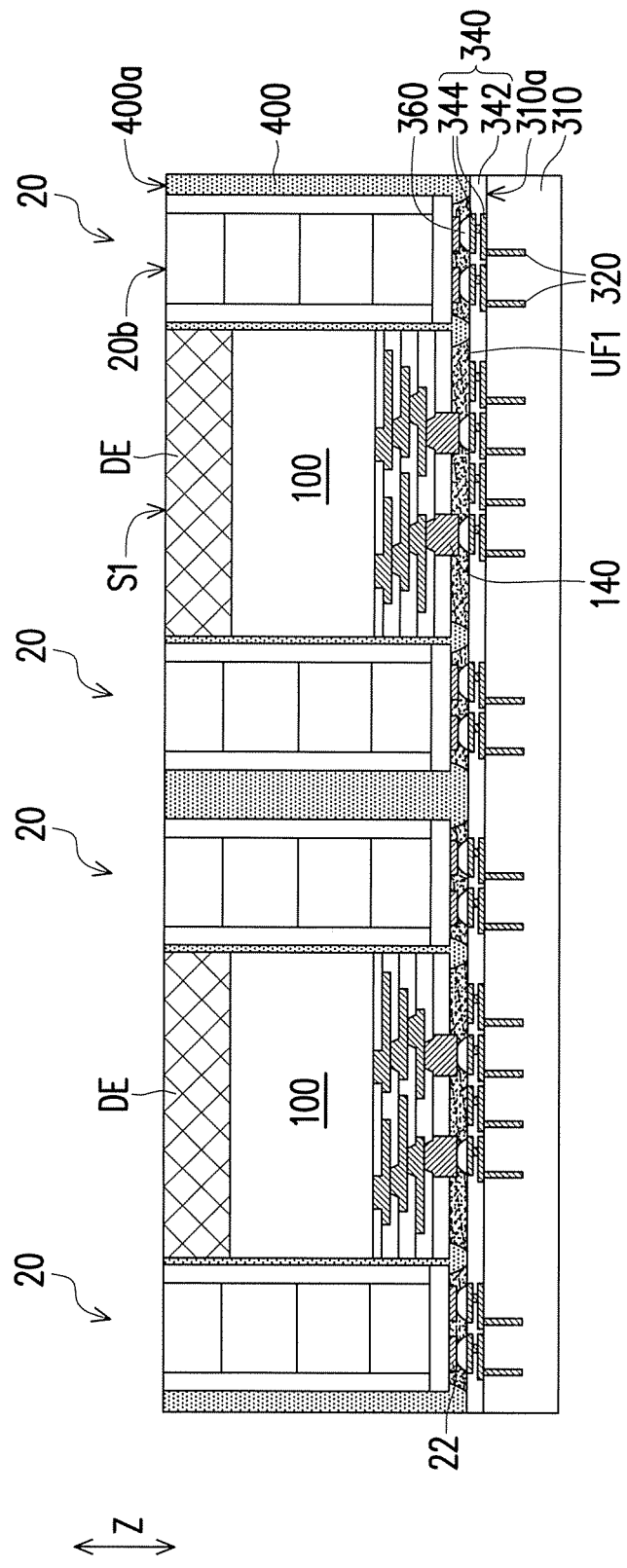

Referring to FIG. 25 and FIG. 26, in some embodiments, the insulating encapsulation 400m is planarized until bottom surfaces S1 of the dummy elements DE disposed on the semiconductor dies 100 and bottom surfaces 20b of the semiconductor components 20 are exposed, in accordance with step S33 of FIG. 35. After the insulating encapsulation 400m is planarized, a (planarized) insulating encapsulation 400 is formed, and the bottom surfaces S1 of the dummy elements DE and the bottom surfaces 20b of the semiconductor components 20 are exposed by a surface 400a of the insulating encapsulation 400. The formation of the insulating encapsulation 400 has been described in the process of FIG. 8, and thus is not repeated herein.

Figure 27:
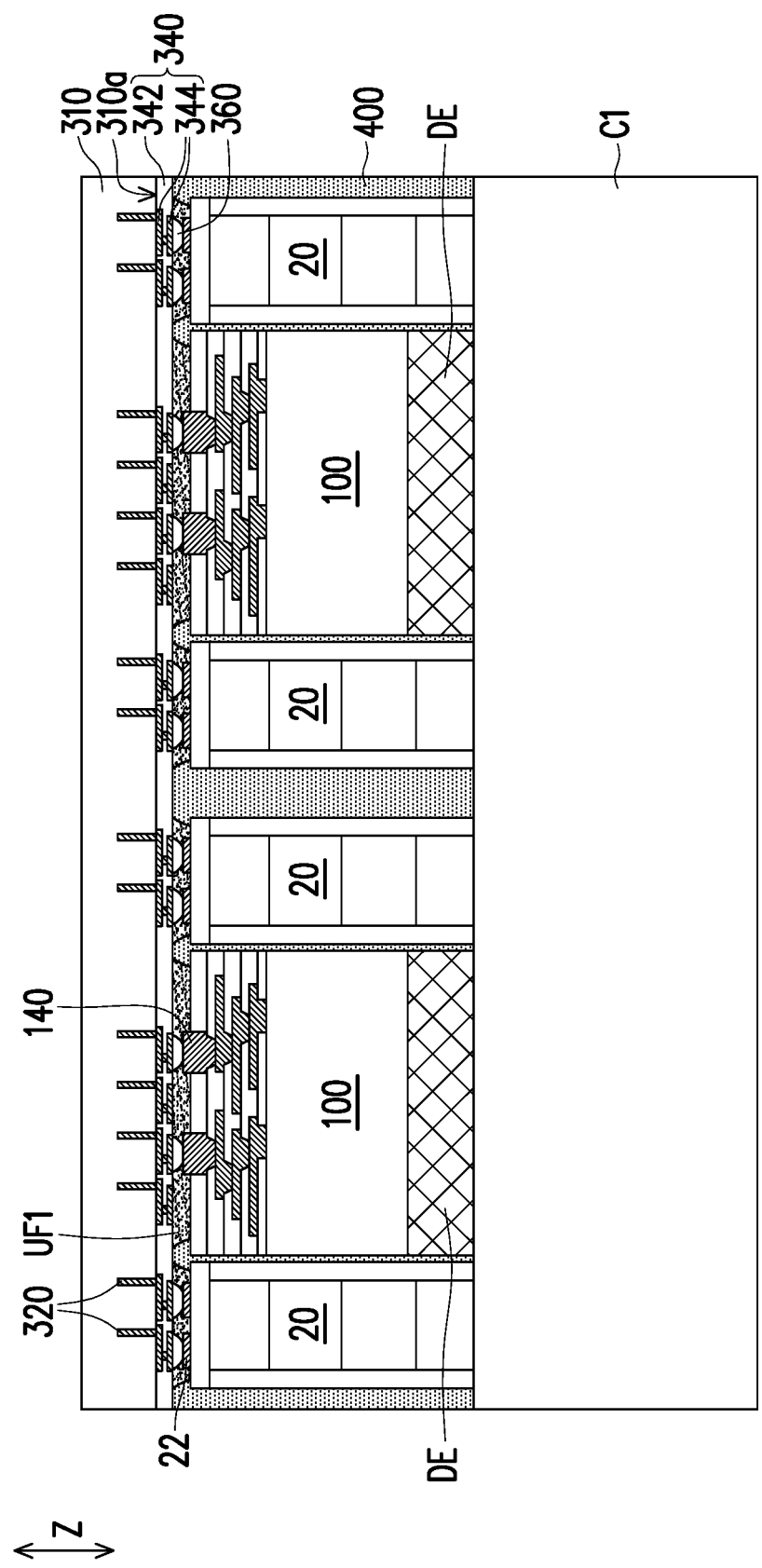

Referring to FIG. 27, in some embodiments, after the insulating encapsulation 400 is formed, the structure depicted in FIG. 26 are flipped (turned upside down along the stacking direction Z), and the insulating encapsulation 400 is placed on a carrier C1. The material of the carrier C1 has been described in the process of FIG. 9, and thus is not repeated herein.

Figure 28:
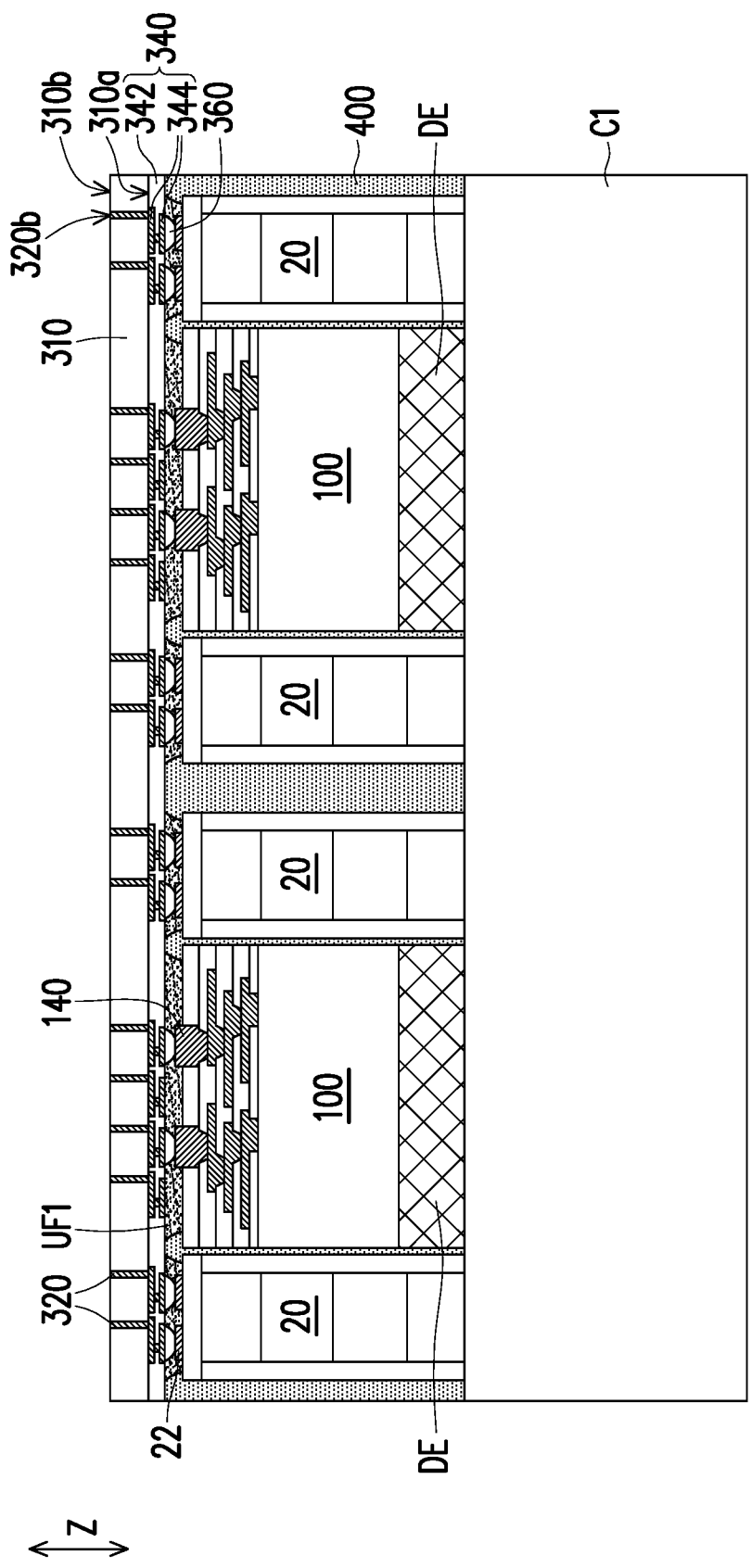

Referring to FIG. 28, in some embodiments, the substrate 310 is then planarized until bottom surfaces 320b of the through vias 320 embedded in the substrate 310 is exposed, in accordance with step S34 of FIG. 35. The detail of the patterning process has been described in the process of FIG. 10, and thus is not repeated herein. As shown in FIG. 28, the bottom surfaces 320b of the through vias 320 are substantially leveled with and coplanar to the surface 310b of the substrate 310. That is, the bottom surfaces 320b of the through vias 320 are accessibly exposed by the substrate 310.

Figure 29:
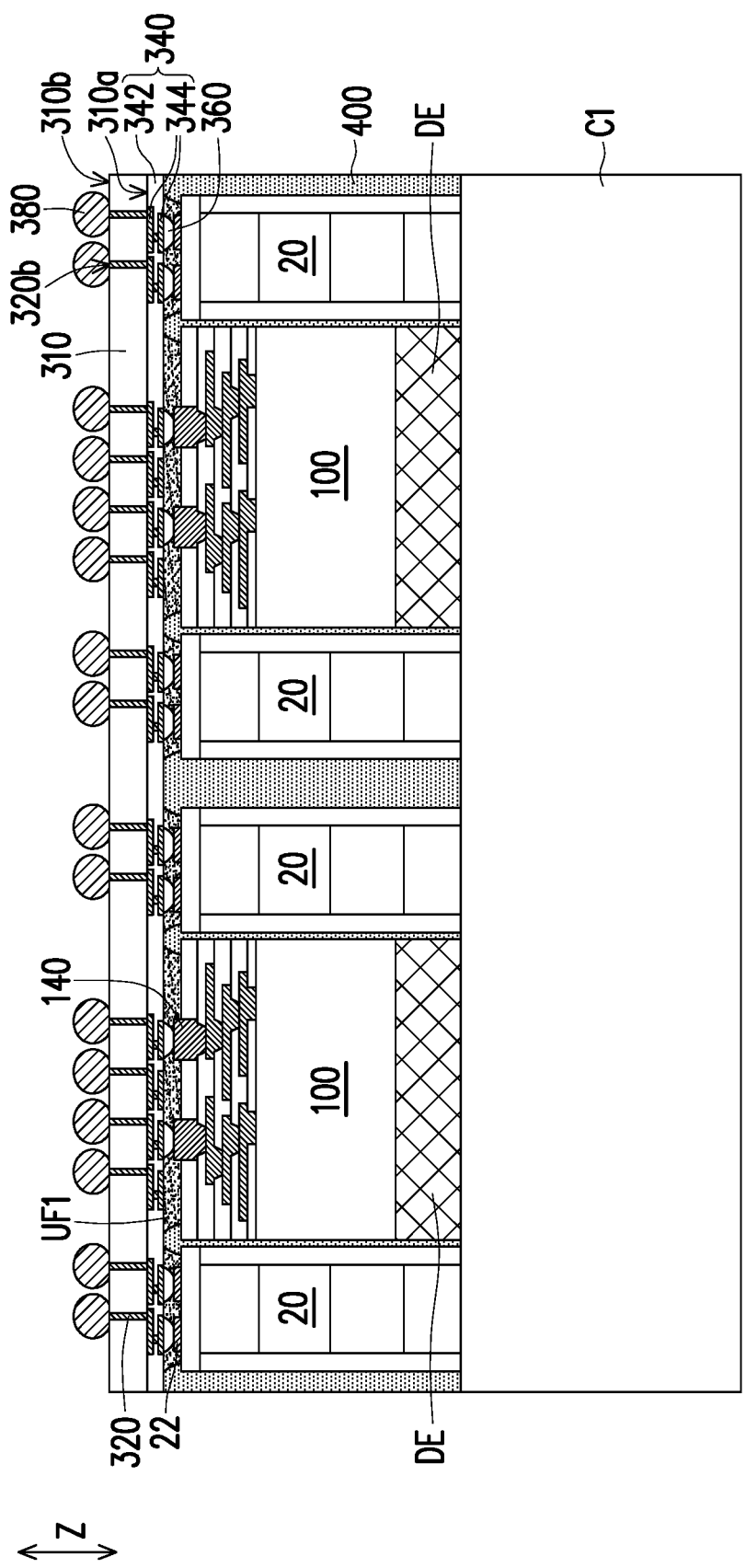

Referring to FIG. 29, in some embodiments, a plurality of conductive connectors 380 are formed on the substrate 310, where the conductive connectors 380 are connected to the through vias 320, in accordance with step S35 of FIG. 35. The formation and material of the conductive connectors 380 have been described in the process of FIG. 29, and thus are not repeated herein. In some embodiments, through the through vias 320, the redistribution circuit structure 340 and the conductive connectors 360, some of the conductive connectors 380 are electrically connected to the semiconductor dies 100. In some embodiments, through the through vias 320, the redistribution circuit structure 340 and the conductive connectors 360, some of the conductive connectors 380 are electrically connected to the semiconductor components 20. In an alternative embodiment, some of the conductive connectors 380 may further be electrically connected to the active and passive devices embedded in or formed on the surface 310a of the substrate 310.

Figure 30:
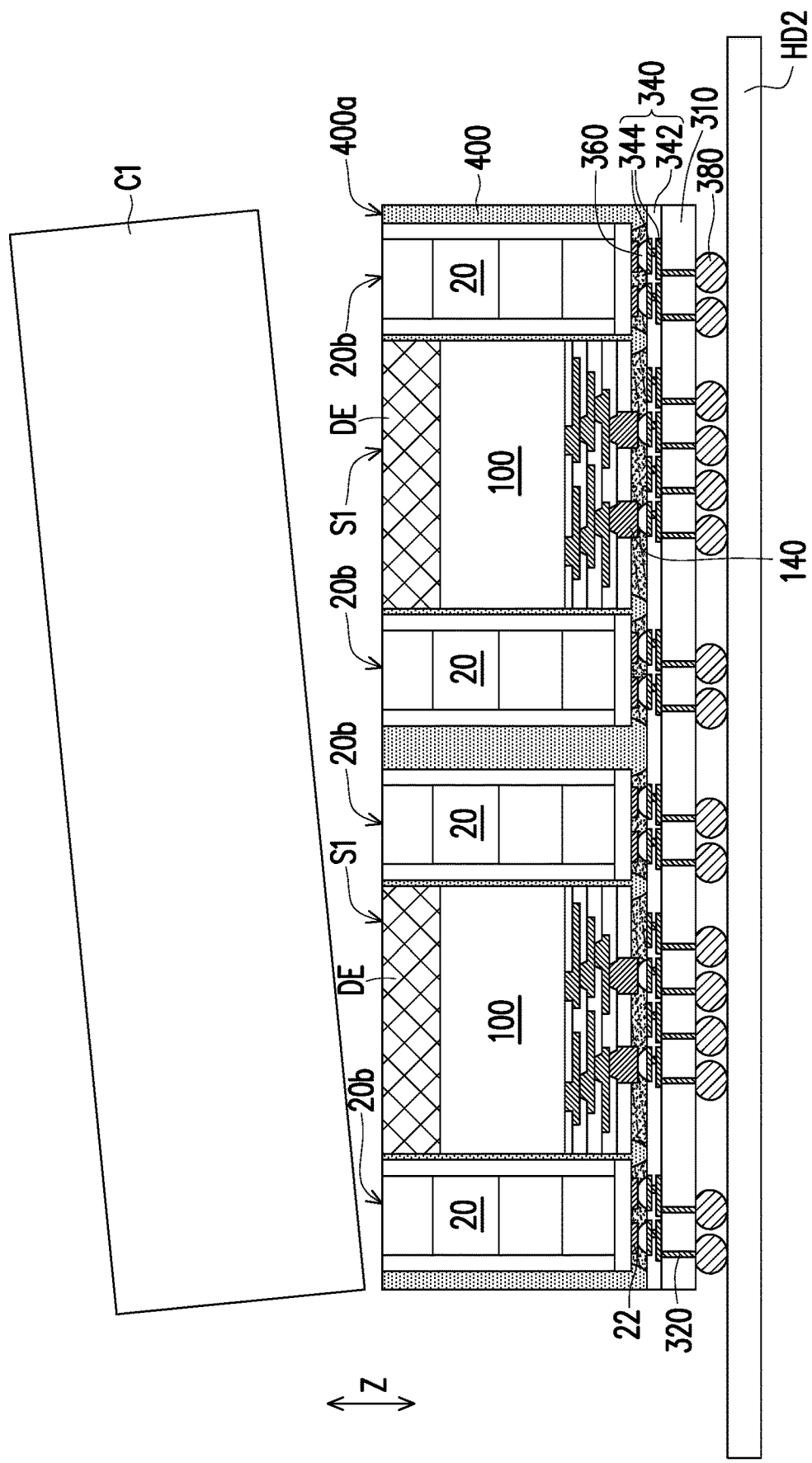

Referring to FIG. 30, in some embodiments, the whole structure depicted in FIG. 29 along with the carrier C1 is flipped (turned upside down) and placed onto a holding device HD2, and then the carrier C1 is debonded from the insulating encapsulation 400, the dummy elements DE, and the semiconductor components 20. In some embodiments, the carrier C1 is detached from the insulating encapsulation 400, the dummy elements DE and the semiconductor components 20 through a debonding process, where the carrier C1 is removed, and the insulating encapsulation 400, the dummy elements DE and the semiconductor components 20 are exposed. As shown in FIG. 30, the surface 400a of the insulating encapsulation 400, the bottom surfaces S1 of the dummy elements DE, and the bottom surfaces 20b of the semiconductor components 20 are exposed. The detail of the debonding process and the material of the holding device HD2 have been described in the process of FIG. 12, and thus are not repeated herein.

Figure 31:
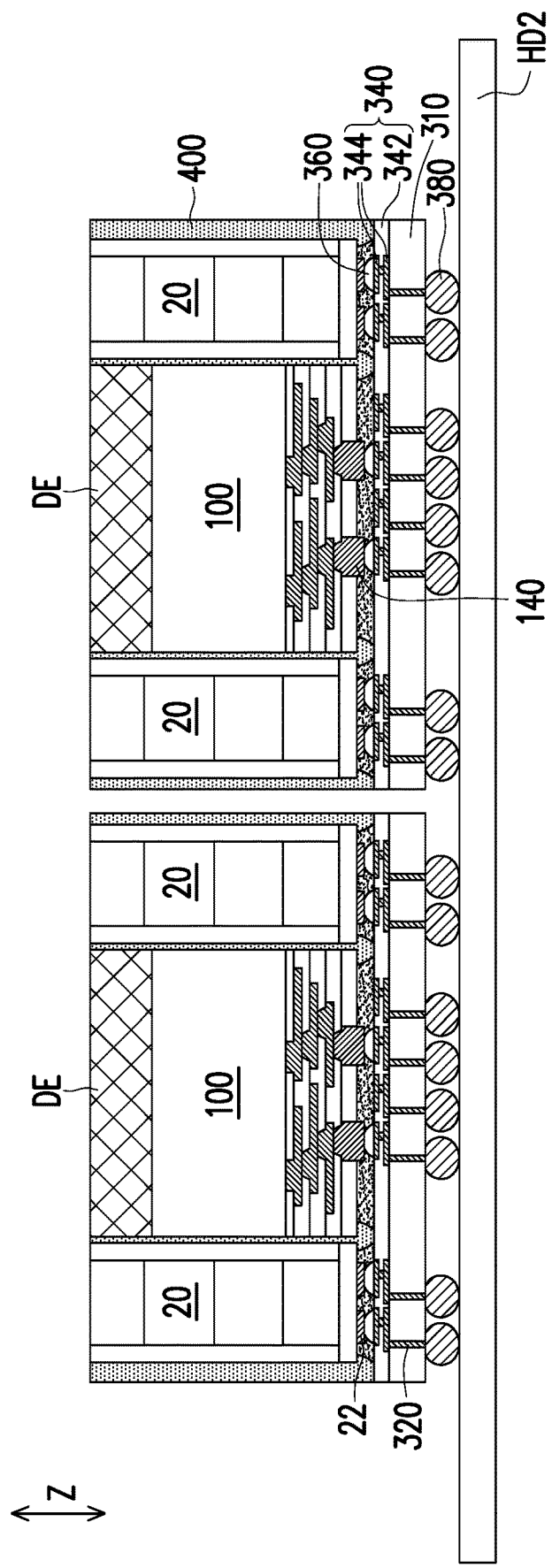

Referring to FIG. 31, in some embodiments, a dicing (or singulation) process is sequentially performed to cut through the whole structure depicted in FIG. 30 into individual and separated structures with the dummy elements DE disposed thereon, in accordance with step S36 of FIG. 35. In one embodiment, the dicing process is a wafer dicing process including mechanical blade sawing or laser cutting. The disclosure is not limited thereto. In addition, the substrate 310 and the through vias 320 together are considered as an interposer.

Figure 32:
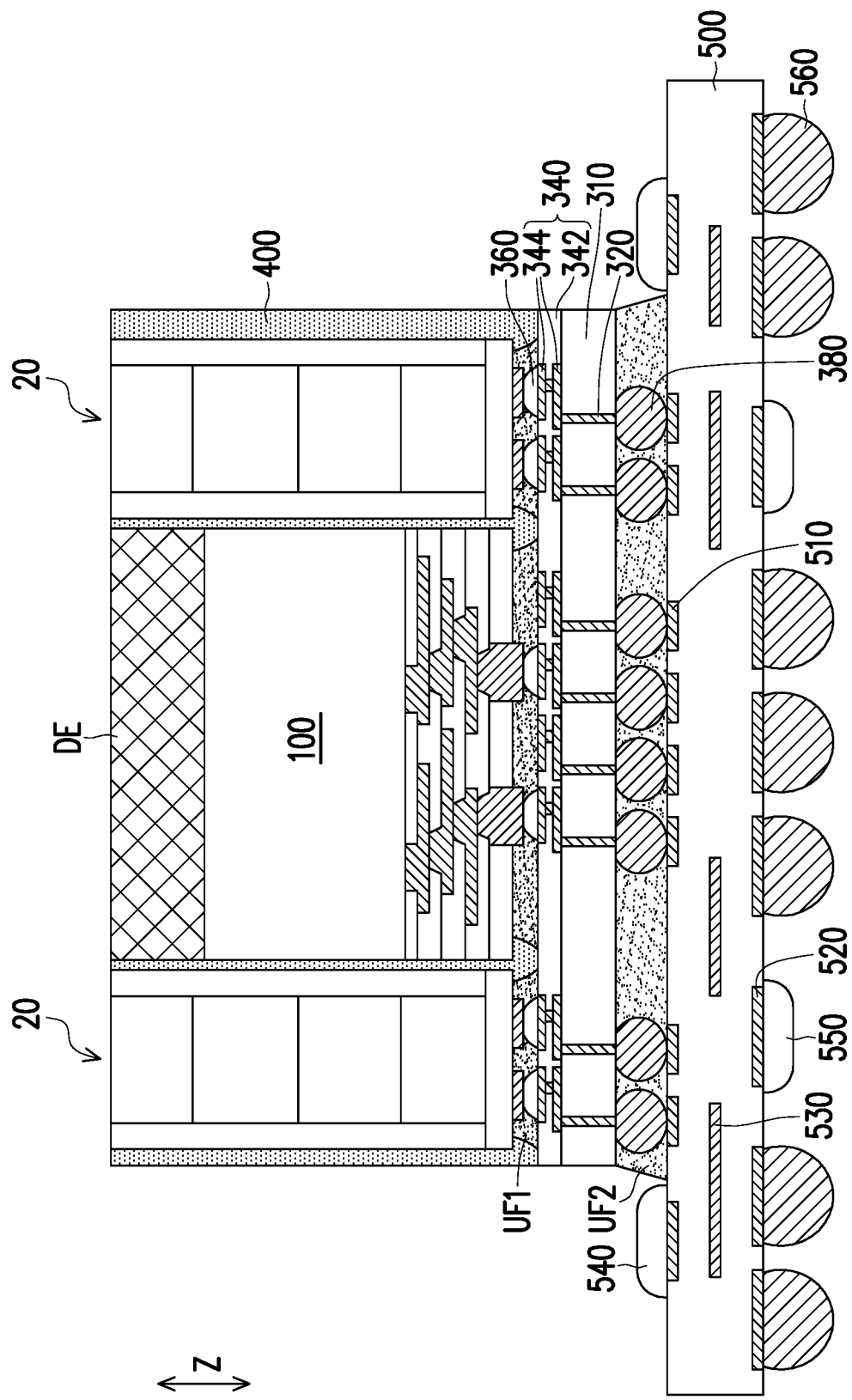

Referring to FIG. 32, in some embodiments, the structure with the dummy element DE disposed thereon is bonded on a substrate 500 (including bonding pads 510, 520, metallization layers 530 and vias interconnected thereto, surface devices 540, 550, and conductive elements 560) through the conductive connectors 380, in accordance with step S37 of FIG. 35. The detail of the bonding process and the formation and material of the substrate 500 (including bonding pads 510, 520, metallization layers 530 and vias interconnected thereto, surface devices 540, 550, and conductive elements 560) have been described in the process of FIG. 15, and thus are not repeated herein. In some embodiments, an underfill UF2 is formed on the substrate 500. As shown in FIG. 32, for example, an underfill UF2 fills the gap between the structure with the dummy element DE disposed thereon and the substrate 500, and wraps sidewalls of the conductive connectors 380. The material and formation of the underfill UF2 may be the same or similar to the material and formation of underfill UF1 described in FIG. 6, and thus are not repeated herein for simplicity. In addition, the substrate 500 is considered as a circuit structure (e.g. an organic substrate with circuitry structure embedded therein, such as printed circuit board (PCB)).

Figure 33A:
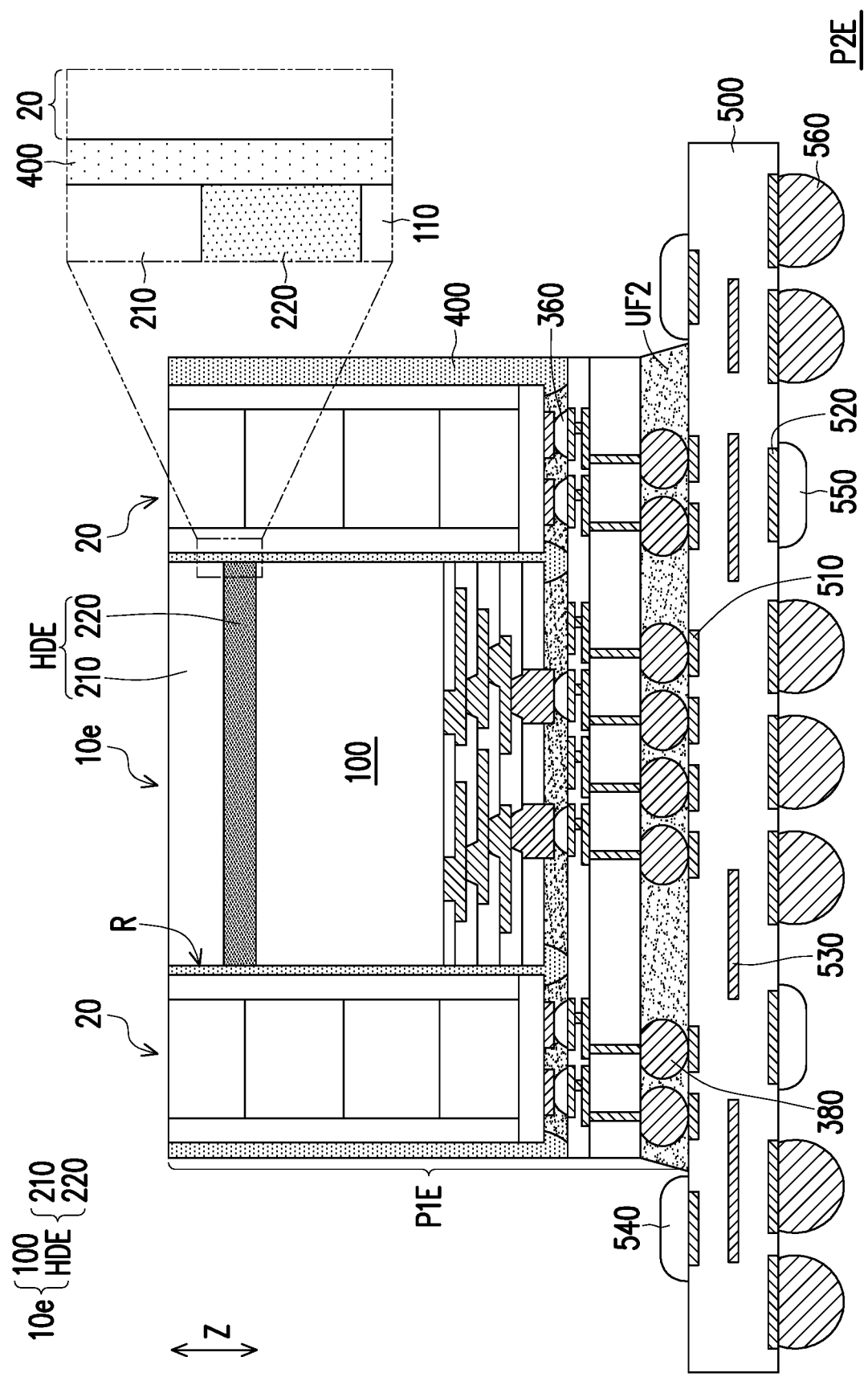

Referring to FIG. 33A, in some embodiments, the dummy element DE is removed and a heat dissipating element HDE is then disposed on the semiconductor die 100 to form a (stacked) package structure P2E having a package structure P1E including a semiconductor component 10e disposed on the substrate 500, in accordance with step S38 of FIG. 35. For example, the removal of the dummy element DE may be performed by etching, UV de-adhesion or thermal de-adhesion, the disclosure is not limited thereto. In some embodiments, the dummy element DE is removed from the structure depicted in FIG. 32 to form a recess R above the semiconductor die 100, and then the heat dissipating element HDE is disposed in the recess R to be in physical contact with the semiconductor die 100 and the insulating encapsulation 400. In other words, the recess R is confined by the semiconductor die 100 and the insulating encapsulation 400. In some embodiments, the semiconductor component 10e includes the heat dissipating element HDE and the semiconductor die 100 underlying thereto, where the heat dissipating element HDE is thermally coupled with the semiconductor die 100. For example, as shown in FIG. 33A, the heat dissipating element HDE includes a base layer 210 and an adhesive layer 220 disposed thereon, where the adhesive layer 220 is sandwiched between the semiconductor die 100 of semiconductor component 10e and the base layer 210. The materials of the base layer 210 and the adhesive layer 220 included in the heat dissipating element HDE have been described in FIG. 1, and the detail of the semiconductor die 100 has been described in FIG. 1 to FIG. 5, and thus are not repeated herein. As shown in FIG. 33A, in each semiconductor component 10e encapsulated in the insulating encapsulation 400, the heat generated from the semiconductor die 100 is able to easily dissipate to the external environment through the heat dissipating element HDE, thereby helping to maintain a lower temperature in the package structure P1E. That is, owing to the heat dissipating element HDE of each semiconductor component 10e included in the package structure P1E, the heat dissipation efficiency of the semiconductor components 10e can be controlled by adjusting the material of the heat dissipating element HDE, thereby ensuring the reliability of the package structure P1E. In other words, due to the presence of the heat dissipating element HDE, overall thermal properties (e.g. heat dissipation, heat resistance) of the package structure P1E can be ensured.

Due to the manufacturing method of FIG. 35, in the cross-sectional view, the profile of the semiconductor component 10e included in the package structure P1E of the package structure P2E may be the same as the profile of the semiconductor component 10a depicted in FIG. 14A or the semiconductor component 10c depicted in FIG. 21A. For example, as shown in FIG. 33A, the sidewall of the base layer 210 and the sidewall of the adhesive layer 220 are aligned to and substantially coplanar to the sidewall of the semiconductor die 100, which is the same as the semiconductor component 10a. However, the disclosure is not limited thereto. In some embodiments, the sidewall of the heat dissipating element HDE (e.g. the sidewall of the base layer 210 and the sidewall of the adhesive layer 220) may not be aligned with the sidewall of the semiconductor die 100 underlying thereto while the sidewall of the base layer 210 may not be aligned with the sidewall of the adhesive layer 220 as well, which is the same as the semiconductor component 10c. That is, an offset approximately ranging from 5 µm to 5000 µm may be between the sidewall of the base layer 210 and the sidewall of the adhesive layer 220 within the heat dissipating element HDE, and another offset approximately ranging from 5 µm to 5000 µm may be between the sidewall of the adhesive layer 220 and the sidewall of the semiconductor die 100, within the semiconductor component 10e, for example. In further embodiments, the sidewall of the heat dissipating element HDE (e.g. the sidewall of the base layer 210 and the sidewall of the adhesive layer 220) may not be aligned with the sidewall of the semiconductor die 100 underlying thereto while the sidewall of the base layer 210 may be aligned with the sidewall of the adhesive layer 220. Or, in another embodiment, the sidewall of the heat dissipating element HDE may be partially aligned with the sidewall of the semiconductor die 100 underlying thereto (e.g. one of the sidewall of the base layer 210 and the sidewall of the adhesive layer 220 may be aligned with the sidewall of the semiconductor die 100) while the sidewall of the base layer 210 may not be aligned with the sidewall of the adhesive layer 220.

Figure 33B:
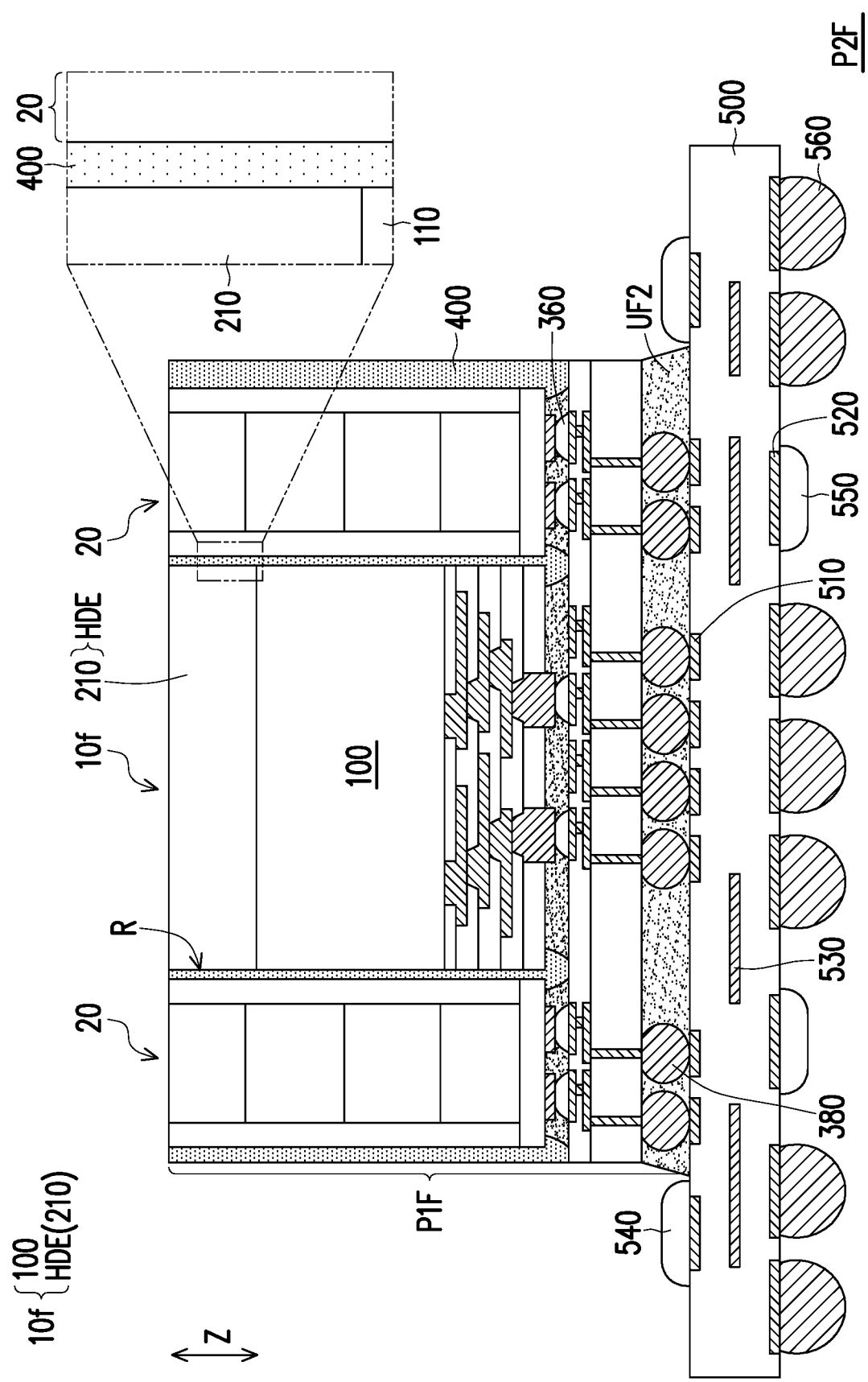
FIG. 33B is a schematic cross-sectional view of a package structure in accordance with some embodiments of the disclosure.

On the other hand, in alternative embodiments to the package structure P1E, the adhesive layer 220 may be omitted from the heat dissipating element HDE, see a package structure P1F included in a (stacked) package structure P2F depicted in FIG. 33B. In some embodiments, the package structure P1F includes a semiconductor component 10f instead of the semiconductor component 10e, where the semiconductor component 10f of the package structure P1F includes the heat dissipating element HDE having only the base layer 210. In some embodiments, due to the manufacturing method of FIG. 35, for each semiconductor component 10f depicted in FIG. 33B, in the cross-sectional view, the profile of the semiconductor component 10f included in the package structure P1F of the package structure P2F may be the same as the profile of the semiconductor component 10b depicted in FIG. 14B or the semiconductor component 10d depicted in FIG. 21B. For example, as shown in FIG. 33B, the sidewall of the base layer 210 may be aligned with the sidewall of the semiconductor die 100 underlying thereto, which is the same as the semiconductor component 10b. However, the disclosure is not limited thereto. In some embodiments, the sidewall of the base layer 210 may not be aligned with the sidewall of the semiconductor die 100 underlying thereto, which is the same as the semiconductor component 10d. That is, an offset approximately ranging from 5 µm to 5000 µm may be between the sidewall of the base layer 210 and the sidewall of the semiconductor die 100 within the semiconductor component 10f, for example.

Referring to FIG. 34, in some embodiments, a heat dissipation lid 600 along with a thermal interface material 610 is provided and bonded to the substrate 500 of the package structure P2E to form a package structure P3E. The materials and formations of the heat dissipation lid 600 and the thermal interface material 610 have been described in FIG. 17, and thus are not repeated herein for simplicity. In some embodiments, the thermal interface material 610 is located between the package structure P1E and the heat dissipation lid 600, where the thermal interface material 610 is thermally coupled to the heat dissipating element HDE included in the semiconductor component 10e of the package structure P1E, which further helps to dissipate heat from the package structure P1E to the heat dissipation lid 600, thereby helping to maintain a lower temperature in the package structure P3E. However, the disclosure is not limited thereto; in alternative embodiments, the package structure P2E included in the package structure P3E depicted in FIG. 34 may be replaced with the package structure P2F depicted in FIG. 33B.

Figure 36:
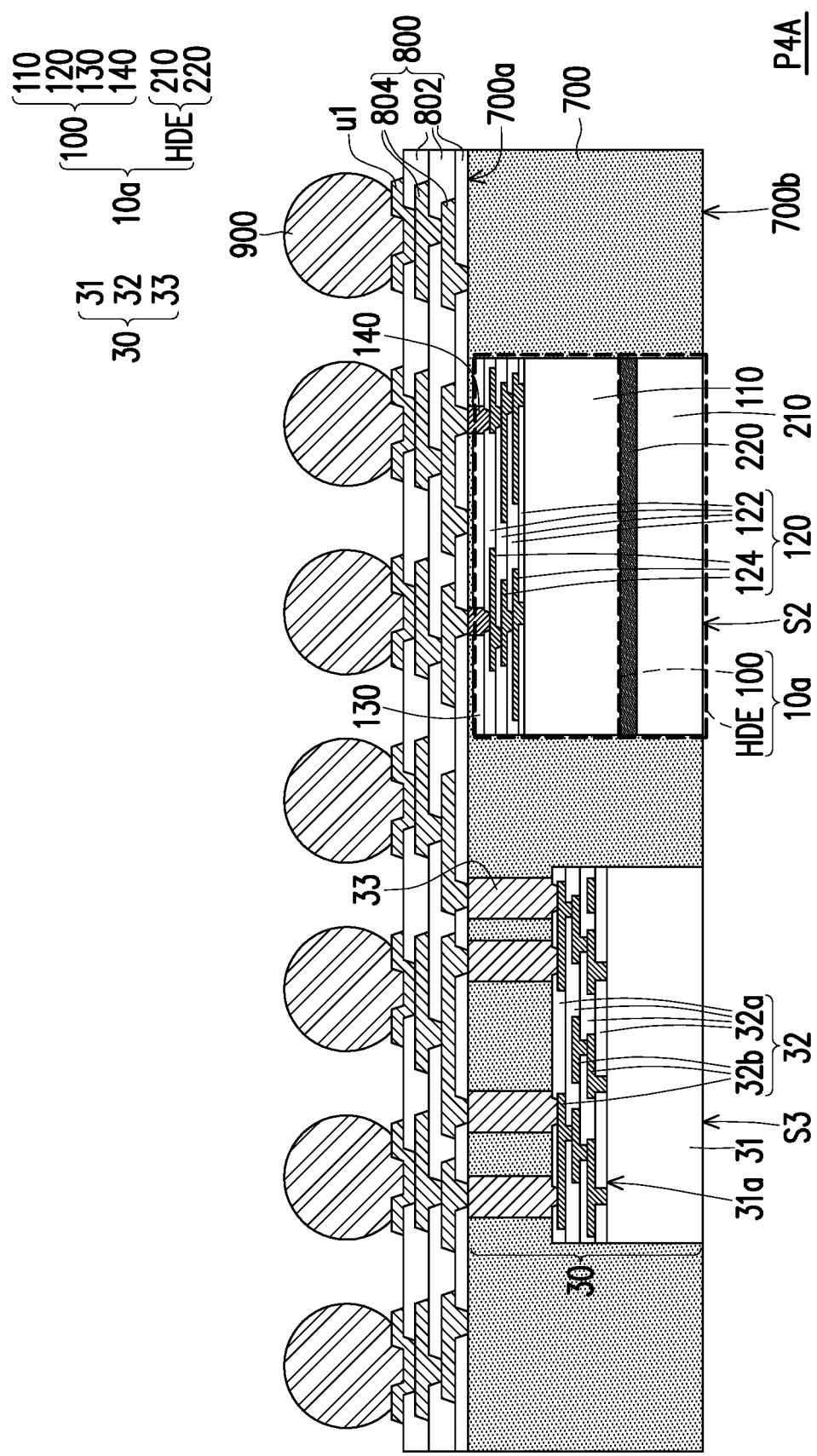
FIG. 36 is a schematic cross-sectional view of a package structure in accordance with some embodiments of the disclosure.
Figure 37:
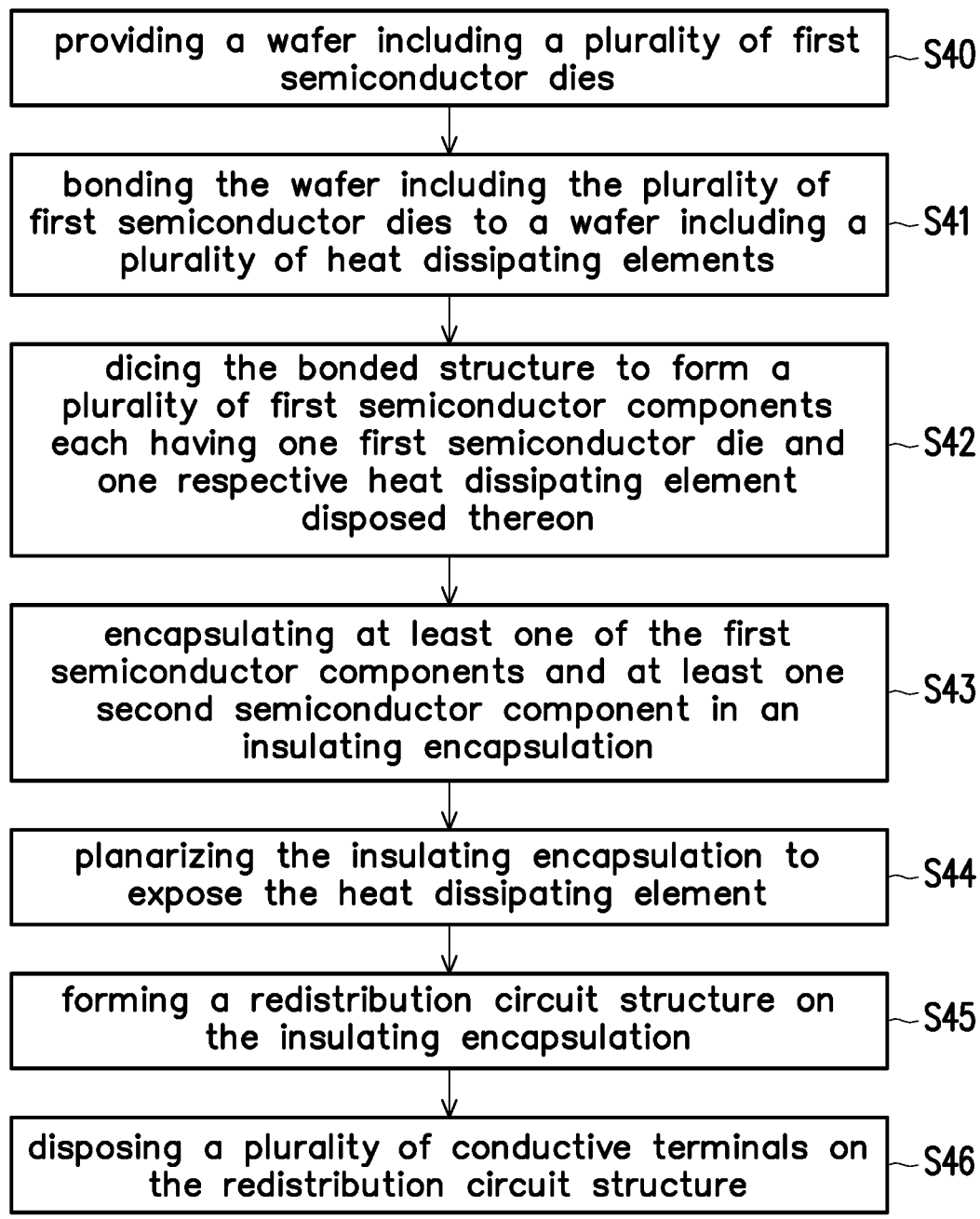
FIG. 37 is a flow chart illustrating a method of manufacturing a package structure in accordance with some embodiments of the disclosure.
Figure 38:
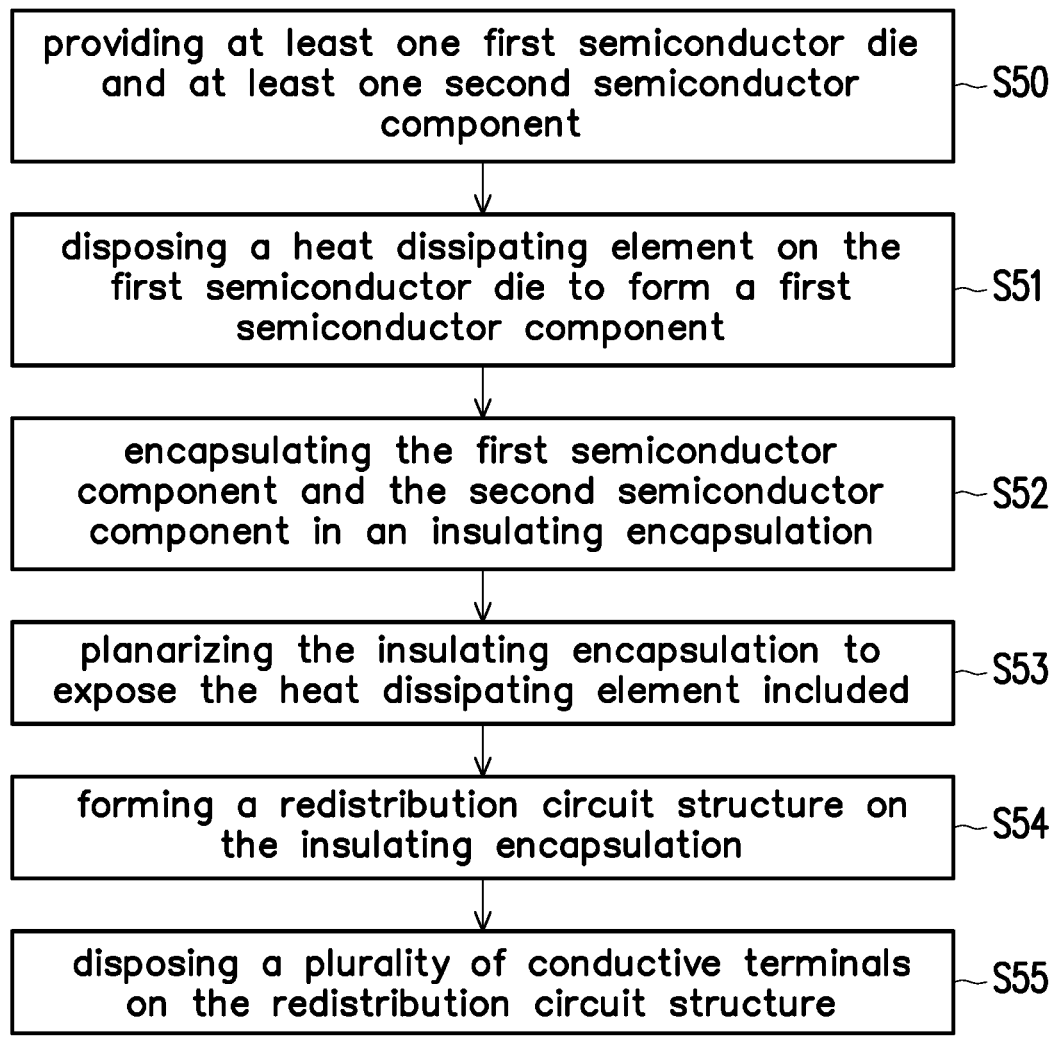
FIG. 38 is a flow chart illustrating a method of manufacturing a package structure in accordance with some embodiments of the disclosure.
Figure 39:
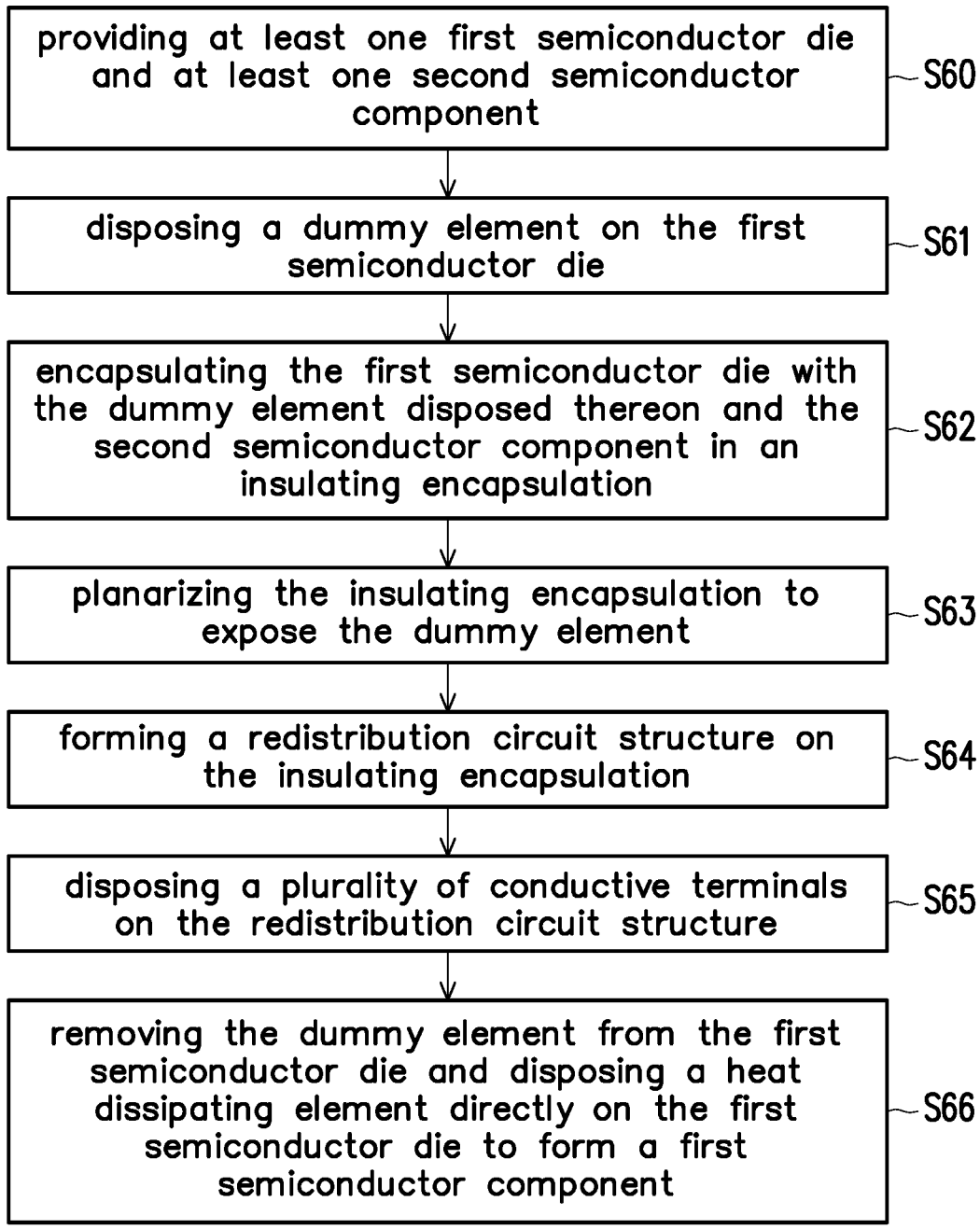
FIG. 39 is a flow chart illustrating a method of manufacturing a package structure in accordance with some embodiments of the disclosure.
Figure 40:
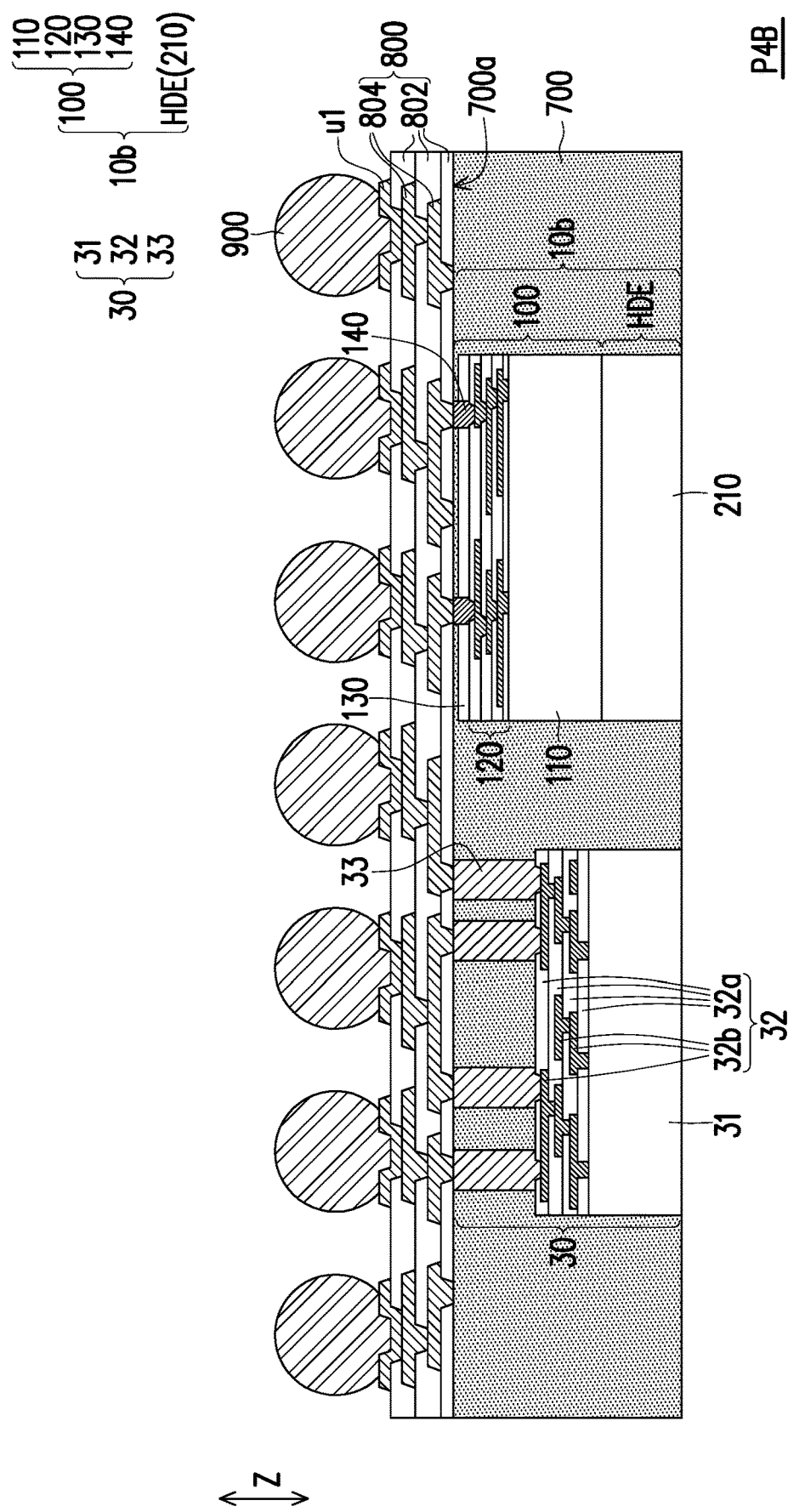
FIG. 40 is a schematic cross-sectional view of a package structure in accordance with some embodiments of the disclosure.

FIG. 36 is a schematic cross-sectional view of a package structure in accordance with some embodiments of the disclosure. FIG. 37 is a flow chart illustrating a method of manufacturing a package structure in accordance with some embodiments of the disclosure. FIG. 38 is a flow chart illustrating a method of manufacturing a package structure in accordance with some embodiments of the disclosure. FIG. 39 is a flow chart illustrating a method of manufacturing a package structure in accordance with some embodiments of the disclosure. FIG. 40 is a schematic cross-sectional view of a package structure in accordance with some embodiments of the disclosure. The elements similar to or substantially the same as the elements described above will use the same reference numbers, and certain details or descriptions of the same elements (e.g. the formations and materials) and the relationship thereof (e.g. the relative positioning configuration and electrical connection) will not be repeated herein.

Referring to FIG. 36, in some embodiments, a package structure P4A includes a semiconductor component 10a, a semiconductor component 30, an insulating encapsulation 700, a redistribution circuit structure 800, and conductive terminals 900. In some embodiments, the semiconductor component 10a and the semiconductor component 30 are encapsulated in the insulating encapsulation 700, where a surface S2 of the semiconductor component 10a and a surface S3 of the semiconductor component 30 are exposed by a surface 700b of the insulating encapsulation 700. In some embodiments, the redistribution circuit structure 800 is located on a surface 700a of the insulating encapsulation 700, where the surface 700a is opposite to the surface 700b along a stacking direction Z of the redistribution circuit structure 800 and the insulating encapsulation 700. As shown in FIG. 36, for example, the redistribution circuit structure 800 is electrically connected to the semiconductor component 10a and the semiconductor component 30. In the disclosure, the redistribution circuit structure 800 provides the routing function to the semiconductor components 10a, 30. In some embodiments, the conductive terminals 900 are located on and connected to the redistribution circuit structure 800, where the redistribution circuit structure 800 is located between the insulating encapsulation 700 and the conductive terminals 900. As shown in FIG. 36, some of the conductive terminals 900 are electrically connected to the semiconductor component 10a, and some of conductive terminals 900 are electrically connected to the semiconductor component 30.

The formation and material of the semiconductor component 10a has been described in FIG. 1 to FIG. 5, and thus is not repeated herein. As shown in FIG. 36, the semiconductor component 10a includes a first semiconductor die 100 and a heat dissipating element HDE disposed thereon, where the heat dissipating element HDE is thermally coupled to the a first semiconductor die 100. Owing to the heat dissipating element HDE, the heat generated from the semiconductor die 100 is able to easily dissipate to the external environment through the heat dissipating element HDE, thereby helping to maintain a lower temperature in the package structure P4A. That is, due to the heat dissipating element HDE of the semiconductor component 10a included in the package structure P4A, the heat dissipation efficiency of the semiconductor components 10a can be controlled by adjusting the material of the heat dissipating element HDE, thereby ensuring the reliability of the package structure P4A. In other words, due to the presence of the heat dissipating element HDE, overall thermal properties (e.g. heat dissipation, heat resistance) of the package structure P4A can be ensured. However, the disclosure is not limited thereto; in alternative embodiments, the semiconductor component 10a may be replaced with the semiconductor component 10c depicted in FIG. 21A or the semiconductor component 10e depicted in FIG. 33A; or, the semiconductor component 10a may be replaced by the semiconductor component 10b depicted in FIG. 14B (see a package P4B as shown in FIG. 40), the semiconductor component 10d depicted in FIG. 21B, or the semiconductor component 10f depicted in FIG. 33B.

In some embodiments, the semiconductor component 30 includes a semiconductor substrate 31 having an active surface 31a, an interconnection structure 32 formed on the active surface 31a, and conductive vias 33 electrically connecting to the interconnection structure 32. In some embodiments, the semiconductor substrate 31 may be a silicon substrate including active components (e.g., transistors or the like) and/or passive components (e.g., resistors, capacitors, inductors or the like) formed therein. The disclosure is not limited thereto. In one embodiment, the formation and material of the semiconductor substrate 31 may be the same as the formation and material of the semiconductor substrate 110; however, the disclosure is not limited thereto.

In some embodiments, the interconnection structure 32 includes one or more inter-dielectric layers 32a and one or more patterned conductive layers 32b stacked alternately. In certain embodiments, the patterned conductive layers 32b are sandwiched between the inter-dielectric layers 32a, where portions of a top surface of a topmost layer of the patterned conductive layers 32b are exposed by a topmost layer of the inter-dielectric layers 32a and physically connected to the conductive vias 33, and portions of a bottommost layer of the patterned conductive layers 32b are exposed by a bottommost layer of the inter-dielectric layers 32a and electrically connected to the active components and/or passive components (not shown) formed in the semiconductor substrate 31. As shown in FIG. 36, the bottommost layer of the inter-dielectric layers 32a is located on the active surface 31a of the semiconductor substrate 31, and the topmost layer of the inter-dielectric layers 32a is at least partially in contact with the conductive vias 33. The numbers of the inter-dielectric layers 32a and the patterned conductive layers 32b may be selected based on demand, and are not limited in the disclosure. The number of the inter-dielectric layers 32a and the number of the patterned conductive layers 32b may be less than or more than what is depicted in FIG. 36, and may be designated based on the demand and/or design layout; the disclosure is not specifically limited thereto. In one embodiment, the formation and material of the inter-dielectric layers 32a may be the same as or similar to the formation and material of the inter-dielectric layers 122 as described in FIG. 1, and the formation and material of the patterned conductive layers 32b may be the same as or similar to the formation and material of the patterned conductive layers 124 as described in FIG. 1, and thus are not repeated herein. In the disclosure, the conductive vias 33 serve as conductive terminals of the semiconductor component 30 for electrical connection to external components. In some embodiments, although only four conductive vias 33 are presented in FIG. 36 for illustrative purposes, it should be appreciated that the number of the conductive via 33 may be selected or designated based on the demand and the design layout; the disclosure is not limited thereto. In one embodiment, the formation and material of the conductive vias 33 may be the same as the formation and material of the conductive vias 140 as described in FIG. 1, and thus are not repeated herein. As shown in FIG. 36, the conductive vias 33 are physically and electrically connected to the interconnection circuit structure 32. In some embodiments, surfaces of the conductive vias 140 of the semiconductor component 10a and surfaces of the conductive vias 33 of the semiconductor component 30 are substantially leveled with and substantially coplanar to the surface 700a of the insulating encapsulation 700, where the surfaces of the conductive vias 140 of the semiconductor component 10a and the surfaces of the conductive vias 33 of the semiconductor component 30 are exposed by the insulating encapsulation 700 and in contact with the redistribution circuit structure 800.

In some embodiments, the semiconductor component 30 described herein may be referred to as a semiconductor chip or an integrated circuit (IC). In one embodiment, the semiconductor component 30 may be the same or similar to the semiconductor die 100. In an alternative embodiment, the semiconductor component 30 may be the different from the semiconductor die 100. In one further embodiment, the semiconductor component 30 may be the same or similar to the semiconductor component 20. In a further alternative embodiment, the semiconductor component 30 may be the different from the semiconductor component 20.

In some embodiments, as shown in FIG. 36, the redistribution circuit structure 800 includes a plurality of dielectric layers 802 and a plurality of metallization layers 804 stacked alternately, the metallization layers 804 are sandwiched between the dielectric layers 802, where a top surface of the topmost layer of metallization layers 804 is at least partially exposed by a plurality of openings (not marked) formed in the topmost layer of the dielectric layers 802 to connect to later formed component(s) for electrical connection, and a bottom surface of the lowest layer of the metallization layers 804 is at least partially exposed by a plurality of openings (no marked) formed in the lowest layer of the dielectric layers 802 and electrically connected to the semiconductor component 10a through the conductive vias 140 and to semiconductor component 30 through the conductive vias 33. The numbers of the metallization layers 804 and the dielectric layers 802 are not limited in the disclosure, and may be designated based on the demand and/or design layout. That is, the surfaces of the conductive vias 140 of the semiconductor component 10a and the surfaces of the conductive vias 33 of the semiconductor component 30 exposed by the insulating encapsulation 700 are in physical contact with the bottommost layer of the metallization layers 804 exposed by the bottommost layer of the dielectric layers 802. In some embodiments, the surfaces of the conductive vias 140 of the semiconductor component 10a and the surfaces of the conductive vias 33 of the semiconductor component 30 exposed by the insulating encapsulation 700 are partially covered by the bottommost layer of the dielectric layers 802.

Continued on FIG. 36, in some embodiments, the package structure P4A may further include a plurality of under-ball metallurgy (UBM) patterns u1, where the UBM patterns u1 may be disposed on the exposed top surfaces of the topmost layer of the metallization layers 804 for electrically connecting with conductive elements (e.g. conductive balls or conductive bumps, such as the conductive terminals 900). As shown in FIG. 36, for example, the UBM patterns u1 are formed on and electrically connected to the redistribution circuit structure 800. The materials of the UBM patterns u1 may include copper, nickel, titanium, tungsten, or alloys thereof or the like, and may be formed by an electroplating process, for example. The number of the UBM patterns u1 is not limited in this disclosure, and corresponds to the number of portions of the top surface of the topmost layer of the metallization layers 804 exposed by the topmost layer of the dielectric layers 802. In some embodiments, the conductive terminals 900 are electrically connected to the redistribution circuit structure 800 through the UBM patterns u1. In some embodiments, the conductive terminals 900 may be disposed on the UBM patterns u1 by ball placement process or reflow process. In some embodiments, the conductive terminals 900 are, for example, solder balls or ball grid array (BGA) balls. The number of the conductive terminals 900 is not limited to the disclosure, and may be designated and selected based on the number of the UBM patterns u1.

In one embodiments, the package structure P4A may be manufactured by a method of FIG. 37. It should be understood that additional processing may occur before, during, and after the illustrated actions of the method of FIG. 37 to complete formation of the package structure P4A. The method of FIG. 37 includes at least steps S40 to S46. For example, the method shown in FIG. 37 begins with step S40, which provides a wafer including a plurality of first semiconductor dies; step S41, which bonds the wafer including the plurality of first semiconductor dies to a wafer including a plurality of heat dissipating elements; step S42, which dices the bonded structure to form a plurality of individual and separated first semiconductor components each having one first semiconductor die and one respective heat dissipating element disposed thereon, where first semiconductor die is thermally coupled to the respective one heat dissipating element; step S43, which encapsulates at least one of the first semiconductor components and at least one second semiconductor component in an insulating encapsulation; step S44, which planarizes the insulating encapsulation to expose the heat dissipating element included in the first semiconductor component by a first surface of the insulating encapsulation; step S45, which forms a redistribution circuit structure on a second surface of the insulating encapsulation to electrically connect to the first semiconductor component and the second semiconductor component, where the first surface is opposite to the second surface; and step S46, which disposes a plurality of conductive terminals on the redistribution circuit structure to electrically connect to the first semiconductor component and the second semiconductor component through the redistribution circuit structure, where the redistribution circuit structure is sandwiched between the conductive terminals and the insulating encapsulation. However, the disclosure is not limited thereto.

In alternative embodiments, the package structure P4A may be manufactured by a method of FIG. 38. It should be understood that additional processing may occur before, during, and after the illustrated actions of the method of FIG. 38 to complete formation of the package structure P4A. The method of FIG. 38 includes at least steps S50 to S55. For example, the method shown in FIG. 38 begins with step S50, which provides at least one first semiconductor die and at least one second semiconductor component, where a thickness of the first semiconductor die is less than a thickness of the second semiconductor component; step S51, which disposes a heat dissipating element on the first semiconductor die to form a first semiconductor component, where the heat dissipating element is physically connected to the first semiconductor die, and the heat dissipating element is thermally coupled to the first semiconductor die; step S52, which encapsulates the first semiconductor component and the second semiconductor component in an insulating encapsulation; step S53, which planarizes the insulating encapsulation to expose the heat dissipating element included in the first semiconductor component by a first surface of the insulating encapsulation; step S54, which forms a redistribution circuit structure on a second surface of the insulating encapsulation to electrically connect to the first semiconductor component and the second semiconductor component, where the first surface is opposite to the second surface; and step S55, which disposes a plurality of conductive terminals on the redistribution circuit structure to electrically connect to the first semiconductor component and the second semiconductor component through the redistribution circuit structure, where the redistribution circuit structure is sandwiched between the conductive terminals and the insulating encapsulation. However, the disclosure is not limited thereto.

In further alternative embodiments, the package structure P4A may be manufactured by a method of FIG. 39. It should be understood that additional processing may occur before, during, and after the illustrated actions of the method of FIG. 39 to complete formation of the package structure P4A. The method of FIG. 39 includes at least steps S60 to S66. For example, the method shown in FIG. 39 begins with step S60, which provides at least one first semiconductor die and at least one second semiconductor component, where a thickness of the first semiconductor die is less than a thickness of the second semiconductor component; step S61, which disposes a dummy element on the first semiconductor die; step S62, which encapsulates the first semiconductor die with the dummy element disposed thereon and the second semiconductor component in an insulating encapsulation; step S63, which planarizes the insulating encapsulation to expose the dummy element by a first surface of the insulating encapsulation; step S64, which forms a redistribution circuit structure on a second surface of the insulating encapsulation to electrically connect to the first semiconductor die and the second semiconductor component, where the first surface is opposite to the second surface; step S65, which disposes a plurality of conductive terminals on the redistribution circuit structure to electrically connect to the first semiconductor die and the second semiconductor component through the redistribution circuit structure, where the redistribution circuit structure is sandwiched between the conductive terminals and the insulating encapsulation; and step S66, which removes the dummy element from the first semiconductor die and disposes a heat dissipating element directly on the first semiconductor die to form a first semiconductor component, where the heat dissipating element is physically connected to the first semiconductor die, and the heat dissipating element is thermally coupled to the first semiconductor die.

Figure 41:
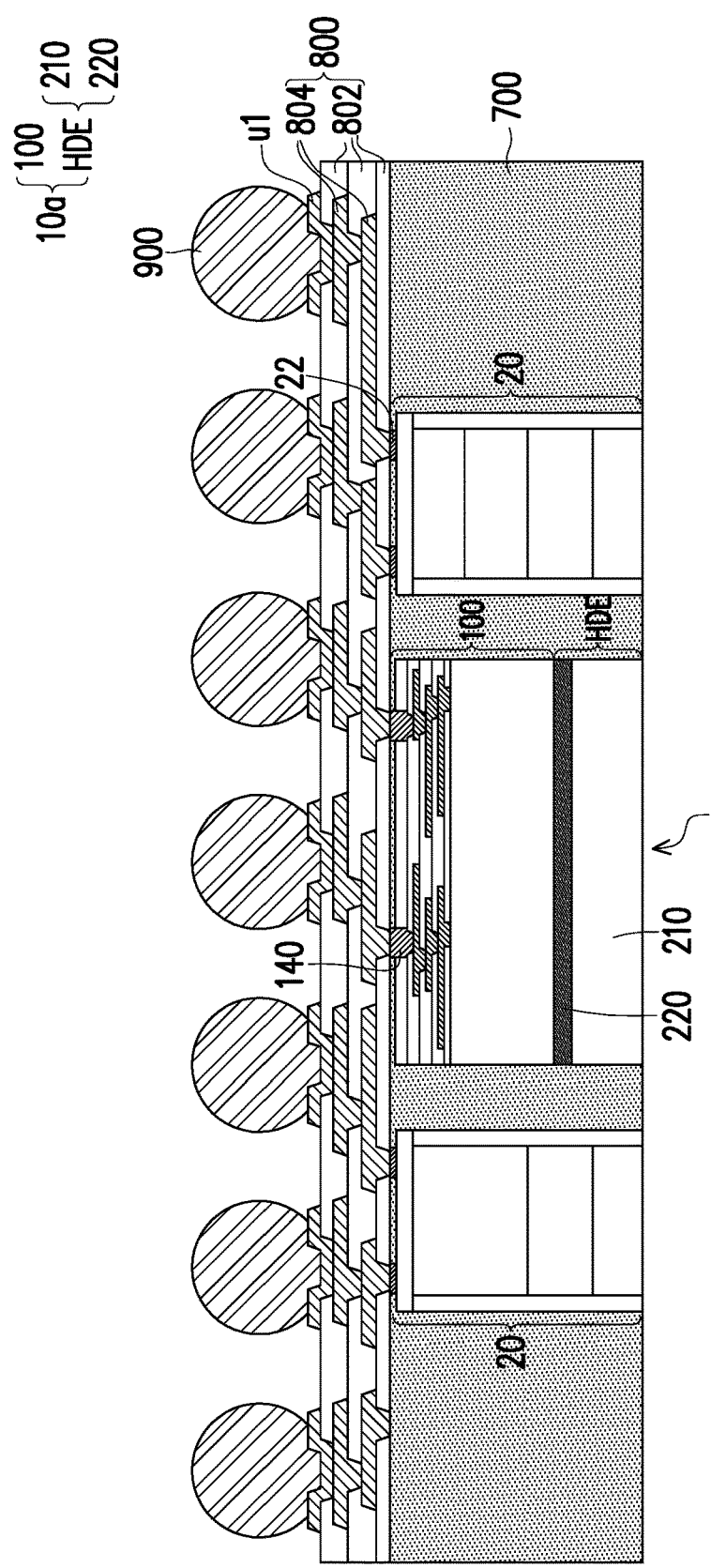
FIG. 41 is a schematic cross-sectional view of a package structure in accordance with some embodiments of the disclosure.
Figure 42:
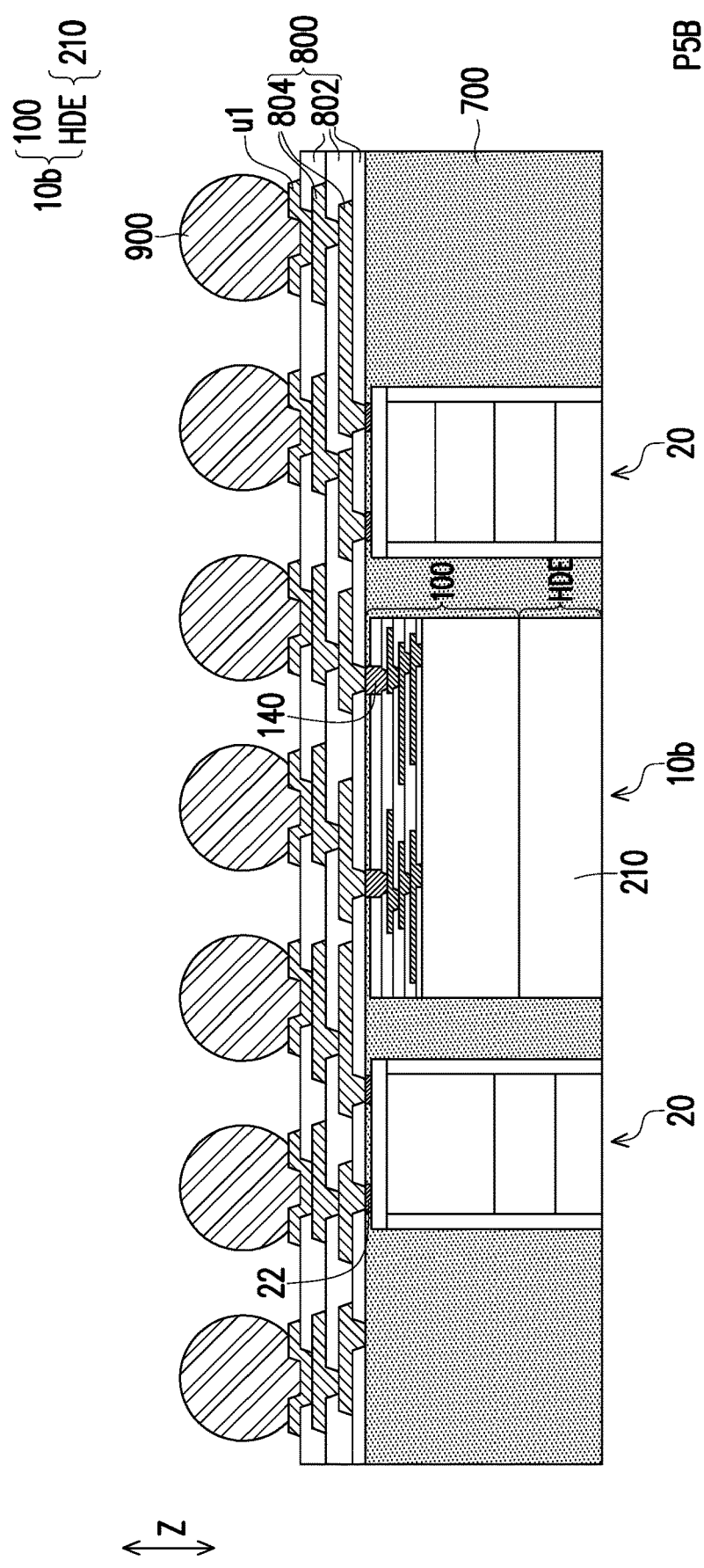
FIG. 42 is a schematic cross-sectional view of a package structure in accordance with some embodiments of the disclosure.
Figure 43:
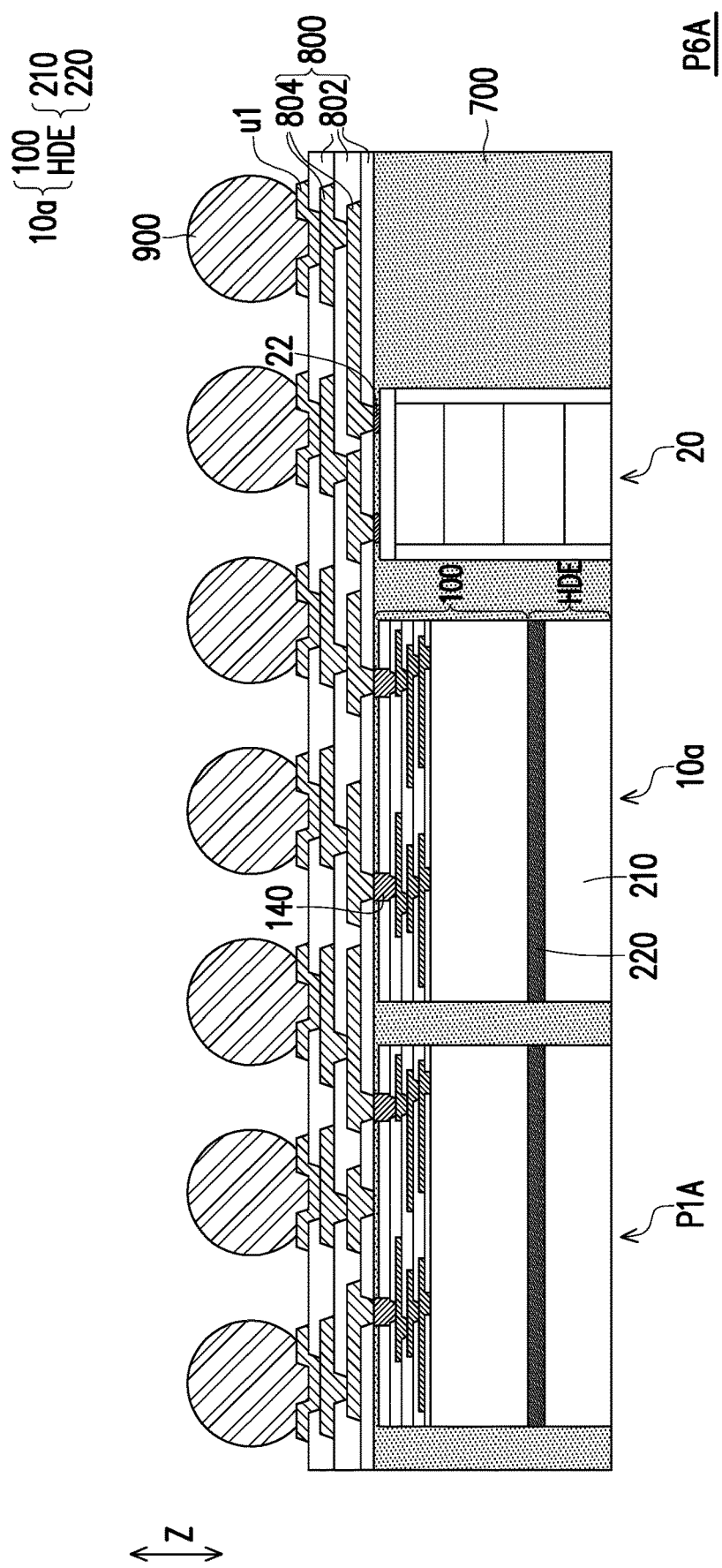
FIG. 43 is a schematic cross-sectional view of a package structure in accordance with some embodiments of the disclosure.
Figure 44:
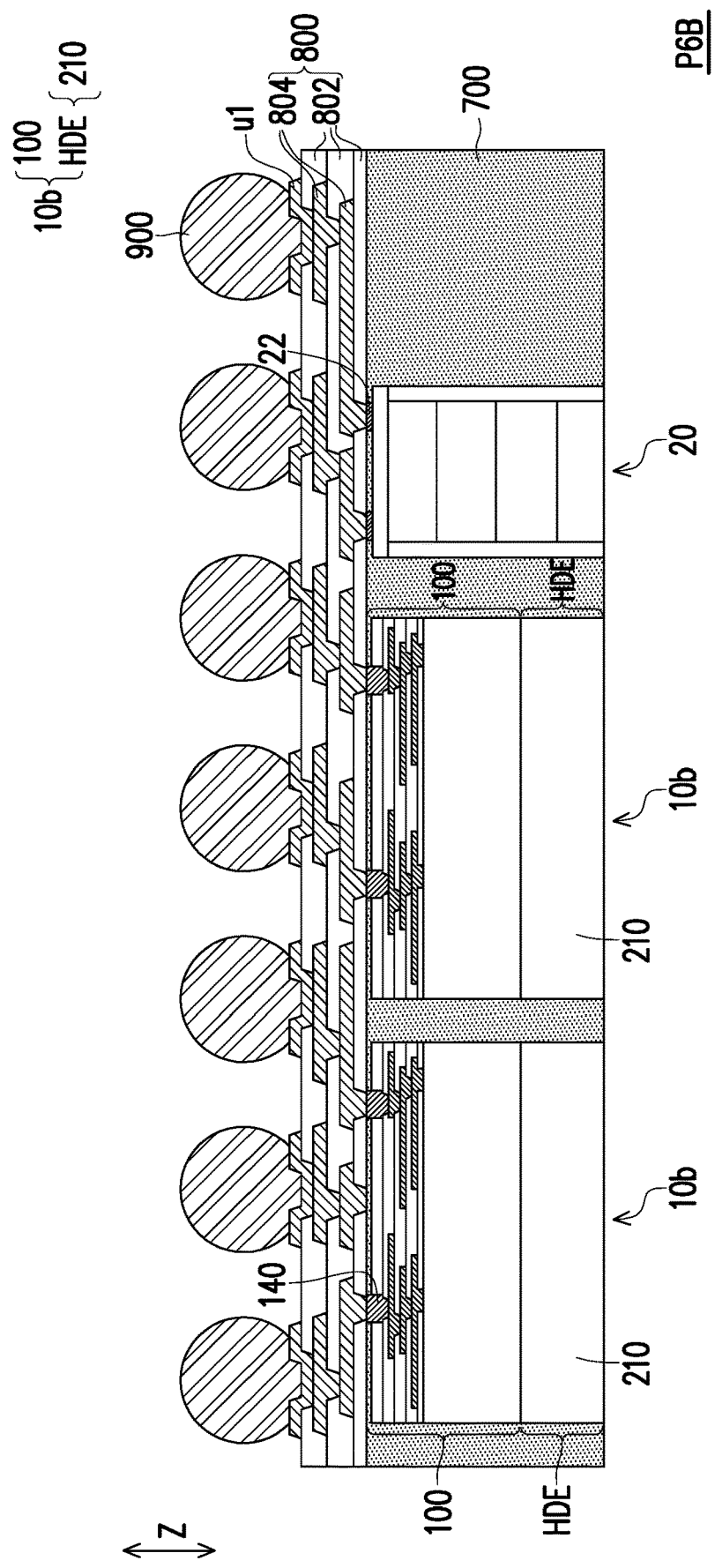
FIG. 44 is a schematic cross-sectional view of a package structure in accordance with some embodiments of the disclosure.

In some embodiments, the number of the semiconductor component 10a and the number of the semiconductor component 30 shown in FIG. 36 and/or the number of the semiconductor component 10b and the number of the semiconductor component 30 shown in FIG. 40 are not limited thereto, and may be one or more than one. In addition, the semiconductor component 30 above may also be replaced with the semiconductor component 20 described in FIG. 6. FIG. 41 is a schematic cross-sectional view of a package structure in accordance with some embodiments of the disclosure. FIG. 42 is a schematic cross-sectional view of a package structure in accordance with some embodiments of the disclosure. FIG. 43 is a schematic cross-sectional view of a package structure in accordance with some embodiments of the disclosure. FIG. 44 is a schematic cross-sectional view of a package structure in accordance with some embodiments of the disclosure. The elements similar to or substantially the same as the elements described above will use the same reference numbers, and certain details or descriptions of the same elements (e.g. the formations and materials) and the relationship thereof (e.g. the relative positioning configuration and electrical connection) will not be repeated herein.

Referring to FIG. 36 and FIG. 41 together, the package structure P4A depicted in FIG. 36 and the package structure P5A depicted in FIG. 41 are similar; the difference is that, for the semiconductor package P5A depicted in FIG. 41, the one semiconductor component 30 is replaced with two semiconductor components 20. Referring to FIG. 40 and FIG. 42 together, the package structure P4B depicted in FIG. 40 and the package structure P5B depicted in FIG. 42 are similar; the difference is that, for the semiconductor package P5B depicted in FIG. 42, the one semiconductor component 30 is replaced with two semiconductor components 20.

Referring to FIG. 36 and FIG. 43 together, the package structure P4A depicted in FIG. 36 and the package structure P6A depicted in FIG. 43 are similar; the difference is that, for the semiconductor package P6A depicted in FIG. 43, the one semiconductor component 10a is replaced with two semiconductor components 10a, and the one semiconductor component 30 is replaced with one semiconductor component 20. Referring to FIG. 40 and FIG. 44 together, the package structure P4B depicted in FIG. 40 and the package structure P6B depicted in FIG. 44 are similar; the difference is that, for the semiconductor package P6B depicted in FIG. 44, the one semiconductor component 10b is replaced with two semiconductor components 10b, and the one semiconductor component 30 is replaced with one semiconductor component 20.

However, the disclosure is not limited thereto. In alternative embodiments, the semiconductor components 10a depicted in FIG. 41 and FIG. 43 may independently be replaced with the semiconductor component 10c depicted in FIG. 21A or the semiconductor component 10e depicted in FIG. 33A, and the semiconductor components 10b depicted in FIG. 42 and FIG. 44 may independently be replaced by the semiconductor component 10d depicted in FIG. 21B or the semiconductor component 10f depicted in FIG. 33B.

Figure 45:
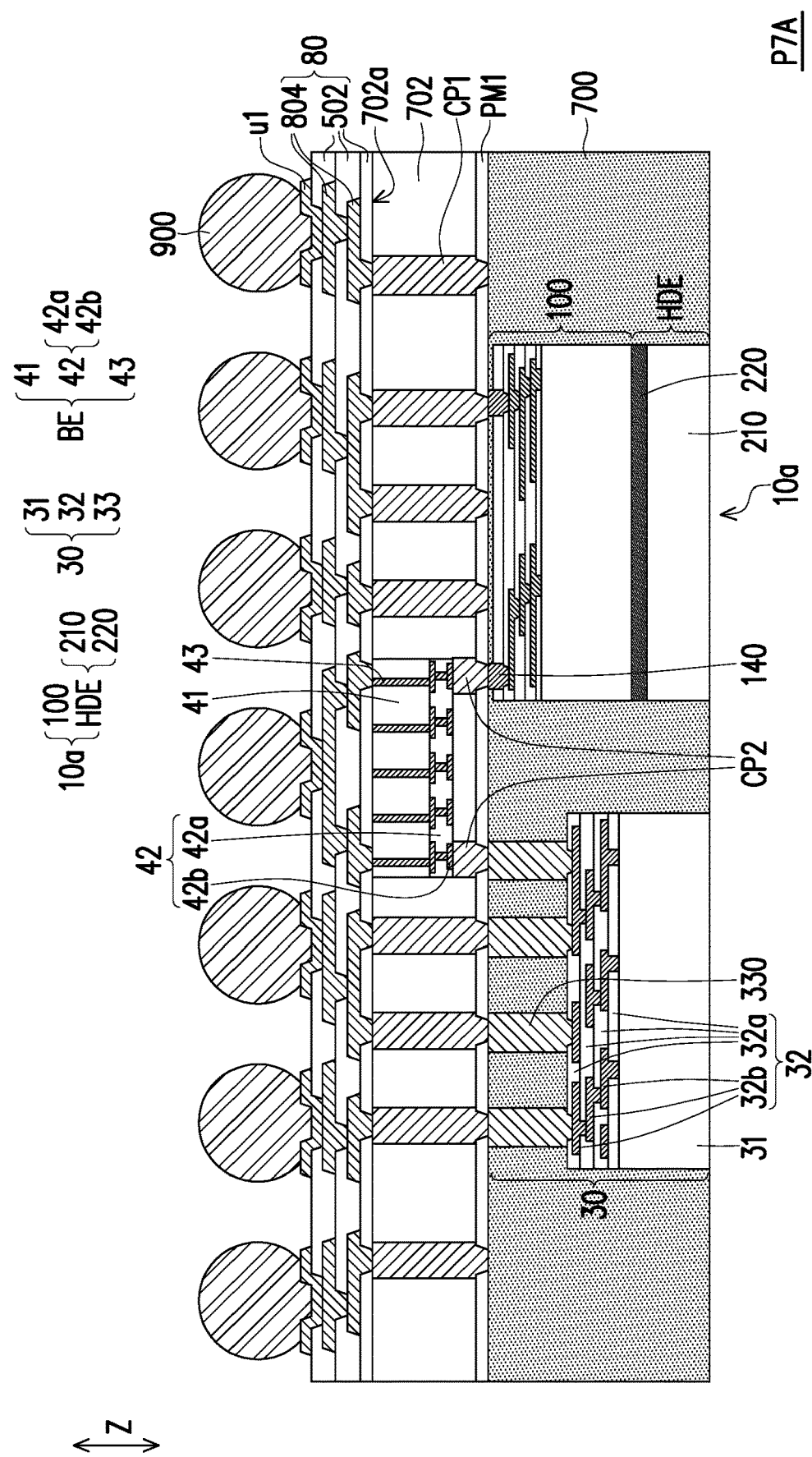
FIG. 45 is a schematic cross-sectional view of a package structure in accordance with some embodiments of the disclosure.
Figure 46:
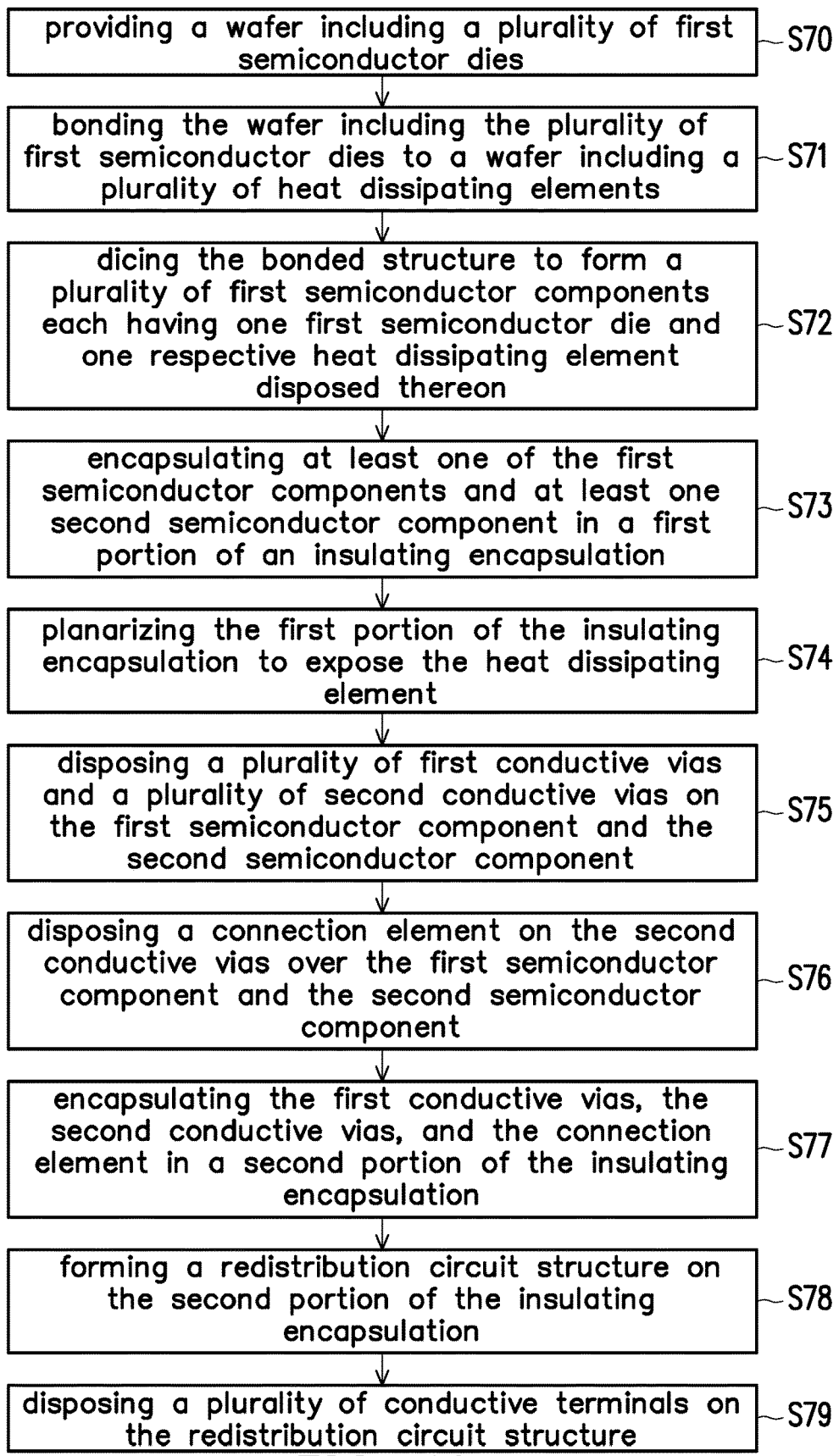
FIG. 46 is a flow chart illustrating a method of manufacturing a package structure in accordance with some embodiments of the disclosure.
Figure 47:
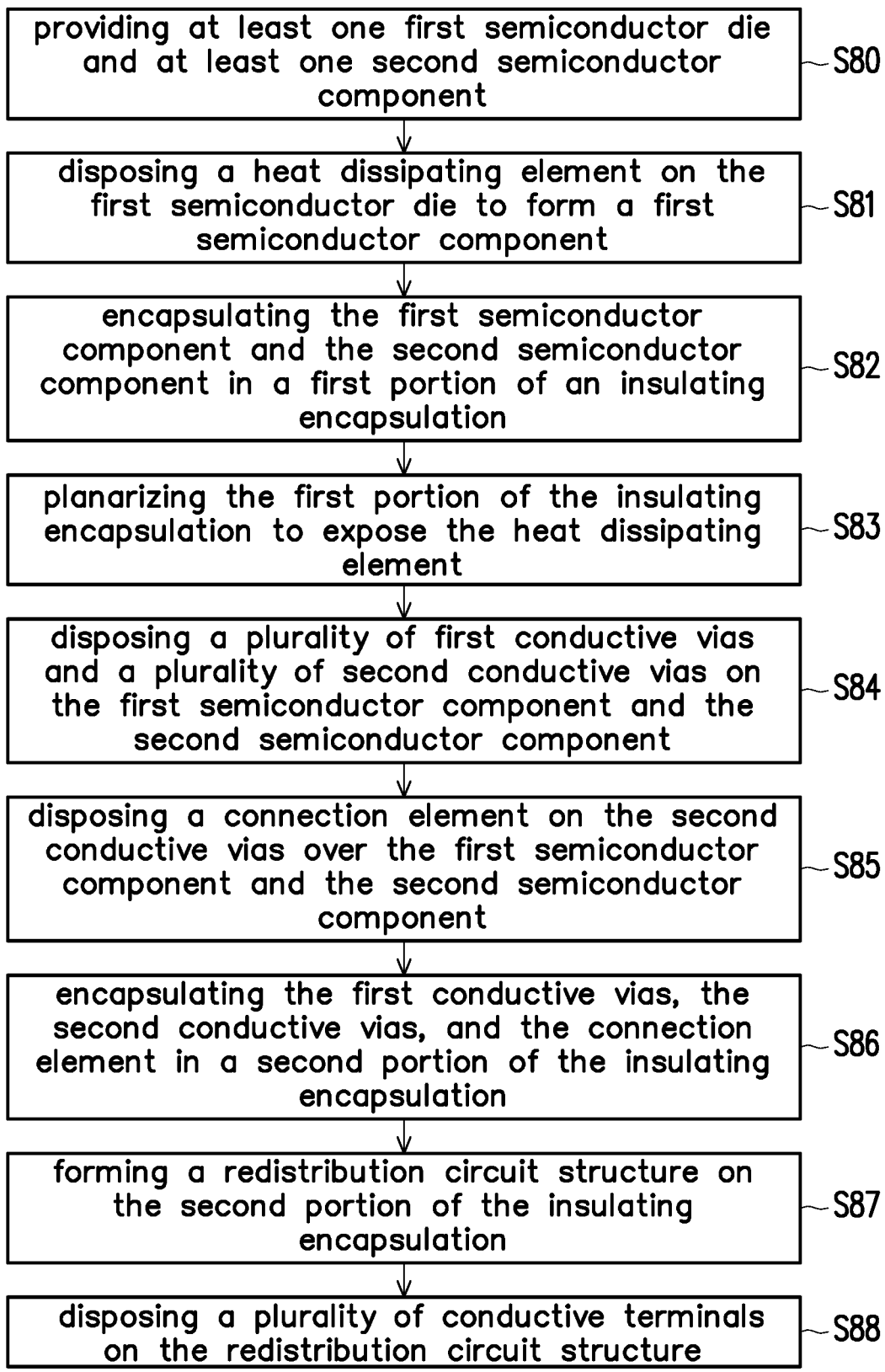
FIG. 47 is a flow chart illustrating a method of manufacturing a package structure in accordance with some embodiments of the disclosure.
Figure 48:
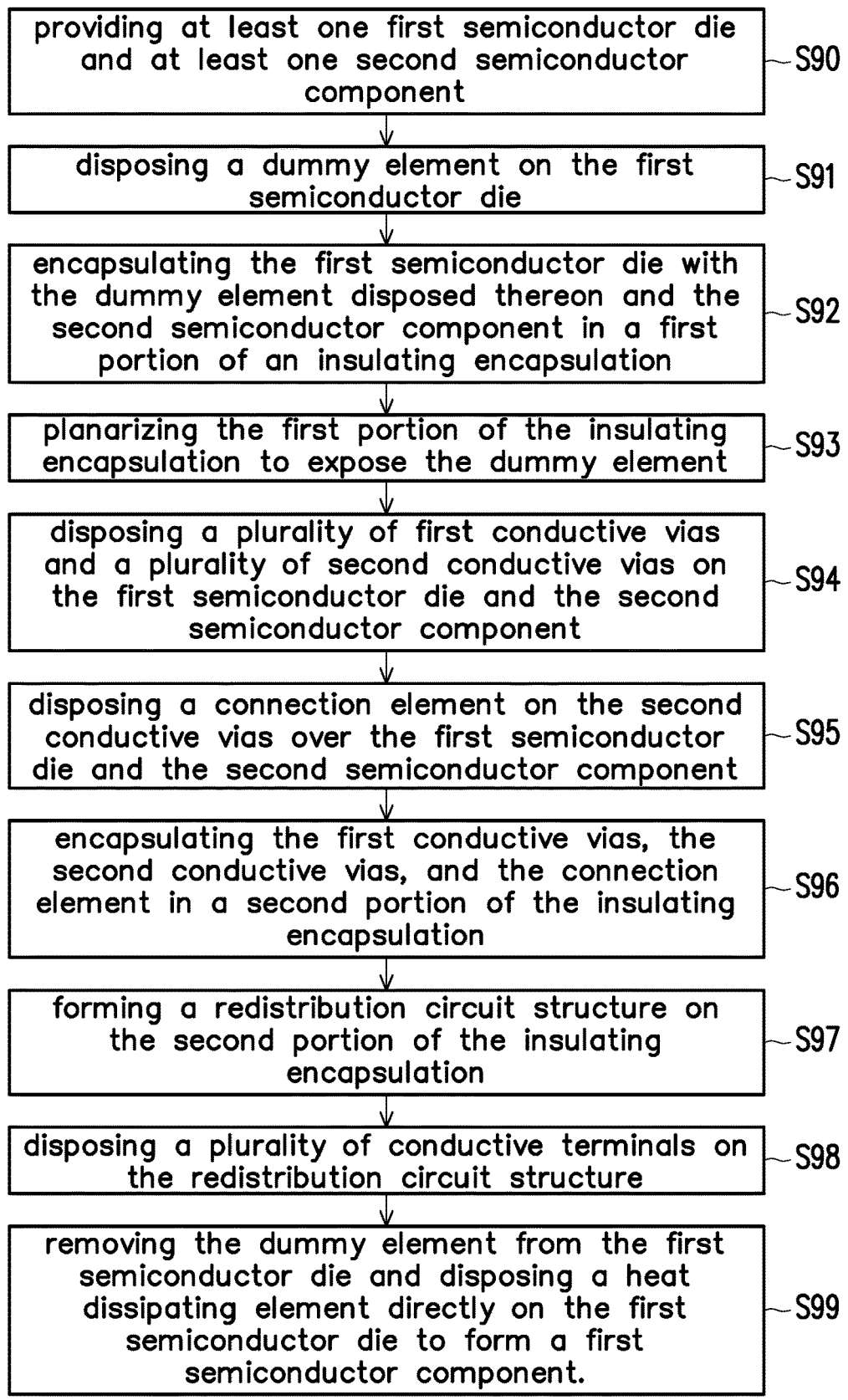
FIG. 48 is a flow chart illustrating a method of manufacturing a package structure in accordance with some embodiments of the disclosure.
Figure 49:
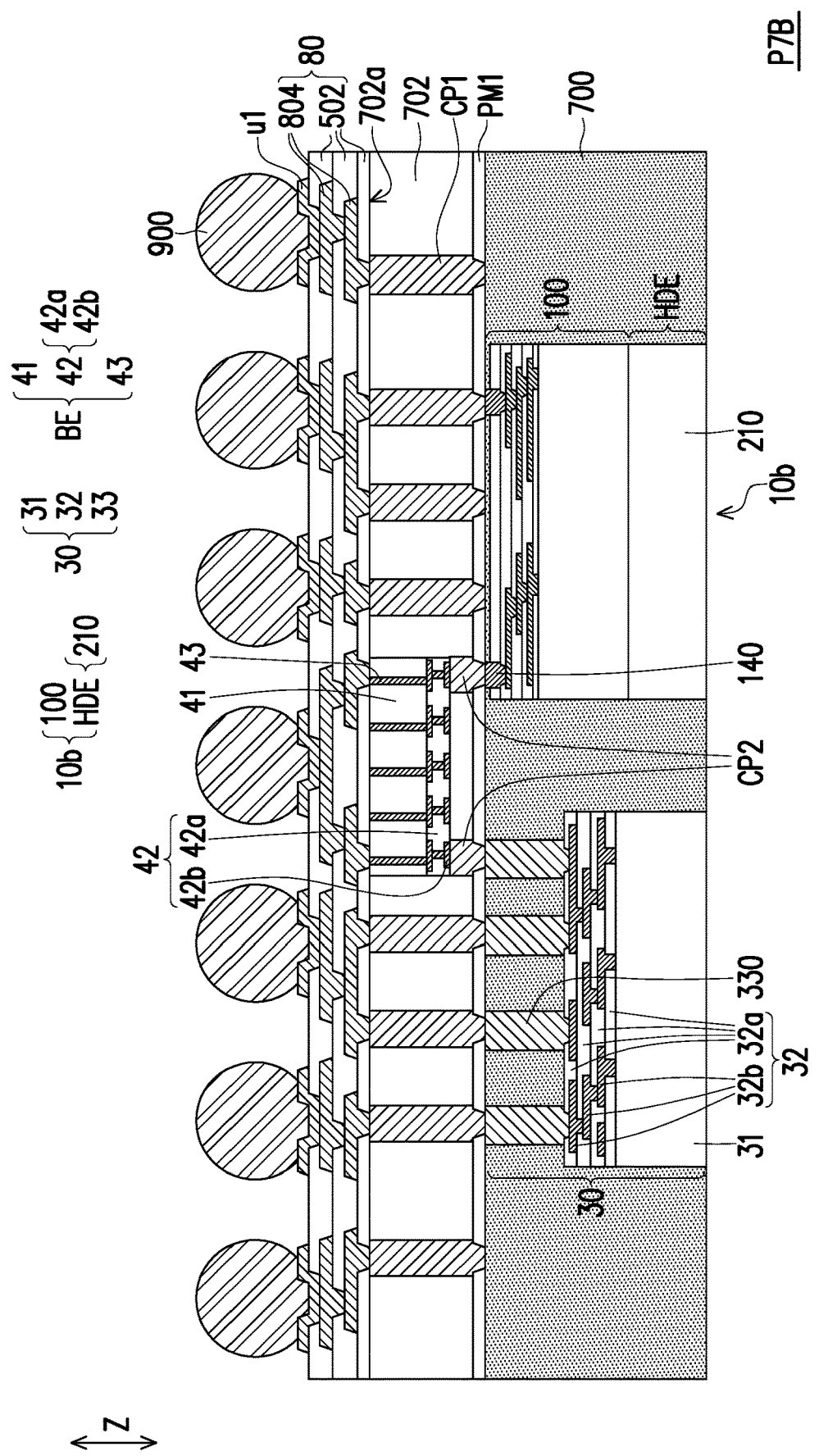
FIG. 49 is a schematic cross-sectional view of a package structure in accordance with some embodiments of the disclosure.

FIG. 45 is a schematic cross-sectional view of a package structure in accordance with some embodiments of the disclosure. FIG. 46 is a flow chart illustrating a method of manufacturing a package structure in accordance with some embodiments of the disclosure. FIG. 47 is a flow chart illustrating a method of manufacturing a package structure in accordance with some embodiments of the disclosure. FIG. 48 is a flow chart illustrating a method of manufacturing a package structure in accordance with some embodiments of the disclosure. FIG. 49 is a schematic cross-sectional view of a package structure in accordance with some embodiments of the disclosure. Referring to FIG. 36 and FIG. 45 together, the package structure P4A depicted in FIG. 36 and the package structure P7A depicted in FIG. 45 are similar; such that elements similar to or substantially the same as the elements described above will use the same reference numbers, and certain details or descriptions of the same elements (e.g. the formations and materials) and the relationship thereof (e.g. the relative positioning configuration and electrical connection) will not be repeated herein.

Referring to FIG. 36 and FIG. 45 together, the difference is that, for the package structure P7A depicted in FIG. 45, additional elements (e.g. a dielectric layer PM1, a plurality of conductive vias CP1, a plurality of conductive vias CP2, an insulating encapsulation 702, and a bridge element BE) are further included, where the bridge element BE is encapsulated in the insulating encapsulation 702 and disposed between the redistribution circuit structure 800 and the insulating encapsulation 700, and the bridge element BE is electrically connected to the semiconductor component 10a and the semiconductor component 30 through the conductive vias CP2. That is, the semiconductor component 10a and the semiconductor component 30 are electrically communicated through the bridge element BE, for example.

In some embodiments, as shown in FIG. 45 the dielectric layer PM1 is formed on and physically contacts the insulating encapsulation 700, where the dielectric layer PM1 has a plurality of openings (not marked) exposing surfaces of the conductive vias 33 of the semiconductor component 30 and surfaces of the conductive vias 140 of the semiconductor component 10*a*. The material of the dielectric layer PM1 may include polyimide, PBO, benzocyclobutene (BCB), a nitride such as silicon nitride, an oxide such as silicon oxide, phosphosilicate glass (PSG), borosilicate glass (BSG), boron-doped phosphosilicate glass (BPSG), a combination thereof or the like, which may be patterned using a photolithography and/or etching process. In some embodiments, the conductive vias CP1 and the conductive vias CP2 are formed on the dielectric layer PM1 and connected to the conductive vias 33 and the conductive vias 140 through the openings of the dielectric layer PM1. The materials and formations of the conductive vias CP1 and the conductive vias CP2 is the same or similar to the material and formation of the conductive vias 140 described in FIG. 4, thus may not be repeated herein.

In some embodiments, the bridge element BE is disposed on the conductive vias CP2 and surrounded by the conductive vias CP1. In some embodiments, a height of the bridge element BE is less than a height of the conductive vias CP1 as measured in the stacking direction Z. As shown in FIG. 45, the bridge element BE is overlapped with the semiconductor component 10*a* and the semiconductor component 30 in the stacking direction Z of the redistribution circuit structure 800 and the insulating encapsulation 700, and extends from the semiconductor component 10*a* to the semiconductor component 30 (or saying, from semiconductor component 30 to the semiconductor component 10*a*) in a vertical projection on the redistribution circuit structure 800. Due to the configuration, a short electrical path among the semiconductor component 10*a* and the semiconductor component 30 is achieved, thereby reducing signal loss thereof.

In some embodiments, the conductive vias CP1, the conducive vias CP2 and the bridge element BE are encapsulated in the insulating encapsulation 702, and the dielectric layer PM1 exposed by the conductive vias CP1 and the conducive vias CP2 is covered by the insulating encapsulation 702. As shown in FIG. 45, a surface of the bridge element BE, surfaces of the conductive vias CP1 and a surface 702*a* of the insulating encapsulation 142 are substantially leveled to and substantially coplanar to each other. In some embodiments, the redistribution circuit structure 800 is located on the bridge element BE, the conductive vias CP1 and the insulating encapsulation 702 (at the surface 702*a*), and is physically and electrically connected to the conductive vias CP1. The material and formation of the insulating encapsulation 702 is the same or similar to the materials and formations of the insulating encapsulation 700 described in FIG. 36, thus may not be repeated herein. That is, for example, the redistribution circuit structure 800 is electrically connected to the semiconductor component 10*a* and the semiconductor component 30 through the conductive vias CP1, the conductive vias 33, and the conductive vias 140.

In some embodiment, the bridge element BE includes a substrate 41, a redistribution circuit structure 42 (having a dielectric structure 42*a* and one or more metallization layers 42*b* arranged therein) disposed on the substrate 41, and through vias 43 embedded to substrate 41 and electrically connected to the redistribution circuit structure 42. The formation and material of the substrate 41 are the same or similar to the formation and material of the substrate 310, the formation and material of the redistribution circuit structure 42 are the same or similar to the formation and material of the redistribution circuit structure 340, and the formation and material of the through vias 43 are the same or similar to the formation and material of the through vias 320, and thus are not repeated herein for simplicity.

As shown in FIG. 45, the bridge element BE is electrically connected to the semiconductor component 10*a* and the semiconductor component 30 through the conductive vias 33, 140, CP2 and the redistribution circuit structure 42. In other words, the semiconductor component 10*a* and the semiconductor component 30 are electrically communicated to each other through the bridge element BE. In some embodiments, as shown in FIG. 45, the through vias 43 of the bridge element BE is physically and electrically connected to the bottommost layer of the metallization layer 804 of the redistribution circuit structure 800. That is, for example, the redistribution circuit structure 800 may further electrically connected to the semiconductor component 10*a* and the semiconductor component 30 through the bridge element BE, the conductive vias CP2, the conductive vias 33, and the conductive vias 140. In some embodiments, some of the conductive elements 900 are electrically connected to the semiconductor component 10*a* through some of the UBM patterns u1, the redistribution circuit structure 800 and some of the conductive vias CP1 or through some of the UBM patterns u1, the redistribution circuit structure 800, the bridge element BE and some of the conductive vias CP2, and some of the conductive elements 900 are electrically connected to the semiconductor component 30 through some of the UBM patterns u1, the redistribution circuit structure 800 and some of the conductive vias CP1 or through some of the UBM patterns u1, the redistribution circuit structure 800, the bridge element BE and some of the conductive vias CP2.

In one embodiments, the package structure P7A may be manufactured by a method of FIG. 46. It should be understood that additional processing may occur before, during, and after the illustrated actions of the method of FIG. 46 to complete formation of the package structure P7A. The method of FIG. 46 includes at least steps S70 to S79. For example, the method shown in FIG. 46 begins with step S70, which provides a wafer including a plurality of first semiconductor dies; step S71, which bonds the wafer including the plurality of first semiconductor dies to a wafer including a plurality of heat dissipating elements; step S72, which dices the bonded structure to form a plurality of individual and separated first semiconductor components each having one first semiconductor die and one respective heat dissipating element disposed thereon, where first semiconductor die is thermally coupled to the respective one heat dissipating element; step S73, which encapsulates at least one of the first semiconductor components and at least one second semiconductor component in a first portion of an insulating encapsulation; step S74, which planarizes the first portion of the insulating encapsulation to expose the heat dissipating element included in the first semiconductor component by a first surface of the first portion of the insulating encapsulation; step S75, which disposes a plurality of first conductive vias and a plurality of second conductive vias on the first semiconductor component and the second semiconductor component; step S76, which disposes a connection element (such as a bridge element BE depicted in FIG. 45) on the second conductive vias over the first semiconductor component and the second semiconductor component to electrically connect the first semiconductor component and the second semiconductor component, where the connection element is physically and electrically connected to the second conductive vias connected to the first semiconductor component and the second semiconductor component, such that the first semiconductor component and the second semiconductor component are electrically communicated to each other through the connection element and the second conductive vias; step S77, which encapsulates the first conductive vias, the second conductive vias, and the connection element in a second portion of the insulating encapsulation, where a surface of the first conductive vias and a surface of the connection element is substantially leveled with and substantially coplanar to a second surface of the second portion of the insulating encapsulation; step S78, which forms a redistribution circuit structure on the second surface of the second portion of the insulating encapsulation to electrically connect to the first semiconductor component and the second semiconductor component through the first conductive vias and/or the connection element connected to the second conductive vias, where the second portion of the insulating encapsulation is sandwiched between the redistribution circuit structure and the first portion of the insulating encapsulation; and step S79, which disposes a plurality of conductive terminals on the redistribution circuit structure to electrically connect to the first semiconductor component and the second semiconductor component through the redistribution circuit structure, where the redistribution circuit structure is sandwiched between the conductive terminals and the second portion of insulating encapsulation. However, the disclosure is not limited thereto.

In alternative embodiments, the package structure P7A may be manufactured by a method of FIG. 47. It should be understood that additional processing may occur before, during, and after the illustrated actions of the method of FIG. 47 to complete formation of the package structure P7A. The method of FIG. 47 includes at least steps S80 to S88. For example, the method shown in FIG. 47 begins with step S80, which provides at least one first semiconductor die and at least one second semiconductor component, where a thickness of the first semiconductor die is less than a thickness of the second semiconductor component; step S81, which disposes a heat dissipating element on the first semiconductor die to form a first semiconductor component, where the heat dissipating element is physically connected to the first semiconductor die, and the heat dissipating element is thermally coupled to the first semiconductor die; step S82, which encapsulates the first semiconductor component and the second semiconductor component in a first portion of an insulating encapsulation; step S83, which planarizes the first portion of the insulating encapsulation to expose the heat dissipating element included in the first semiconductor component by a first surface of the first portion of the insulating encapsulation; step S84, which disposes a plurality of first conductive vias and a plurality of second conductive vias on the first semiconductor component and the second semiconductor component; step S85, which disposes a connection element (such as a bridge element BE depicted in FIG. 45) on the second conductive vias over the first semiconductor component and the second semiconductor component to electrically connect the first semiconductor component and the second semiconductor component, where the connection element is physically and electrically connected to the second conductive vias connected to the first semiconductor component and the second semiconductor component, such that the first semiconductor component and the second semiconductor component are electrically communicated to each other through the connection element and the second conductive vias; step S86, which encapsulates the first conductive vias, the second conductive vias, and the connection element in a second portion of the insulating encapsulation, where a surface of the first conductive vias and a surface of the connection element is substantially leveled with and substantially coplanar to a second surface of the second portion of the insulating encapsulation; step S87, which forms a redistribution circuit structure on the second surface of the second portion of the insulating encapsulation to electrically connect to the first semiconductor component and the second semiconductor component through the first conductive vias and/or the connection element connected to the second conductive vias, where the second portion of the insulating encapsulation is sandwiched between the redistribution circuit structure and the first portion of the insulating encapsulation; and step S88, which disposes a plurality of conductive terminals on the redistribution circuit structure to electrically connect to the first semiconductor component and the second semiconductor component through the redistribution circuit structure, where the redistribution circuit structure is sandwiched between the conductive terminals and the second portion of insulating encapsulation. However, the disclosure is not limited thereto.

In further alternative embodiments, the package structure P7A may be manufactured by a method of FIG. 48. It should be understood that additional processing may occur before, during, and after the illustrated actions of the method of FIG. 48 to complete formation of the package structure P7A. The method of FIG. 48 includes at least steps S90 to S99. For example, the method shown in FIG. 48 begins with step S90, which provides at least one first semiconductor die and at least one second semiconductor component, where a thickness of the first semiconductor die is less than a thickness of the second semiconductor component; step S91, which disposes a dummy element on the first semiconductor die; step S92, which encapsulates the first semiconductor die with the dummy element disposed thereon and the second semiconductor component in a first portion of an insulating encapsulation; step S93, which planarizes the first portion of the insulating encapsulation to expose the dummy element disposed on the first semiconductor die by a first surface of the first portion of the insulating encapsulation; step S94, which disposes a plurality of first conductive vias and a plurality of second conductive vias on the first semiconductor die and the second semiconductor component; step S95, which disposes a connection element (such as a bridge element BE depicted in FIG. 45) on the second conductive vias over the first semiconductor die and the second semiconductor component to electrically connect the first semiconductor die and the second semiconductor component, where the connection element is physically and electrically connected to the second conductive vias connected to the first semiconductor die and the second semiconductor component, such that the first semiconductor die and the second semiconductor component are electrically communicated to each other through the connection element and the second conductive vias; step S96, which encapsulates the first conductive vias, the second conductive vias, and the connection element by a second portion of the insulating encapsulation, where a surface of the first conductive vias and a surface of the connection element is substantially leveled with and substantially coplanar to a second surface of the second portion of the insulating encapsulation; step S97, which forms a redistribution circuit structure on the second surface of the second portion of the insulating encapsulation to electrically connect to the first semiconductor die and the second semiconductor component through the first conductive vias and/or the connection element connected to the second conductive vias, where the second portion of the insulating encapsulation is sandwiched between the redistribution circuit structure and the first portion of the insulating encapsulation; step S98, which disposes a plurality of conductive terminals on the redistribution circuit structure to electrically connect to the first semiconductor die and the second semiconductor component through the redistribution circuit structure, where the redistribution circuit structure is sandwiched between the conductive terminals and the second portion of insulating encapsulation; and step S99, which removes the dummy element from the first semiconductor die and disposes a heat dissipating element directly on the first semiconductor die to form a first semiconductor component, where the heat dissipating element is physically connected to the first semiconductor die, and the heat dissipating element is thermally coupled to the first semiconductor die.

However, the disclosure is not limited thereto; in some alternative embodiments, the semiconductor component 10a of the package structure P7A may be replaced with the semiconductor component 10c depicted in FIG. 21A or the semiconductor component 10e depicted in FIG. 33A; or, the semiconductor component 10a of the package structure P7A may be replaced by the semiconductor component 10b depicted in FIG. 14B (see a package structure P7B as shown in FIG. 49), the semiconductor component 10d depicted in FIG. 21B, or the semiconductor component 10f depicted in FIG. 33B.

In further alternative embodiments, in addition to the conductive terminals 900 in FIG. 36, FIG. 40 to FIG. 45, and FIG. 49, an additional semiconductor element(s) (not shown) may be disposed on the redistribution circuit structure 800 through bonding pads (not shown) being replacing the UBM pattern u1. The additional semiconductor element(s) may include a passive component or active component. The number of the additional semiconductor element(s) is not limited in the disclosure, and may be designated based on the demand and design layout. In some embodiments, the package structures P4A to P7B may be further mounted with an additional package, chips/dies, other electronic devices, or a suitable substrate (e.g. an organic substrate) to form a stacked package structure, the disclosure is not limited thereto.

In accordance with some embodiments, a package structure includes a circuit element, a first semiconductor die, a second semiconductor die, a heat dissipating element, and an insulating encapsulation. The first semiconductor die and the second semiconductor die are located on the circuit element. The heat dissipating element connects to the first semiconductor die, and the first semiconductor die is between the circuit element and the heat dissipating element, where a sum of a first thickness of the first semiconductor die and a third thickness of the heat dissipating element is substantially equal to a second thickness of the second semiconductor die. The insulating encapsulation encapsulates the first semiconductor die, the second semiconductor die and the heat dissipating element, where a surface of the heat dissipating element is substantially leveled with the insulating encapsulation.

In accordance with some embodiments, a method of manufacturing package structure includes the following steps, providing a first semiconductor die with a heat dissipating element connected thereto; providing a second semiconductor die; encapsulating the first semiconductor die, the second semiconductor die and the heat dissipating element in an insulating encapsulation; and planarizing the insulating encapsulation to expose the heat dissipating element by the insulating encapsulation, wherein a sum of a first thickness of the first semiconductor die and a third thickness of the heat dissipating element is substantially equal to a second thickness of the second semiconductor die.

In accordance with some embodiments, a method of manufacturing package structure includes the following steps, providing at least one first semiconductor die and at least one second semiconductor die; disposing a dummy element on a surface of the at least one first semiconductor die, the at least one first semiconductor die being located between the circuit element and the dummy element; encapsulating the at least one first semiconductor die, the at least a second semiconductor die and the dummy element in an insulating encapsulation; planarizing the insulating encapsulation to expose the dummy element by a surface of the insulating encapsulation; removing the dummy element to form a recess in the insulating encapsulation; and disposing a heat dissipating element on the at least one first semiconductor die and in the recess, wherein a sum of a first thickness of the at least one first semiconductor die and a third thickness of the heat dissipating element is substantially equal to a second thickness of the at least one second semiconductor die.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A package structure, comprising:
   a circuit element;
   a first semiconductor die and a second semiconductor die, located on the circuit element;
   a heat dissipating element, connecting to the first semiconductor die, the first semiconductor die being between the circuit element and the heat dissipating element, wherein a sum of a first thickness of the first semiconductor die and a third thickness of the heat dissipating element is substantially equal to a second thickness of the second semiconductor die; and
   an insulating encapsulation, partially encapsulating the first semiconductor die, the second semiconductor die and the heat dissipating element, wherein a surface of the heat dissipating element is substantially level with a surface of the insulating encapsulation.

2. The package structure of claim 1, wherein in a cross-sectional view, a sidewall of the heat dissipating element is substantially aligned with a sidewall of the first semiconductor die.

3. The package structure of claim 1, wherein the heat dissipating element comprising an adhesive base layer, and a thermal conductivity coefficient of the adhesive base layer is greater than a thermal conductivity coefficient of the insulating encapsulation.

4. The package structure of claim 3, wherein in a cross-sectional view, an offset is between a sidewall of the heat dissipating element and a sidewall of the first semiconductor die, and the offset is approximately ranging from 5 μm to 5000 μm.

5. The package structure of claim 1, wherein the heat dissipating element comprises a base layer and an adhesive layer located between the base layer and the first semiconductor die, wherein a thermal conductivity coefficient of the base layer is greater than a thermal conductivity coefficient of the insulating encapsulation, and a thermal conductivity coefficient of the adhesive layer is greater than the thermal conductivity coefficient of the insulating encapsulation.

6. The package structure of claim 5, wherein in a cross-sectional view, a first offset is between a sidewall of the base layer and a sidewall of the adhesive layer, and a second offset is between the sidewall of the adhesive layer and a sidewall of the first semiconductor die, and the first offset and the second offset are independently approximately ranging from 5 μm to 5000 μm.

7. The package structure of claim 1, wherein the circuit element is a circuit substrate free from the insulating encapsulation, and the package structure further comprises:
an interposer structure, located between and connected to the first semiconductor die and the circuit element; and
conductive terminals, located on the circuit element, the circuit element being located between the interposer structure and the conductive terminals.

8. The package structure of claim 1, wherein the circuit element is a redistribution circuit structure with portions thereof exposed by the first semiconductor die and the second semiconductor die being covered by the insulating encapsulation, and the package structure further comprises:
conductive terminals, located on the circuit element, the circuit element being located between the insulating encapsulation and the conductive terminals.

9. The package structure of claim 1, wherein the circuit element is a redistribution circuit structure with portions thereof exposed by the first semiconductor die and the second semiconductor die being covered by the insulating encapsulation, and the package structure further comprises:
a connection element having a semiconductor substrate and through vias penetrating therein, located on the first semiconductor die and the second semiconductor die, the first semiconductor die and the second semiconductor die being electrically communicated through the connection element;
conductive pillars, located on and connected to the first semiconductor die and the second semiconductor die and aside the connection element; and
conductive terminals, located on the circuit element, the circuit element being located between the insulating encapsulation and the conductive terminals,
wherein the insulating encapsulation comprises a first portion encapsulating the first semiconductor die and the second semiconductor die and a second portion encapsulating the connection element and the conductive pillars, the second portion is located between the first portion and the circuit element.

10. A method of manufacturing a package structure, comprising:
providing a circuit element;
providing a first semiconductor die with a heat dissipating element connected thereto and placing the first semiconductor die on the circuit element, the first semiconductor die being between the heat dissipating element and the circuit element;
providing a second semiconductor die and placing the second semiconductor on the circuit element;
encapsulating the first semiconductor die, the second semiconductor die and the heat dissipating element in an insulating encapsulation; and
planarizing the insulating encapsulation to expose the heat dissipating element and the second semiconductor die by the insulating encapsulation, wherein a sum of a first thickness of the first semiconductor die and a third thickness of the heat dissipating element is substantially equal to a second thickness of the second semiconductor die.

11. The method of claim 10, wherein providing the first semiconductor die with the heat dissipating element connected thereto and placing the first semiconductor die on the circuit element comprises:
providing a first wafer having circuitry and a second wafer comprising the heat dissipating element;
bonding the first wafer to the second wafer to form a stacked structure;
dicing the stacked structure to form the first semiconductor die with the heat dissipating element connected thereto; and
disposing the first semiconductor die on the circuit element.

12. The method of claim 10, wherein providing the first semiconductor die with the heat dissipating element connected thereto and placing the first semiconductor die on the circuit element comprises:
providing the first semiconductor die;
disposing the first semiconductor die on the circuit element; and
disposing the heat dissipating element on the first semiconductor die.

13. The method of claim 10, wherein providing the circuit element is after encapsulating the first semiconductor die, the second semiconductor die and the heat dissipating element in the insulating encapsulation, and providing the circuit element comprises:
forming a redistribution circuit structure on the insulating encapsulation to electrically connect to the first semiconductor die and the second semiconductor die; and
disposing conductive terminals on the redistribution circuit structure, wherein the redistribution circuit structure is sandwiched between the conductive terminals and the insulating encapsulation.

14. The method of claim 13, wherein the insulating encapsulation comprises a first portion encapsulating the first semiconductor die and the second semiconductor die and a second portion stacked thereon,
prior to forming the redistribution circuit structure, the method further comprises:
disposing a connection element on the first semiconductor die and the second semiconductor die encapsulated in the first portion to electrically communicate the first semiconductor die and the second semiconductor die;
forming conductive pillars on the first semiconductor die and the second semiconductor die; and
encapsulating the connection element and the conductive pillars in the second portion of the insulating encapsulation, the second portion being located between the first portion and the redistribution circuit structure.

15. The method of claim 10, further comprising:
providing an interposer with through vias therein;
disposing the first semiconductor die and the second semiconductor die, before placing the first semiconductor die and the second semiconductor die on the circuit element and encapsulating in the insulating encapsulation, on the interposer through a flip chip bonding;

patterning the interposer to reveal the through vias, after planarizing the insulating encapsulation and before placing the first semiconductor die and the second semiconductor die on the circuit element; and forming connectors on the through vias being revealed, the interposer being sandwiched between the insulating encapsulation and the connectors, wherein placing the first semiconductor die and the second semiconductor die on the circuit element comprises:

bonding the first semiconductor die and the second semiconductor die on the circuit element terminals through the connectors formed on the interposer, the connectors being between the interposer and the circuit element.

16. The method of claim 15, further comprising:
providing a lid;
disposing the lid on the circuit element, the first semiconductor die, the second semiconductor die and the interposer being located in a space enclosed by the lid and the circuit element; and
disposing a thermal adhesion layer between the lid and a surface of the heat dissipating element substantially leveled with a surface of the insulating encapsulation.

17. A method of manufacturing a package structure, comprising:
providing a circuit element;
providing at least one first semiconductor die and at least one second semiconductor die and placing the at least one first semiconductor die and the at least one second semiconductor die on the circuit element;
disposing a dummy element on a surface of the at least one first semiconductor die, the at least one first semiconductor die being located on the dummy element;
encapsulating the at least one first semiconductor die, the at least one second semiconductor die and the dummy element in an insulating encapsulation;
planarizing the insulating encapsulation to expose the dummy element and the at least one second semiconductor die by a surface of the insulating encapsulation;
removing the dummy element to form a recess in the insulating encapsulation; and
disposing a heat dissipating element on the at least one first semiconductor die and in the recess, the at least one first semiconductor die being between the circuit element and the heat dissipating element, wherein a surface of the heat dissipating element is substantially level—with the surface of the insulating encapsulation, and a sum of a first thickness of the at least one first semiconductor die and a third thickness of the heat dissipating element is substantially equal to a second thickness of the at least one second semiconductor die.

18. The method of claim 17, wherein providing the circuit element is after encapsulating the at least one first semiconductor die, the at least one second semiconductor die and the dummy element in the insulating encapsulation, and providing the circuit element comprises:

forming a redistribution circuit structure on the insulating encapsulation to electrically connect to the at least one first semiconductor die and the at least one second semiconductor die; and disposing conductive terminals on the redistribution circuit structure, wherein the redistribution circuit structure is sandwiched between the conductive terminals and the insulating encapsulation.

19. The method of claim 18, wherein the insulating encapsulation comprises a first portion encapsulating the at least one first semiconductor die and the at least one second semiconductor die and a second portion stacked thereon, prior to forming the redistribution circuit structure, the method further comprises:

disposing a connection element on the at least one first semiconductor die and the at least one second semiconductor die encapsulated in the first portion to electrically communicate the at least one first semiconductor die and the at least one second semiconductor die;

forming conductive pillars on the at least one first semiconductor die and the at least one second semiconductor die; and encapsulating the connection element and the conductive pillars in the second portion of the insulating encapsulation, the second portion being located between the first portion and the redistribution circuit structure.

20. The method of claim 17, further comprising:
providing an interposer with through vias therein;
disposing the at least one first semiconductor die and the at least one second semiconductor die, before disposing the dummy element on the at least one first semiconductor die and placing the at least one first semiconductor die and the at least one second semiconductor die on the circuit element, on the interposer through a flip chip bonding;

patterning the interposer to reveal the through vias, after planarizing the insulating encapsulation and before placing the at least one first semiconductor die and the at least one second semiconductor die on the circuit element; and forming connectors on the through vias being revealed, the interposer being sandwiched between the insulating encapsulation and the connectors, wherein placing the at least one first semiconductor die and the at least one second semiconductor die on the circuit element comprises:

bonding the at least one first semiconductor die and the at least one second semiconductor die on the circuit element through the connectors formed on the interposer, the connectors being between the interposer and the circuit element.

\* \* \* \* \*